United States Patent
Caruso et al.

(10) Patent No.: US 12,179,661 B2
(45) Date of Patent: Dec. 31, 2024

(54) DECORATIVE PVD COATED ITEMS AND RADOMES AND METHODS OF MAKING SAME

(71) Applicant: MOTHERSON INNOVATIONS COMPANY LIMITED, London (GB)

(72) Inventors: Dean Caruso, Lonsdale (AU); Simon Belcher, Lonsdale (AU); Simon David Field, Lonsdale (AU); Shane Randell Koehne, Lonsdale (AU); Andreas Herrmann, Stuttgart (DE); Scott Edwards, Lonsdale (AU); Bastian Stoehr, Lonsdale (AU); Tim Symonds, Lonsdale (AU)

(73) Assignee: Motherson Innovations Company Limited, London (GB)

( * ) Notice: Subject to any disclaimer, the term of this patent is extended or adjusted under 35 U.S.C. 154(b) by 83 days.

(21) Appl. No.: 17/460,727

(22) Filed: Aug. 30, 2021

(65) Prior Publication Data

US 2022/0065422 A1 Mar. 3, 2022

Related U.S. Application Data

(63) Continuation-in-part of application No. PCT/EP2020/060471, filed on Apr. 14, 2020, and a
(Continued)

(30) Foreign Application Priority Data

Jan. 10, 2019 (DE) ...................... 10 2019 100 520.5
Jul. 29, 2019 (AU) ................................ 2019902697
Oct. 15, 2019 (AU) ................................ 2019903885

(51) Int. Cl.
*C23C 14/35* (2006.01)
*B44C 1/22* (2006.01)
(Continued)

(52) U.S. Cl.
CPC ................ *B60Q 3/54* (2017.02); *B44C 1/228* (2013.01); *B44F 9/10* (2013.01); *B60Q 1/2607* (2013.01);
(Continued)

(58) Field of Classification Search
CPC ..... C23C 14/35; C23C 14/5873; C23C 16/50; C23C 18/00; C23C 28/30
See application file for complete search history.

(56) References Cited

U.S. PATENT DOCUMENTS 6,384,318 B1 * 5/2002 Nomura ................ C03C 17/009
136/246
2004/0125023 A1 7/2004 Fujii et al.
(Continued)

FOREIGN PATENT DOCUMENTS

DE 102007059758 A1 6/2009
DE 102015004204 A1 8/2015
(Continued)

OTHER PUBLICATIONS

International Search Report and Written Opinion dated Oct. 22, 2020 of International application No. PCT/EP2020/060471.

*Primary Examiner* — Hai Y Zhang
(74) *Attorney, Agent, or Firm* — Jones Day

(57) ABSTRACT

A decorative radome including a radio-transmissive substrate having a first surface on a first side and a second surface on a second side; and a first surface radio-transmissive decorative coating; methods of manufacturing a PVD coated system include applying a hard coating to the substrate; applying a PVD coating by magnetron sputtering to the substrate; and laser etching one or more of a pattern or a graphic into the PVD coating; and A decorative PVD coated item, comprising: a substrate; a hard coating applied to the substrate; a PVD coating provided on the hard coating and the substrate, wherein the PVD coating is laser etched
(Continued)

with one or more of a pattern or a graphic so that the PVD coating is at least partially removed and the pattern or the graphic is revealed as a result of the contrast between the substrate and the PVD coating.

21 Claims, 17 Drawing Sheets

Related U.S. Application Data continuation-in-part of application No. 16/738,513, filed on Jan. 9, 2020, now Pat. No. 11,346,523, which is a continuation-in-part of application No. 16/722,194, filed on Dec. 20, 2019, now Pat. No. 11,635,186, which is a continuation-in-part of application No. 16/439,674, filed on Jun. 12, 2019, now Pat. No. 10,563,838, which is a continuation of application No. 16/378,553, filed on Apr. 8, 2019, now Pat. No. 10,443,807, which is a continuation of application No. 16/378,533, filed on Apr. 8, 2019, now Pat. No. 10,443,808.

(60) Provisional application No. 62/642,010, filed on Mar. 13, 2018.

(51) Int. Cl.
| | | |
|---|---|---|
| *B44F 9/10* | (2006.01) | |
| *B60Q 1/26* | (2006.01) | |
| *B60Q 3/54* | (2017.01) | |
| *C23C 14/58* | (2006.01) | |
| *C23C 16/50* | (2006.01) | |
| *C23C 18/00* | (2006.01) | |
| *C23C 28/00* | (2006.01) | |
| *F21S 43/33* | (2018.01) | |
| *H01Q 1/42* | (2006.01) | |

(52) U.S. Cl.
CPC .......... *C23C 14/35* (2013.01); *C23C 14/5873* (2013.01); *C23C 16/50* (2013.01); *C23C 18/00* (2013.01); *C23C 28/30* (2013.01); *F21S 43/33* (2018.01); *H01Q 1/421* (2013.01)

(56) References Cited

U.S. PATENT DOCUMENTS

| | | |
|---|---|---|
| 2006/0083015 A1 | 4/2006 | Yamazaki et al. |
| 2011/0047784 A1 | 3/2011 | Ohtake et al. |
| 2012/0119961 A1 | 5/2012 | Pujadas |
| 2013/0194687 A1* | 8/2013 | Hall ............... G02B 5/0808 |
| | | 359/884 |
| 2014/0093665 A1 | 4/2014 | Horibe et al. |
| 2014/0218263 A1 | 8/2014 | Burdenski et al. |
| 2017/0352938 A1 | 12/2017 | Okumura et al. |
| 2018/0159207 A1 | 6/2018 | Shurish et al. |
| 2019/0013576 A1 | 1/2019 | Pujadas et al. |
| 2019/0153583 A1* | 5/2019 | Zhou ............... H01Q 1/38 |

FOREIGN PATENT DOCUMENTS

| | | |
|---|---|---|
| DE | 102016007119 A1 | 2/2017 |
| WO | WO 2018/0121855 A1 | 7/2018 |

* cited by examiner

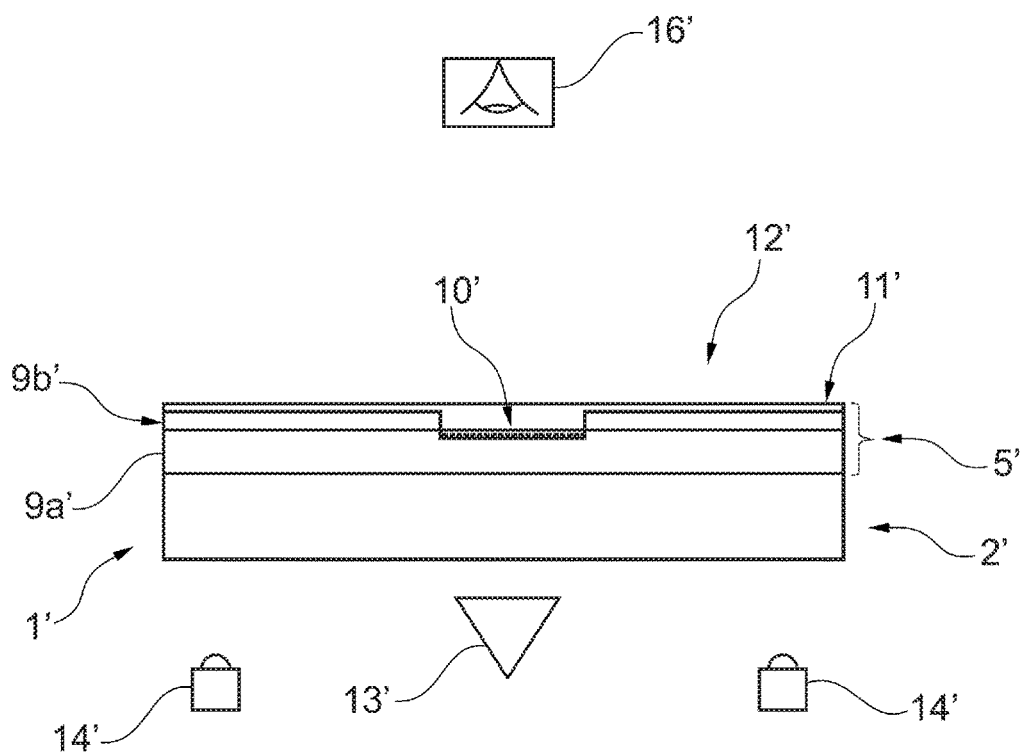
Fig. 2a
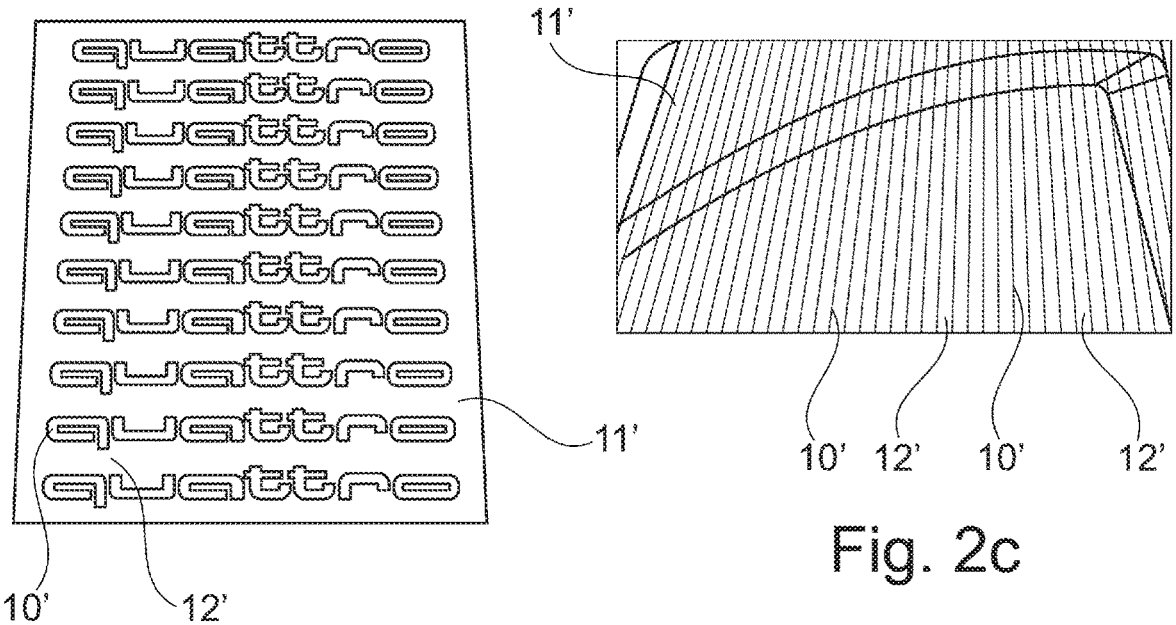
Fig. 2b
Fig. 2c

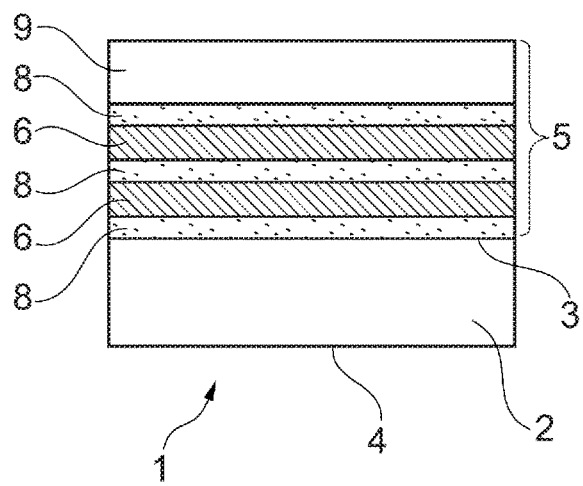
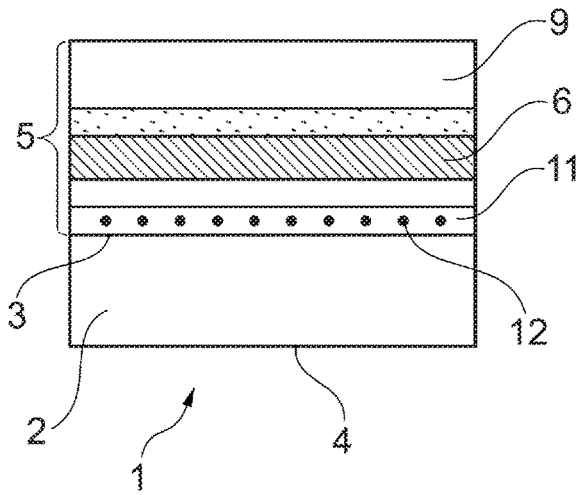
Fig. 5   Fig. 6
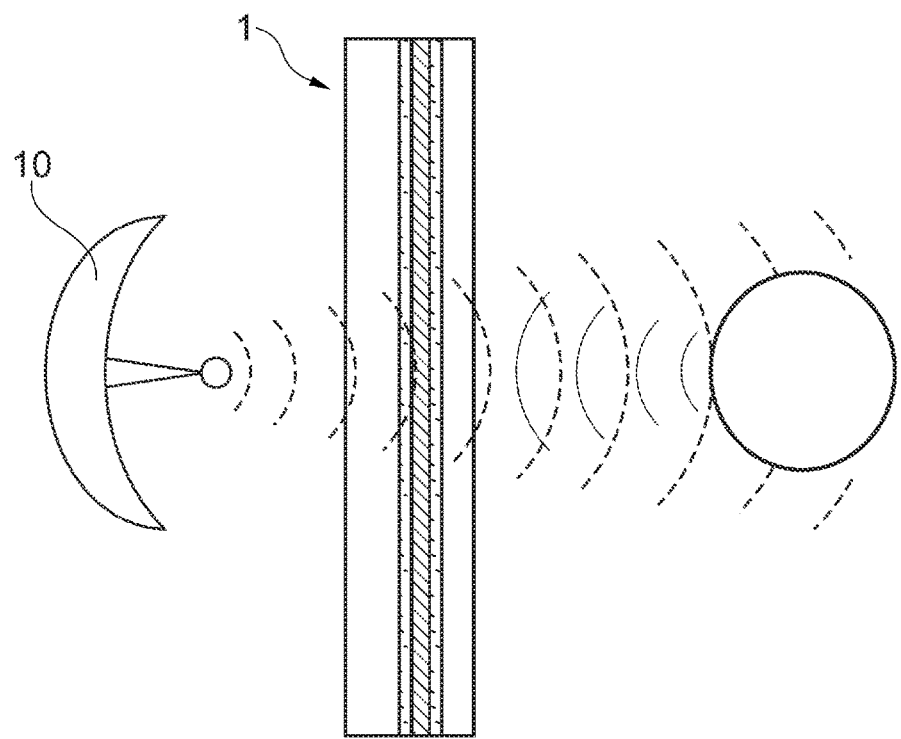
Fig. 7

DECORATIVE PVD COATED ITEMS AND RADOMES AND METHODS OF MAKING SAME

CROSS-REFERENCE TO RELATED APPLICATION

This application is a continuation-in-part of International Patent Application No. PCT/EP2020/060471, filed Apr. 14, 2020, which claims the benefit of priority to Australian Patent Application No. 2019903885, filed Oct. 15, 2019 and Australian Patent Application No. 2019902697, filed Jul. 29, 2019; and this application is a continuation-in-part of U.S. patent application Ser. No. 16/738,513, filed Jan. 9, 2021, which is a continuation-in-part of U.S. patent application Ser. No. 16/722,194, filed Dec. 20, 2019, which is a continuation-in-part of U.S. patent application Ser. No. 16/439,674, filed Jun. 12, 2019, which is a continuation of U.S. patent application Ser. No. 16/378,533, filed Apr. 8, 2019, which is a continuation of U.S. patent application Ser. No. 16/378,553, filed Apr. 8, 2019, which claims the benefit of priority to U.S. Provisional Patent Application No. 62/642,010, filed Mar. 13, 2018, which claims the benefit of foreign priority to German Patent Application No. DE 10 2019 100 520.5, filed Jan. 10, 2019; each of which is hereby incorporated by reference herein in its entirety for all purposes.

BACKGROUND

1. Field of the Invention

The present disclosure generally relates to manufacturing a decorative PVD coated item with a gloss, satin, and/or patterned metallic surface with or without colored graphics or backlighting capability. In one example, the item is a radome which includes a decorative first surface or second surface coating. Further examples of an item are rearview components, like housings or scalps for rearview mirrors or for rearview camera systems, including a decorative first surface or second surface coating. Particularly the radome and/or rearview mirror component is useful for automotive purposes and therefore the first surface or second surface coating needs to meet the strict wear and resilience requirements needed for external automotive components as well as, in the case of a radome, being sufficiently radio-transparent to permit minimally attenuated transmission of radio wave frequencies used in Radio Detection and Ranging (RADAR) systems. Furthermore, the radome should be visually appropriate for the desired purpose.

2. Related Art

Graphics can be applied to a decorative PVD coating system by the means of printed inks or paints. This can be images, logos or even fine patterns like fish scales, hatching or similar. These require an additional coating and/or curing process and may not have satisfactory abrasion resistance. These processes do not make the graphic region transparent to light.

Satin finishes can be applied to a decorative PVD coating system by the means of a protective coating containing a diffusing additive, which provides a diffuse reflection from the coated surface. The concentration and type of additive can be adjusted to tune the amount of diffuse reflection. However, only a homogeneous satin finish with no other pattern can be achieved. This is known to those skilled in the art. As this method is typically a liquid coating process, it is difficult (or prohibitively expensive) to create satin and gloss finishes on the same surface. This process does not make the satin regions transparent to light.

Satin finishes can be achieved consistently with electroplating processes but it is challenging to create satin and gloss finishes on the same surface. In this case, the finish is limited to a homogeneous satin finish with no other pattern present. Additional printing or painting processes can be applied to electroplating achieving coloured graphics. This is well known. However, none of these processes make any portion of the plated surface light transparent One example of a surface to which a finish is applied is a radome for protecting a RADAR. Since their development in the early 20th century, Radio Detection and Ranging (RADAR) systems have evolved and have been miniaturised such that they are now integrated into a range of everyday devices. One common use of radar is in driver assistance systems in vehicles. Radar is used for a variety of warning systems, semi-autonomous systems and autonomous systems in vehicles. Such systems include proximity detection, which can be used for parking assistance, adaptive cruise control, crash avoidance and blind spot detection. Further, radar, in combination with light illuminating detection and ranging (LIDAR) systems, provide the sensing systems being developed for autonomous, and semi-autonomous, vehicles.

Radar systems work on the basis that illuminating radio waves (radar signals), emitted from a transmitter, are reflected or scattered by solid objects. These reflected radar waves are then detected by a receiver, which is generally proximal to the transmitter, allowing the radar system to detect an object. Typically, radio waves are reflected when travelling between mediums having different electric conductivity. As such, radar systems are particularly effective at detecting electrically conductive materials, such as metals. However, this presents a problem when trying to develop radar compatible materials which have a metallic appearance.

As it is not desirable to externally view the radar system, and as the radar system need to be protected from environmental damage, radar systems are typically located behind a radome. A radome is a protective cover which is substantially radio-wave transparent, and therefore does not substantially attenuate the radio signals. Suitable materials for providing a radome include synthetic polymers (such as plastics) which are electrically insulating. However, integration of such plastic radomes, when a metallic finish is desired, has been difficult to achieve. Typical metallic finishes, such a chromium films on plastic, reflect radio signals and therefore are not suitable for use in radomes.

Traditionally, in an automotive context, radar transmitters and receivers are positioned at the front of the vehicle in an upper portion of, or above, a vehicles front grill. Increasingly there is market-demand for multiple radar-based systems in vehicles including blind-spot detection (BSD), lane-change assist (LCA), front/rear cross-traffic alert (F/RCTA), autonomous emergency braking (AEB), and adaptive cruise control (ACC). This has driven the need for positioning of radar transmitters and sensors on many different positions on a vehicle such as behind facias including bumpers and body panels. There is a need for suitable components that can be used on the exterior of a car and are radar compatible.

Traditional vehicle body components are not ideal radomes for use with radar systems. Metal body panels are incompatible with radar and therefore radar systems need to be positioned behind radio-transmissive substrates, such as plastic panels. However, many plastics used to make body panels include fillers such as talc and carbon which significantly attenuate radar. In many instances this is by design to make the vehicle visible to other radar systems. Even when the substrate is radio-transmissive the overlaying layers of paint affect radar transmission. Metallic components of popular paints and basecoats containing effect pigments also affect the radar transparency of the panel. Further, many of the design constraints of the external panels of a vehicle are determined by factors unrelated to, and in some instances incompatible with, optimal radar efficiency. Therefore, it may be desirable to provide radar compatible trim which only constitutes a small portion of the façade of a vehicle and can act as a radome for the underlying radar system. In some instances, it is desirable for these trim elements to have a metallic appearance.

Techniques and systems have been developed to provide plastic radomes with a metallic appearance. However, all these techniques and systems require complex layering of substrates with sandwiched layers of metallic appearance.

One example includes US patent application US 2017/0057424 A1, which utilises a nanolayer film stack which includes no metal components. Such complex film stacks need to be protected from the external environment as they are susceptible to surface scratching. The use of such complex films, as well as multiple layers to provide backing and protection for the film results in significant production costs and time, as well as introducing a number of quality control issues and points of failure. Other radomes utilise complex combinations of films, paints, deposited metals and complex heat masking, again resulting in high production time and costs.

EP1560288 describes alternative means to provide a radome with a visually metallic component. This document discloses the deposition of a thin film of Tin and/or an alloy of Tin on a transparent substrate. The substrate is then overlayed with a further opaque backing plate, which in practice, is adhered to the front layer. However, the use of an adhesive increases production complexity and costs and may result in the components being susceptible to delamination between the first and the second layer. This leads to radio wave attenuation and inaccuracies in the radar system.

Some of the radomes on the market with a metallic appearance include a first surface protective polymer adhered over the decorative coating or film thereby encasing it within polymer layers. This functions to provide the radome with a uniform thickness and, importantly, protects the decorative coating or film from the external environment. However, such methods are not ideal for providing larger decorative components such as body panels.

Decorative trim and plastic bumpers are not suitable to be formed of multiple plastic layers, as has been proposed for radome badges. Therefore, there is a need to provide car panels and trim with a metallic appearance and a simplified production process that provide radio-transmissive decorative coatings and are sufficiently robust.

In the past different approaches have been made to further increase the outer appearance of coated elements, for example to provide a "satin" appearance of the elements. For example electroplating was suggested. Electroplating is a wet process which involves the use of hexavalent chrome, a genotoxic carcinogen. Consequently this substance has been phased out in areas around the world. For example the European Union is phasing hexavalent chromes use out under Registration, Evaluation, Authorisation and Restriction of Chemicals (REACH) regulation.

As an alternative hexavalent chrome was discussed, however it provides only a relatively inflexible coating system. For example it does not allow integration of backlighting as it is not transparent and its ability to combine a satin and a gloss finish into the same coating on the same part is limited. Furthermore its ability to create different coloured finishes is limited.

As an alternative PVD coating methods have been proposed. A high end gloss or satin finish is achievable with no heavy metal wastage and no harmful products. It is however difficult to create a coated part with a seamless satin and gloss finish on the same part. Typically, a PVD satin finish is achieved with a top tint coating with a satin additive, which scatters light off the reflective PVD surface. The satin additive can be adjusted to tune the amount of scatter. This tint coating is however also a wet process and hence it is not easy to create a selective satin pattern on a gloss PVD surface using this technique.

Thus, there is the need to create a satin pattern on a gloss surface with minimal processes on a singular part using a coating that furthermore preferably allows a back lighting of the satin pattern on the surface that has been created.

The above discussion of background is included to explain the context of the present disclosure. It is not to be taken as an admission that any of the material referred to was published, known or part of the common general knowledge at the priority date of any one of the claims.

SUMMARY OF INVENTION

In an aspect, a decorative radome includes a radio-transmissive substrate having a first surface on a first side and a second surface on a second side; and a radio-transmissive decorative coating, especially to provide at least one visual feature, on the radio-transmissive substrate, the radio-transmissive decorative coating including a decorative layer comprising and/or consisting of a metal or comprising and/or consisting of an alloy including a metal.

In a first alternative the radio-transmissive decorative coating is a first surface radio-transmissive decorative coating being located at least partly on the first side of the radio-transmissive substrate, especially on the first surface.

In a second alternative the radio-transmissive decorative coating is a second surface radio-transmissive decorative coating being located at least partly on the second side of the substrate, especially on the second surface, and the radio-transmissive decorative coating is at least partly covered with an overmolded layer, wherein especially the overmolded layer comprises a radio-transmissive polymer and/or is located on the side of the radio-transmissive decorative coating facing away from the substrate.

Consequently, the present disclosure provides in the first alternative a decorative radome with a radio-transmissive decorative coating on the outer surface of the radome, unlike decorative radomes according to the second alternative, which include a cover layer, typically of plastic, to protect the decorative coating.

A simplified radome having a first surface coating allows more design freedom to provide a larger range of components that may be used in a variety of circumstances. With specific regard to vehicles, such radomes are not restricted to a central-front location of a vehicle. For example, there is a desire to provide 360° radar coverage of vehicles to provide driver assistance, semi-autonomous and autonomous capabilities. For example, by providing trim around the vehicle that is radar transparent and is metallic in appearance radar systems can be positioned in various locations on the vehicle without compromising the look of the vehicle. In comparison to a decorative layer sandwiched between two substrate layers like the radome according to the second alternative such radar-transparent trim becomes possible.

For both alternatives it is proposed that the radio-transmissive substrate comprises at least one first surface structure being at least partly covered and/or at least partly filled with the radio-transmissive decorative coating, especially to provide a form fit connection between the radio-transmissive decorative coating on the one hand and the radio-transmissive substrate on the other hand or the radio-transmissive substrate and/or the radio-transmissive decorative coating comprises at least one second surface structure being at least partly covered and/or at least partly filled with the overmolded layer, especially to provide a form fit connection between the overmolded layer on the one hand and the radio-transmissive substrate and/or the radio-transmissive decorative coating on the other hand.

The use of such surface structures, that especially comprise at least one undercut, at least one groove, at least one indentation, at least one protrusion, at least one fungiform element, at least one T-Shaped element and/or at least one at least partly, especially in the radio-transmissive substrate and/or the radio-transmissive decorative coating, embedded and/or overmolded anchor element, allows to increase the coherence of the respective elements of the radome, especially of the substrate, the coatings and/or the layers. In addition to adhesive and/or chemical connections between the elements the elements are connected to each other in a form-fit manner. Thus, a disassembly of the elements from each other during the use is prevented in a much better way. Such a disassembly could lead to free spaces that could negatively influence the transmissibility of the radome and could also allow the migration of dust and/or moisture. Such a migration could destroy or damage elements of the radome, for example the decorative coating, negatively influencing the radio transmissibility and the optical characteristics like reflectivity for visual light. Furthermore, it becomes possible to provide larger decorative components such as body panels as, for example, the thickness of a surface protective polymer or overmold can be reduced without negatively influencing the protective characteristic of the polymer or overmold.

Another measure to increase the adherence of the elements in the second alternative is that the radio-transmissive substrate and the radio-transmissive decorative coating are heated prior to overmolding, especially the radio-transmissive substrate and the decorative coating are heated prior to overmolding to at least 70 degrees Celsius, or to at least 80 degrees Celsius. In addition the overmolding maybe optionally be performed with a barrel nozzle temperature below 300 degrees Celsius. By these measures the bonding strengths and the outer appearance can be further increased.

Many thin-coating layers are tensile at room temperature, which, when applied to plastic substrates, visually distort (for example craze) when exposed to elevated temperatures. It appears that this is due to the difference in coefficient of thermal expansion (CTE) which are typically in the order of three to six times lower for the thin coating layers compared to the plastic substrates.

The process of overmolding inherently exposes thin-coatings to high temperatures, as molten plastic resins as applied during the second-shot of the overmolding process at nozzle temperatures up to, or above, 300° C. As such, the overmolding of a substrate having a thin-coating (such as a reflective layer) may cause thermal expansion of the thin-coating and the substrate, which is expected to cause visual distortion of the thin-coating and damage the appearance of the coating. However, the present disclosure allows for the production of a unitary, multilayered article by directly overmolding a decorative layer and/or coating deposited on a substrate, without the need for thermal masks over the decorative layer and/or coating. Furthermore, the overmolding process removes the need for adhesives to adhere the layers, between which the decorative layer and/or coating is encompassed.

Overmolding directly onto a deposited thin-coating provides many advantages over the current methods of providing such decorative radomes. The deposition of thin-coatings via deposition techniques such as physical vapour deposition (PVD) allows for simple high-throughput production of substrates provided with a decorative layer reducing the likelihood of radio signal distortion or attenuation. Further, thin-coating deposition via PVD allows the thickness of the deposited layer to be substantially uniform. This has the advantage of reducing any refraction of the radar signal. Additionally, the direct overmolding of the decorative coating encases the coating, thereby protecting it from the elements, electrically isolating it, and reduces the likelihood of water ingress between the substrate and the overmolded layer, a problem encountered with multilayer radomes bound by adhesives.

To help reduce the likelihood of visual distortion of the decorative layer and/or coating prior to overmolding, in some embodiments of the method, the substrate and the decorative layer and/or coating are heated prior to overmolding. Preferably, the substrate and the decorative layer and/or coating are heated to at least 60 degrees Celsius, or to at least 70 degrees Celsius, or to at least 75 Degrees Celsius, or to at least 80 degrees Celsius prior to overmolding. This reduces the rate of temperature change in the decorative layer and/or coating during the second-shot of the overmolding process, thereby decreasing the degree of thermal expansion during overmolding and helping to reduce the likelihood of visual distortion of the decorative layer and/or coating.

Further, reducing the nozzle temperature of the overmolding process, and consequently using a suitable polymer which can flow at the specified nozzle temperature, reduces the likelihood of visual distortion of the decorative layer and/or coating. In some embodiments, the overmolded layer is formed with a barrel nozzle temperature at or below 300 degrees Celsius, or at or below 280 degrees Celsius, or at or below 250 degrees Celsius, or at or below 245 degrees Celsius during the overmolding process.

A particularly desirable use of the present disclosure is to provide a badge for the front of a vehicle. Typically, such badges consist of three dimensional symbols, which traditionally are chrome plated, or have a metallic appearance. Therefore, it is desirable to try and replicate such a badge in a manner that is suitable for use as a radome.

To increase the outer appearance of the radome, especially to provide such three dimensional (3D) visual features, it is proposed that the radio-transmissive substrate comprises on the second surface and/or on the first surface a relieved portion, preferably formed by a recess toward the opposite surface, and/or an elevated portion of the radio-transmissive substrate, wherein especially the decorative layer is at least partly applied to the relieved and/or elevated portion.

Especially to allow to provide a visual feature with a wanted form, for example a logo, character or number, it is proposed that the radio-transmissive substrate is masked to limit the area of application of the decorative layer to only a portion of the first surface or the second surface of the radio-transmissive substrate. Consequently, in at least some embodiments, the decorative layer is applied to only a portion of the substrate to form a visual feature. This visual feature may be a symbol such as a logo, or any other desired symbol.

To permit use as a radome, the decorative coating must minimally attenuate or reflect radio wavelength electromagnetic frequencies (radio waves) while substantially absorbing or reflecting electromagnetic radiation in the visible spectrum. This can be achieved by providing one or more electrically isolated, or non-conductive, metal thin film layer(s), or one or more metal alloy layer(s).

To provide a non-conductive alloy including metal, it is preferable to include a metalloid. Therefore, in some embodiments the alloy of a metal further includes a metalloid. Preferable metalloids include germanium and/or silicon.

In embodiments, where the alloy of a metal includes germanium it is preferred that the concentration of germanium is at least 25 wt % germanium, or at least 40 wt % germanium, or at least 45 wt % germanium, or at least 50 wt % germanium, or at least 55 wt % germanium. Such concentrations provide optimal visual appearance and sufficiently low radio wave attenuation or reflection.

To minimise radio wave attenuation and reflection, the decorative layer should be provided as a thin film. Therefore, in some embodiment, the decorative layer is up to 100 nm thick, or up to 50 nm thick, or up to 40 nm thick, or from 10 nm to 40 nm thick, or from 20 nm to 40 nm thick, or from 25 nm to 35 nm thick or about 30 nm thick.

A variety of metals can be used for the deposition of the metal layer, or for the metal component of the alloy including a metal. In some embodiments, the metal layer consists of a metal selected from the group of: indium or tin. In some embodiments, the alloy includes a metal selected from the group of: aluminium, silver, tin, indium or chromium.

Suitable radio transmissive alloys may include: germanium and aluminium and, optionally, silicon; or germanium and silicon; or germanium and silver and, optionally, silicon; or germanium and indium and, optionally, silicon; or aluminium and germanium and/or silicon; or chromium and germanium and/or silicon.

The inventors have identified that when providing a first surface or second surface decorative coating it is advantageous to control the residual stress of the decorative coating. Without being bound by theory, it is identified as being important that the residual stress of the decorative coating is within a desired range that is compatible with the substrate (preferably a synthetic polymer substrate).

It is has been identified that the first surface or second surface decorative radome will exhibit sufficient resilience in durability tests, when the overall residual stress of the radio-transmissive decorative coating is greater than or equal to −120 MPa, or greater than or equal to −50 Mpa, or greater than or equal to −40 MPa. More preferably, the overall residual stress of the radio-transmissive decorative coating is neutral (0 MPa) or tensile (>0 MPa).

In embodiments of the decorative coatings where the decorative layer is aluminium and germanium the net residual stress will preferably be greater than or equal to −120 MPa, preferably greater than or equal to −50 MPa. In embodiments of the radio-transmissive decorative coatings where the decorative layer is chromium and germanium the net residual stress will preferable be greater than or equal to −70 Mpa, preferably up to +170 Mpa.

The residual stress of the decorative layer can be modified to a degree by modifying the deposition parameters and the thickness of the layer. However, additional layers can be provided, such dielectric layers or hard coat layers, which can further modify the overall residual stress of the decorative coating to within the desired range. These coatings, particularly the dielectric layer, can also modify the optical properties and visual appearance of the radio-transmissive decorative coating.

Consequently, in some embodiments the first surface or second surface decorative radome includes multiple layers. In some embodiments the multiple layers of the decorative coating include a stress controlling and/or bonding layer. The location of the stress controlling layer, in a multi-layered decorative coating, can be any suitable location. However, in some embodiments a stress controlling layer is provided between the radio-transmissive substrate and the decorative layer. Alternatively, or additionally, a stress controlling layer can be provided on the first side of the decorative layer.

In some embodiments, wherein the radio-transmissive decorative coating comprises multiple layers, the radio-transmissive decorative coating includes at least one dielectric layer in addition to the decorative layer. In some embodiments, this dielectric layer is provided between the decorative layer and the radio-transmissive substrate. In some further embodiments, the multiple layers of the radio-transmissive decorative coating include at least one decorative layer between at least two dielectric layers. In some embodiments, the radio-transmissive decorative coating includes multiple dielectric layers and/or multiple decorative layers. Preferably, the dielectric layers and the decorative layers are alternating.

Preferred deposition methods, which may be used for applying the one or more layers of the radio-transmissive decorative coating to the substrate can be chosen from any physical vapour deposition system. Such systems may include thermal evaporation, electron beam evaporation (with or without ion beam assistance), sputter deposition pulsed laser deposition, cathodic arc deposition of electrohydrodynamic deposition, vacuum deposition, magnetron sputtering, but also additionally or alternatively the decorative layer maybe printed, preferably pad printed, and/or the decorative layer maybe coloured. Additionally, the surface of the radio-transmissive substrate may first be subjected to treatment prior to deposition to improve adhesion between the decorative layer and the substrate. In some embodiments the surface treatment may be selected from: plasma discharge, corona discharge, glow discharge and UV radiation.

In some embodiments, the radio-transmissive decorative coating can be tuned to achieve the desired stress window by optimising the deposition parameters of one or more of its layers. These parameters include sputter power, gas pressure, gas dopants (such as nitrogen) and coating thickness. Stress can also be tuned by introducing a thermal stress component by way of substrate heating, or by conducting a pre-treatment process directly before the deposition of layers or the radio-transmissive decorative coating.

Means are known in the art for measuring residual stress within the decorative coating or within individual layers. For example, the decorative coating can be placed on a glass slide and the glass slide can be placed into a stress measurement device (such as a Sigma Physik SIG-500SP) before and after deposition of a layer or the coating.

The residual stress may be modified by deposition of a layer of a material which, when deposited, produces a desired level of stress to compensate for the inherent residual stress of the decorative layer. Suitable materials include $SiO_x$, $SiO_xN_y$, $CrN_x$, $NbO_x$, $TaO_x$, and $ZrO_x$, where x and y are both preferably between 0.1 and 2.0. In some embodiments which include a dielectric layer, the dielectric layer is $SiO_x$ or silicon dioxide. Such a layer can be used to control the overall stress of the radio-transmissive decorative coating and may also influence its visual properties, depending on the positioning of the layer within the radio-transmissive decorative coating.

It will thus be apparent that when the desired optical effect of the decorative layer is required to be altered, concomitant changes will likely also be required to one or more additional layers of the decorative coating to ensure that the overall residual stress of the decorative coating is maintained in the desired window.

The provision of a radio-transmissive decorative coating on the first surface of a radome according to the first alternative exposes the radio-transmissive decorative coating to the external environment. This results in the radio-transmissive decorative coating being exposed to a variety of conditions, such as UV light, temperature extremes, rain, dust, dirt and a range of chemicals. Further, in applications such as external automotive trim, the decorative radome is further exposed to projectiles such as rocks and debris. Therefore, the radio-transmissive decorative coating of the radome is required to be sufficiently resilient to be used in such an environment. To improve the resilience of the radio-transmissive decorative coating, in some embodiments, the radio-transmissive decorative coating may include at least one protective hard coat layer. Typically, this will be the upper most layer of the radio-transmissive decorative coating and therefore will protect the underlying layers. However, in some embodiments, there may be an additional capping layer that provides characteristics, such as hydrophobic, hydrophilic, lipophobic, lipophilic and oleophobic or combinations thereof.

Further, hard coat layers can function as bonding layers or stress control layers within a multi-layered radio-transmissive decorative coating. Consequently, in some embodiments, the radio-transmissive decorative coating includes a hard coat layer between the decorative layer and the radio-transmissive substrate. Preferably, the radio-transmissive decorative coating includes a hard coat layer provided on the first surface or second surface of the radio-transmissive substrate. In some embodiments, especially the first alternative, the hard coat layer is between the decorative coating and the radio-transmissive substrate (but might not be in direct contact with the radio-transmissive substrate).

Without being bound by theory, the hard coat layer likely improves binding of the subsequent layers (such as the decorative layer) to the underlying layer or the radio-transmissive substrate and helps control the differential stress between the layers and the overall residual stress of the radio-transmissive decorative coating.

Additional layers can interface between a hard coat layer applied to the first surface or second surface of the radio-transmissive substrate and the decorative layer. In some embodiments, a dielectric layer is provided between the decorative layer and the protective hard coat.

In further embodiments at least two hard coat layers are provided, wherein preferably a first hard coat layer is located between the substrate and a second hard coat layer, wherein the second hard coat layer comprises at least one, preferably laser etched opening and/or recess. The recess especially allows to etch into the first hard coat layer to provide a "satin" appearance whereas the optical characteristics of the remaining part of the first hard coat layer remain unchanged. For this purpose the first hard coat layer comprises at least one, especially by laser etching, etched surface, especially in the area of the opening and/or recess of the first hard coating.

To further increase the visual appearance the second hard coat layer maybe opaque and/or reflective for visual light and/or the first and/or the second hard coat layer are covered at least partly by at least one for visual light semitransparent and/or reflective optical coating.

Suitable materials are known in the art for providing a hard coat layer for example the hard coat layer may include one or more abrasion resistant layers including a material selected from the group consisting of an organo-silicon, an acrylic, a urethane, melamine and an amorphous SiOxCyHz.

As discussed above, it is advantageous to keep the residual stress of the radio-transmissive decorative coating within an optimal range of greater than or equal to −120 MPa, or greater than or equal to −70 Mpa, or greater than or equal to −50 Mpa, or greater than or equal to −40 MPa. As the protective hard coat layer can influence the overall residual stress of the decorative coating, in some embodiments the overall residual stress of the radio-transmissive decorative coating is measured with the protective hard coat. In some embodiments, the overall residual stress is measured in the absence of the protective hard coat.

The radio-transmissive substrate for the decorative coating can be any suitable substrate that is sufficiently radio transparent and is fit for the intended purpose of the radome. However, preferably the radio-transmissive substrate is a synthetic polymer, such as: Acrylonitrile Ethylene Styrene (AES), Acrylonitrile butadiene styrene (ABS), acrylonitrile styrene acrylate (ASA), Polyamide (PA), polybutylene terephthalate (PBT), Polycarbonate (PC), Polyethylene (PE), Polyethylene Teraphthalate (PET), Poly(methyl methacrylate) (PMMA), Polyoxymethylene (POM), Polypropylene (PP), Polyurethane (PU), PolyVinyl-Chloride (PVC), high-flow AES, acrylonitrile-(ethylene-propylene-diene)-styrene (AEPDS), blends of thermoplastics, or PC-ABS blended thermoplastic. In some embodiments, the radio-transmissive substrate is Polycarbonate or Polypropylene.

Radio waves can be significantly attenuated by water, particularly ice, which can precipitate on the radome in cold conditions. This is particularly prevalent when the radome is used to provide the external panels of vehicles. Therefore, to de-ice the radome and allow optimal function, some embodiments of the decorative radome of the present disclosure include a heating element.

In preferred forms, the heating element includes a resistance wire. The resistance wire can be used to provide Joule heating. When a current is run through the resistance wire the wire's temperature increases thereby providing heat. The amount of heat produced is proportional to the product of the wire's resistance and the square of the current. Preferably, the wire is provided or molded within a polymer, especially the overmolded layer, such that heating element comprises a circuit, which may be molded within the polymer. The polymer can be a separate film, wherein the heating element is molded into the polymer film. This film can then be provided between the radio-transmissive substrate and the radio-transmissive decorative coating. Consequently, the heating element is protected from the environment by the radio-transmissive decorative coating, but is close to the surface to provide rapid de-icing, Like the radio-transmissive substrate, the polymer providing the film for the heating element needs to be radio-transmissive. As such the polymer film can be made out of any compatible polymer, such as those used for the radio-transmissive substrate. Accordingly, the polymer for the film may be selected from: Acrylonitrile Ethylene Styrene (AES), Acrylonitrile butadiene styrene (ABS), acrylonitrile styrene acrylate (ASA), Polyamide (PA), polybutylene terephthalate (PBT), Polycarbonate (PC), Polyethylene (PE), Polyethylene Teraphthalate (PET), Poly(methyl methacrylate) (PMMA), Polyoxymethylene (POM), Polypropylene (PP), Polyurethane (PU), PolyVinyl-Chloride (PVC), high-flow AES, acrylonitrile-(ethylene-propylene-diene)-styrene (AEPDS), blends of thermoplastics, or PC-ABS blended thermoplastic. In some embodiments, the polymer film is Polycarbonate or Polypropylene. Indeed, in some embodiments the heating element is provided in the radio-transmissive substrate.

To be suitable for use as a radome, the decorative radome of the present disclosure does not need to be completely radio transparent and therefore can have a permissible level of radio wave attenuation. In some specific embodiments, the decorative radome has radio wave signal attenuation less than 4 dB (two way) across a signal path, or less than 2 dB (one way), or more preferably less than 2 dB (two way) across a signal path, or less than 1 dB (one way) across a signal path within a frequency range of 20 to 81 GHz, or 76 to 81 GHz, or 76 to 77 GHz, or when the frequency is about 77 GHz, or about 79 GHz or about 81 GHz.

To achieve sufficient radio-transparency the decorative layer, consisting of a metal, or consisting of an alloy including a metal, should not be substantially electrically conductive. Consequently, in some embodiments the decorative layer has a sheet resistivity greater than $10^6$ ohms per square (Q/Q).

The optimal thickness of the radio-transmissive substrate can influence the attenuation of a traversing radio wave. As the decorative radome of the present disclosure may be used with radar systems, which emit frequencies between 76 and 81 GHz, the optimal thickness of a polycarbonate substrate, is a multiple of about 1.15 mm. Therefore, in some embodiments the thickness of the radio-transmissive substrate is about 1.15 mm, 2.3 mm or 2.45 mm. In some embodiments, particularly for use with vehicles, the radio-transmissive substrate is between 2 mm and 2.6 mm thick. This thickness also provides advantages with weigh, cost, moldability and resilience amongst other design considerations.

To further increase the outer appearance of the radome, especially of the visual feature, a lighting and/or illumination system is proposed. The system comprises at least one light source, preferably comprising at least one LED, at least one laser, and/or at least one light source array, and at least one light guide connected to the light source.

It is the inventive idea to use already existing elements and/or layers of the radome as light guides of the system. Preferably the light guide is at least partly formed by a layer and/or element being located neighbouring to and/or contacting the decorative coating, especially the radio-transmissive substrate, the hard coat layer(s), the intermediate layer and/or the overmolded layer.

In addition or alternatively the light source is coupled into the light guide in a direction perpendicular to the normal direction of at least a part of the first surface and/or the second surface, especially the light source is at least partly located on a side edge of the radome, preferably located behind a supporting structure of the radome, like a brezzel or a grill. By these measures, the light source can be located outside the radio/radar transmission area so that also by the light source a negative impact on the transmissibility of the radome is avoided.

The present disclosure further provides a radar system including a radio wave transmitter, a radio wave receiver and a decorative radome as described herein. The optimal thickness of the radio-transmissive substrate will be dependent on the wavelength of the radio wave emitted from the radio wave transmitter and the dielectric real permittivity of the substrate. Therefore, in some embodiments, the thickness of the radio-transmissive substrate of the radome is a multiple of $\lambda i/2$ wherein $\lambda i$ is the wavelength through the substrate of a radio wave transmitted from the radio wave transmitter. Preferably, the radio wave transmitter transmits radio waves in the frequency between 20 GHz and 81 GHz, or from 76 to 81 GHz, or from 76 to 77 GHz, or at about 77 GHz, or at about 79 GHz or at about 81 GHz.

To replicate the metallic finish of many vehicle badges, it is desirable for the decorative layer and/or coating to be a reflective layer and/or coating. Consequently, in some embodiments the decorative layer and/or coating is a reflective layer and/or coating which is at least 35% reflective, or at least 45% reflective, or at least 50% reflective, or at least 55% reflective. As the radome is in the second alternative designed to encompass the decorative layer within two layers of polymer, it is desirable to measure the reflectivity as viewed from the second surface (i.e. the external surface of a transparent layer).

To prevent excessive refraction and distortion of radio wave signals traversing the radome, it is preferable for the front and rear surfaces of the formed radome to be parallel or substantially parallel, for at least a portion of the radome, to provide a signal path of uniform thickness. Therefore, in some embodiments (once set) the overmolded layer provides a third surface which is parallel or substantially parallel, to the first surface of the radio-transmissive substrate, over at least a portion of the radome, the portion defining a signal path.

In order to allow viewing of the decorative layer and/or coating, in some embodiments at least one of either the substrate or the overmolded layer is substantially transparent to visible light. Preferably, the radio-transmissive substrate is in the second alternative the layer substantially transparent to visible light. One particular suitable polymer is polycarbonate. Further, to improve contrast of the decorative layer, tune the colour and reflectivity, and to obscure viewing of underlying electronics, the layer opposing the transparent layer is substantially opaque. As such, in some embodiments, either the substrate or the overmolded layer is substantially opaque to visible light.

The radome of the present disclosure may further comprise an intermediate layer to at least a portion of the first or second surface of the radio-transmissive substrate. The intermediate layer can play a decorative role in addition to, or in combination with, the decorative layer and/or coating. For example the intermediate layer may be coloured and therefore may add colour to the decorative radome. Therefore, in at least some embodiments, the intermediate layer is coloured.

Further, in at least some embodiments, the decorative layer and/or coating may, or may also, act to mask the application of the decorative layer and/or coating on the radio-transmissive substrate. In such embodiments, the intermediate layer and decorative layer and/or coating are deposited such that the intermediate layer is not substantially overlaid, or not overlaid, by the decorative layer and/or coating. Such masking can be utilised when shadow masking during the deposition of the decorative layer and/or coating is difficult, or the appropriate detail cannot be achieved by shadow masking. In at least some embodiments, the intermediate layer is used in conjunction with a shadow mask to allow selective application of a decorative layer and/or coating to the radio-transmissive substrate.

The intermediate layer may be any suitable layer, and in a preferred embodiment the intermediate layer is an ink, dye, oil or other suitable liquid. The ink can be deposited by a suitable printing method. These may include dye diffusion thermal transfer, wax thermal transfer, indirect dye diffusion thermal transfer, screen printing, inkjet printing or a gravure printing process such as pad printing. In some embodiments, the intermediate layer is deposited by printing. In some embodiments, the intermediate layer is deposited by pad printing.

In view of the above, it is to be understood that (unless expressly stated otherwise) reference to the deposition of the decorative layer and/or coating, or intermediate layer, to the first surface or the second surface of the radio-transmissive substrate encompasses deposition onto a coating, layer or film previously deposited onto the first surface or second surface of the radio-transmissive substrate, such as a hard-coating.

A hard-coat will act as a protective layer to the external environment reducing physical and chemical damage.

The intermediate layer may be any suitable layer, and in a preferred embodiment the intermediate layer is an ink, dye, oil, wax, lubricant or other suitable liquid. In a preferred embodiment, the intermediate layer is an ink.

In an aspect, a method of manufacturing a PVD coated system including a substrate includes applying a hard coating to the substrate; applying a PVD coating by magnetron sputtering to the substrate; and laser etching one or more of a pattern or a graphic into the PVD coating so that the PVD coating is at least partially removed and the pattern or the graphic is revealed as a result of the contrast between the substrate and the PVD coating.

The substrate may include polycarbonate and the hard coating comprises SilFort PHC587B.

The applying the hard coating may include at least one of dip coating the substrate in the hard coating and curing the hard coating, or applying via plasma enhanced chemical vapor deposition (PECVD) by a suitable monomer, flow coating or spray coating.

The method may further include providing an intermediate dielectric material between the PVD coating and the hard coating.

The method may further include providing a protective outer coating on the PVD coating after laser etching the PVD coating, the protective outer coating comprising a satin additive or comprising no satin additive.

The method may further include providing a protective outer coating on the PVD coating before laser etching, wherein the laser etching further comprises etching the pattern or the graphic into both the PVD coating and the protective outer coating, and the protective outer coating comprises a satin additive or comprising no stain additive.

The applying the protective outer coating may include at least one of dip coating the substrate in the protective outer coating and curing the protective outer coating; or applying via plasma enhanced chemical vapor deposition (PECVD) by a suitable monomer, flow coating or spray coating.

In another aspect, a method of manufacturing a PVD coated system including a substrate, includes: applying a hard coating to the substrate; applying a reflective PVD coating of low optical transmission by magnetron sputtering to the substrate; laser etching one or more of a pattern or a graphic into the PVD coating so that the PVD coating is at least partially removed using a laser setting which provides a texture on regions where laser etching is applied; and applying a translucent but reflective PVD coating by magnetron sputtering so that the pattern or the graphic is visible with a satin appearance.

The method may further include cleaning the substrate after laser etching.

The substrate may include polycarbonate and the hard coating includes SilFort PHC587B.

The applying the hard coating may include at least one of: dip coating the substrate in the hard coating and curing the hard coating; or applying via plasma enhanced chemical vapor deposition (PECVD) by a suitable monomer, flow coating or spray coating.

The method may further include providing an intermediate dielectric material between the PVD coating and the hard coating.

The method further include providing a protective outer coating on the translucent but reflective PVD coating, the protective outer coating comprising a satin additive or comprising no satin additive.

The applying the protective coating may include at least one of: dip coating the substrate in the protective outer coating and curing the protective outer coating; or applying via plasma enhanced chemical vapor deposition (PECVD) by a suitable monomer, flow coating or spray coating.

The method of manufacturing a PVD coated system comprising a substrate, the method includes applying a hard coating to the substrate; applying a PVD complex interference stack coating by magnetron sputtering to the substrate; and laser etching one or more of a pattern or a graphic into the PVD complex interference stack coating so that the PVD complex interference stack coating is at least partially removed and different colors are revealed depending on a depth and structure of the laser etching.

The substrate may include polycarbonate and the hard coating comprises SilFort PHC587B.

The applying the hard coating may include at least one of: dip coating the substrate in the hard coating and curing the hard coating; or applying via plasma enhanced chemical vapor deposition (PECVD) by a suitable monomer, flow coating or spray coating.

The method may further include providing an intermediate dielectric material between the PVD coating and the hard coating.

The method may further include providing a protective outer coating on the PVD coating after laser etching the PVD coating, the protective outer coating comprising a satin additive or comprising no satin additive.

The method may further include providing a protective outer coating on the PVD coating before laser etching, wherein the laser etching further comprises etching the pattern or the graphic into both the PVD coating and the protective outer coating, and the protective outer coating comprises a satin additive.

The applying the protective outer coating may include at least one of: dip coating the substrate in the protective outer coating and curing the protective outer coating; or applying via plasma enhanced chemical vapor deposition (PECVD) by a suitable monomer, flow coating or spray coating.

In another aspect a decorative PVD coated item comprises: a substrate; a hard coating applied to the substrate; a PVD coating provided on the hard coating and the substrate, wherein the PVD coating is laser etched with one or more of a pattern or a graphic so that the PVD coating is at least partially removed and the pattern or the graphic is revealed as a result of the contrast between the substrate and the PVD coating.

The item may further be characterized in that the substrate comprises polycarbonate and the hard coating comprises SilFort PHC587B.

The decorative PVD coated item may include an intermediate dielectric material between the PVD coating and the hard coating.

The item may further comprise a protective outer coating on the PVD coating, the protective outer coating comprising a satin additive or comprising no satin additive.

The item may be in form of a rearview device component, a rearview mirror housing, a rearview mirror scalp, a rearview camera housing, a rearview camera scalp or an exterior rearview device component.

In another aspect a decorative PVD coated item, comprises a substrate; a hard coating applied to the substrate; a reflective PVD coating of low optical transmission provided on the hard coating and the substrate; a translucent but reflective PVD coating provided on the reflective PVD coating, wherein one or both of the reflective PVD coating of low optical transmission and the translucent but reflective PVD coating is/are laser etched with one or more of a pattern or a graphic so that one or both of the reflective PVD coating and the translucent but reflective PVD coating is/are at least partly removed and the pattern or the graphic is visible with a satin appearance due to the translucent but reflective PVD coating.

In the decorative PVD coated item the substrate may comprise polycarbonate and the hard coating comprises SilFort PHC587B.

The decorative PVD coated item may further comprise an intermediate dielectric material between the one or both of the reflective PVD coating of low optical transmission and the translucent but reflective PVD coating on the one hand and the hard coating on the other hand.

The decorative PVD coated item may further comprise a protective outer coating on one or both of the reflective PVD coating of low optical transmission and the translucent but reflective PVD coating, the protective outer coating comprising a satin additive or comprising no satin additive.

The decorative PVD coated item may be in form of a rearview device component, a rearview mirror housing, a rearview mirror scalp, a rearview camera housing, a rearview camera scalp or an exterior rearview device component.

In a further aspect a decorative PVD coated item comprises a substrate; a hard coating applied to the substrate; a PVD complex interference stack coating provided on the hard coating and the substrate, wherein the PVD complex interference stack coating is laser etched with one or more of a pattern or a graphic so that the PVD complex interference stack coating is at least partially removed and at least one of different colors and a texture are revealed depending on a depth and structure of the laser etching.

In the decorative PVD coated item the substrate may comprise polycarbonate and the hard coating comprises SilFort PHC587B.

The decorative PVD coated item may comprise an intermediate dielectric material between the PVD coating and the hard coating.

The decorative PVD coated item may further comprise a protective outer coating on the PVD coating, the protective outer coating comprising a satin additive or comprising no satin additive.

The item may further comprise a protective outer coating on the PVD coating, the protective outer coating comprising a satin additive or comprising no satin additive.

The item may be in form of a rearview device component, a rearview mirror housing, a rearview mirror scalp, a rearview camera housing, a rearview camera scalp or an exterior rearview device component.

BRIEF DESCRIPTION OF DRAWINGS

Certain embodiments are illustrated by the following figures. It is to be understood that the following description is for the purpose of describing particular embodiments only and is not intended to be limiting with respect to the description.

FIG. 2a illustrates a radome according to the disclosure comprising two hard coat layers to provide a "satin" appearance.

FIG. 2b shows a view onto a radome including a "satin" feature as shown in FIG. 2a.

FIG. 2c shows a view onto an alternative radome also including a "satin" feature" as shown in FIG. 2a.

FIG. 5 illustrates an embodiment of the decorative radome of the present disclosure according to the first alternative including a multi-stack decorative coating with multiple decorative layers and multiple dielectric layers.

FIG. 6 illustrates an embodiment of the decorative radome of the present disclosure according to the first alternative including a heating element between the radio-transmissive substrate and the decorative coating.

FIG. 7 illustrates a radar system including a radio wave transmitter/receiver and a radome in accordance with the present disclosure according to the first alternative.

DETAILED DESCRIPTION

Figure 1:
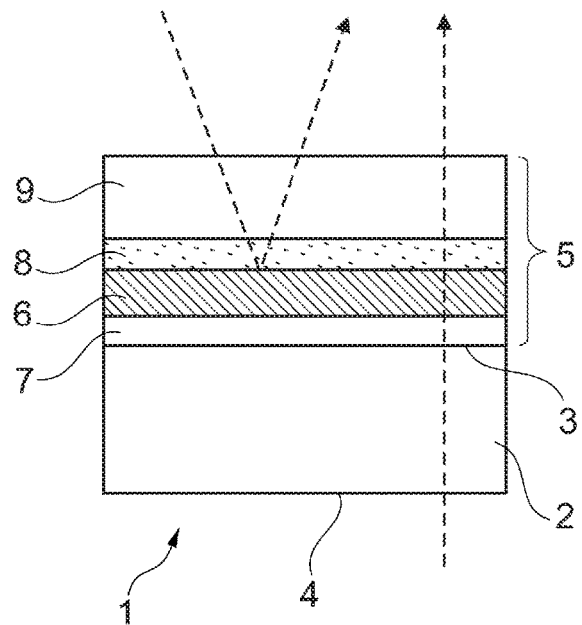
FIG. 1 illustrates an embodiment of the decorative radome of the present disclosure according to the first alternative and indicates the reflection of visible light (short dashes) from the decorative layer while radio waves (long dashes) can traverse the radome.

Throughout this specification, unless the context requires otherwise, the word "comprise", or variations such as "comprises" or "comprising", will be understood to imply the inclusion of a stated element or integer or group of elements or integers but not the exclusion of any other element or integer or group of elements or integers.

Also, it is to be noted that, as used herein, the singular forms "a", "an" and "the" include plural aspects unless the context already dictates otherwise.

Throughout the specification, a radome and finishing on a surface of a radome are described in reference with FIGS. 1-18; however, it should be appreciated that the present disclosure is not limited to radomes. FIGS. 19-31 are generally directed to examples of manufacturing decorative PVD coated items which contain gloss, satin and/or patterned metallic finishes with or without colored graphics with or without backlighting capability. These coated items may include other substrates which are not a radome such as any plastic substrate for use with vehicle parts. Example comprise rearview components like housings or scalps for exterior rearview mirror or exterior review camera systems.

With respect to FIGS. 1-31, reference will be made to layers in relation to the plastic substrate and in relation to each other. Therefore, in order to define the spatial relationship of the coating in relation to the substrate, and the spatial relationship between layers included in the coating, the following terminology will be used.

"First side" is to be understood as the side of the substrate, coating, or specific layer which in-use faces away from a radio wave transmitting or receiving device. As such, the first side is the side which is facing toward the external environment. In the specific context of a vehicle, this would be the visible outside of the vehicle.

"Second side" is to be understood as the opposing side to the first side. In an in-use context this is the side facing toward the radio wave transmitting device, or receiving device. Typically, the second side is not visible when the radome is used.

"First surface" is to be understood to refer to the surface on the first side of a substrate, coating, or specified layer.

"Second surface" is to be understood to refer to the surface on the second side of a substrate, coating, or specified layer.

The term "reflective" (without qualification such as "radio wave") refers to reflection of visible light, typically in the nanometre wave length and frequency range of 400 to 800 THz.

A reference to radio wave throughout the specification, typically refers to frequencies of 10 MHz to 3000 GHz. In preferred embodiments, and in relation to automotive vehicles, the frequency is typically 1000 MHz to 100 GHz. In some specific embodiments in relation to radomes for vehicles, the frequency is 21 GHz to 81 GHz, or about 24 GHz to about 79 GHz or about 77 GHz to about 79 GHz, or about 24 GHz, about 77 GHz or about 79 GHz. Use of about in this context does not exclude explicit limitation to specified band (e.g. 24 GHz) but does envisage the typical band spread used in the applications such as automotive radar systems. These band widths are known in the art for example see Hasch et al. "Millimeter-Wave Technology for Automotive Radar Sensors in the 77 GHz Frequency Band", *IEEE Transactions on Microwave Theory and Techniques* (Volume: 60, Issue: 3, March 2012)

The term "transparent" and "opaque" when used without a qualifier (such as "radio-wave" or "radar") refers to visually transparent or opaque, and hence is a reference to transmission or absorption of visible light as defined above.

As discussed above, the decorative radome of the present disclosure comprises a first surface or second surface coating, being a coating on the first side and in contact with the first surface of a substrate or on the second side and in contact with the second surface of a substrate. The first surface or second surface coating may include multiple "stacked" layers, with each layer having a first surface and a second surface, with the first surface of one layer abutting the second surface of an overlaying layer, which itself has a first surface. Resultantly, the use of the terms "first side", "second side", "first surface" and "second surface" need to be read and interpreted in the relative context for which they are used.

A decorative radome (1) in accordance with the present disclosure is illustrated in FIGS. 1 to 6 and includes: a radio-transmissive substrate (2) having a first surface (3) on a first side and a second surface (4) on a second side; a radio-transmissive decorative coating (5) on the first surface (3) of the radio-transmissive substrate (2), the radio-transmissive decorative coating (5) including a decorative layer (6) consisting of a metal or consisting of an alloy including a metal.

Figure 2:
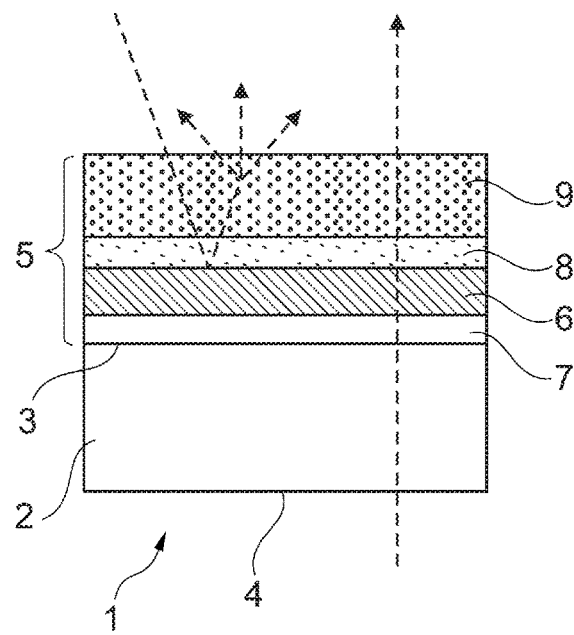
FIG. 2 illustrates an embodiment of the decorative radome of the present disclosure according to the first alternative including an upper coating which diffuses visible light (short dashes) thereby providing a satin look.
Figure 3:
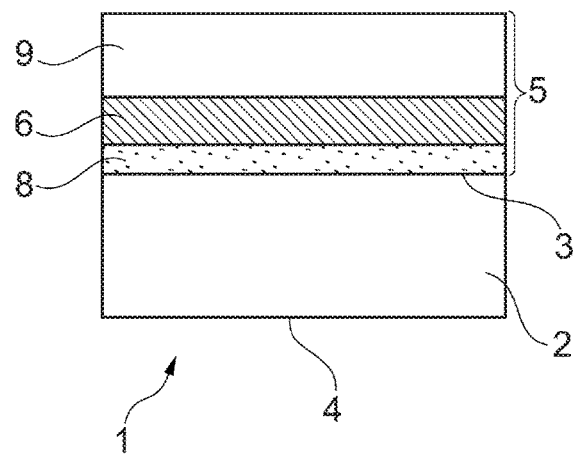
FIG. 3 illustrates an embodiment of the decorative radome of the present disclosure according to the first alternative including an intermediate dielectric layer between the substrate and the decorative layer.

As illustrated in FIGS. 1 and 2, the radome of the present disclosure permits radio waves to traverse the radome (long dashes) while some visible light (short dashes) is reflected off the decorative layer (6), such that the appearance of the radome (1) is coloured or reflective.

Radio-Transmissive Substrate

The radome (1) of the present disclosure is for use in the intended radio wave path of a transmitter and/or a receiver for a radio communication system or radio detection and ranging system, as such the design of the radome may be dictated by its intended use. Consequently, the selection of materials for the radio-transmissive substrate (2) will be, in part, dictated by design considerations, which are not solely based on the degree of radio-transparency such as robustness, moldability, resistance to extreme temperatures and cost. As such, the radio-transmissive substrate (2) can be any substrate, which attenuates the desired radio wave frequency at an acceptable level for the desired application. As is understood, all substrates will attenuate and reflect radio-waves to an extent.

However, in some embodiments of the disclosure, the substrate is a polymer, preferably a synthetic polymer. As would be understood in the art, radio-transmissive substrates are typically resistant to electrical conductivity (i.e. are insulating or are a dielectric). Suitable polymers for the substrate (2) include (but are not limited to): Acrylonitrile Ethylene Styrene (AES), Acrylonitrile butadiene styrene (ABS), acrylonitrile styrene acrylate (ASA), Polyamide (PA), polybutylene terephthalate (PBT), Polycarbonate (PC), Polyethylene (PE), Polyethylene Teraphthalate (PET), Poly(methyl methacrylate) (PMMA), Polyoxymethylene (POM), Polypropylene (PP), Polyurethane (PU), PolyVinyl-Chloride (PVC), high-flow AES, acrylonitrile-(ethylene-propylene-diene)-styrene (AEPDS), blends of thermoplastics, or PC-ABS blended thermoplastic. In some embodiments, the radio-transmissive substrate (2) will be formed of Polycarbonate or Polypropylene.

Decorative Coating

The decorative layer (6) of the decorative coating (5) is preferably a reflective layer, and includes any suitable metal or alloy including a metal that provides the desired reflectivity, or appearance while being radio-transmissive. In some embodiments, the metal which forms the decorative layer (6) is a transition metal. In some embodiments, the metal which forms the decorative layer (6) is indium or tin.

In some embodiments, wherein the decorative layer (6) is an alloy including a metal, the alloy comprises a metal selected from the group of: aluminium, tin, indium or chromium. In some embodiments, the decorative layer (6) includes a metalloid. Metalloids include silicon, boron, germanium, arsenic, antimony and/or tellurium. In specifically preferred embodiments, the metalloid is germanium or silicon. In a most preferred embodiment, the metalloid is germanium. Suitable metalloid/metal alloys include germanium and aluminium and/or silicon; or germanium and silicon; or germanium and silver and, optionally, silicon; or germanium and indium and, optionally, silicon; or chromium and germanium and/or silicon. In some express embodiments, the alloy is not silicon and aluminium.

In embodiments where the metal alloy includes germanium the concentration of germanium may be at least 25 wt % germanium, or at least 40 wt % germanium, or at least 45 wt % germanium, or at least 50 wt % germanium, or at least 55 wt % germanium.

Methods are known in the art for providing thin film layers such as the decorative layer (6) consisting of a metal or consisting of an alloy including a metal. However, preferably, the decorative layer (6) is deposited by Physical Vapour Deposition (PVD). Suitable PVD methods include magnetron sputtering and evaporation, which may be resistive thermal evaporation or electron-beam evaporation. In some embodiments, the decorative layer (6) is deposited by magnetron sputtering.

In some embodiments, the decorative coating (5) includes multiple layers, with the decorative layer (6) being abutted by one or more additional layer(s). In some embodiments, the multiple layers of the decorative coating (5) includes a bonding layer. Typically, the bonding layer will directly abut the substrate and will therefore form the first layer in a multi-layer stack. For example, a hard coat layer (7) may be provided to the first surface (3) of the substrate (2) prior to the addition of further layers in the decorative coating. Such a hard coat layer (7) acts to improve the bonding strength of the decorative layer (6) to the substrate (2) thereby reducing the likelihood of delamination of the coating (5) from the substrate (2). The hard coat (7) may also influence the overall residual stress of the radio-transmissive decorative layer (5) and as such may act, at least in part, as a stress controlling layer.

In some embodiments, the radio-transmissive decorative coating (5) includes a stress controlling layer which may underlie or overlie the radio-transmissive decorative layer (6). Therefore, as illustrated in FIGS. 1, 2, 4, 5 and 6 a stress controlling layer (8) is on the first side (preferably the first surface) of the decorative layer (6).

Figure 4:
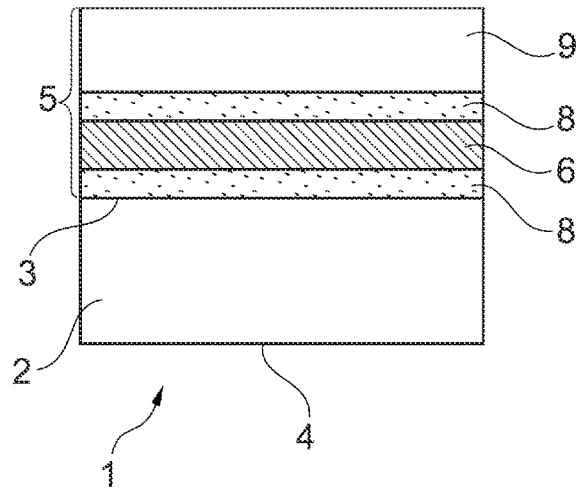
FIG. 4 illustrates an embodiment of the decorative radome of the present disclosure according to the first alternative including dielectric layers above and below the decorative layer.

In some embodiments, as illustrated in FIGS. 4 and 5, the radio-transmissive decorative coating may include a stress controlling layer (8) below the decorative layer (6). In these embodiments, where the stress controlling layer (8) is between the radio-transmissive substrate and the decorative layer (6). The stress controlling layer can be positioned above a hard coat (7) on the first surface (3) of the radio-transmissive substrate (2) and below the decorative layer (6).

In some embodiments, the multiple layers of the radio-transmissive decorative coating (5) include at least one dielectric layer, in the exemplified embodiments this dielectric layer is the stress controlling layer (8). However, the dielectric layer may also alter the visual characteristics of the decorative coating (5). This is particularly relevant in embodiments with multiple decorative layers (6) or an upper most dielectric layer (8) (FIGS. 1, 2, 4, 5 and 6). Suitable dielectrics for thin film deposition are known in the art and include oxides such as hafnium dioxide ($HfO_2$), aluminium oxide ($Al_2O_3$), zirconium dioxide ($ZrO_2$), titanium dioxide ($TiO_2$) and silicon dioxide ($SiO_2$). In a preferred form, the dielectric layer is silicon dioxide ($SiO_2$).

In some embodiments, the radio-transmissive decorative coating (5) includes at least one layer consisting of a metal or an alloy including a metal (6) between at least two dielectric layers (8) (see FIGS. 4 and 5). Additionally, in the embodiment illustrated in FIG. 5, the decorative coating (5) includes two decorative layers (6) sandwiched between alternating dielectric layers (8). These multilayer stacks allow for tuning of the radio-transmissive decorative coating (5), including its colour and residual stress.

Different visual appearances may be achievable by providing a radio-transmissive decorative coating which includes multiple stacked layers. Examples of possible multi-layer stacks include:

$SiO_2$:AlGe:$SiO_2$:AlGe:$SiO_2$
$SiO_2$:CrGe:$SiO_2$:CrGe:$SiO_2$
AlGe:$SiO_2$:AlGe:$SiO_2$
CrGe:$SiO_2$:CrGe:$SiO_2$
AlSi:$SiO_2$:AlSi:$SiO_2$

Such visual stacks could include a stress controlling layer to optimise the residual stress of the radio-transmissive decorative coating (5) within a desired window. Preferably, this stress window is greater than or equal to −120 MPa, or greater than or equal to −70 Mpa, or greater than or equal to −50 Mpa, or greater than or equal to −40 MPa. Suitable materials for controlling stress include a dielectric layer, such as a further silicon dioxide layer, which can be tuned to provide a desired stress range (e.g. by altering thickness and deposition conditions) without altering the visual appearance of the decorative coating.

Protective Hard Coat

The inherent function of a radome is to provide protection to radar equipment from the environment. As such, the radome is susceptible to degradation, wear and damage. This exposure is further amplified when the radome is positioned at the front of a vehicle that is routinely exposed to relatively high speeds, abrasives, projectiles as well as chemicals used for cleaning.

Consequently, in preferred embodiments of the present disclosure the outer most layer of the decorative coating (5) is a protective hard coat (9). In this respect, a coating that is said to be a "hard coat" is a coating that is harder or more resilient (e.g. chemical resilient) than the underlying layers, whereby it increases the abrasion resistance, resistance to environmental damage or chemical resistance of radome.

As discussed above, intermediate layers of the decorative coating (5) can also include a hard coat layer (7). This may be a hard coat of the same material, or of different material, to the protective hard coat (9).

In some embodiments, the hard coat(s) increase the abrasion resistance of the surface. Abrasion resistance can be measured through standard tests such as ASTM F735 "Standard Test Method for Abrasion Resistance of Transparent Plastics and Coatings Using the Oscillating Sand Method", ASTM D4060 "Standard Test Method for Abrasion Resistance of Organic Coatings", by the Taber Abrader, or by using the well-known Steelwool Test.

It is a requirement for many exterior automotive components, such as radomes, to be "chemically resistant", which is a reference to an ability to withstand exposure to normal solvents such as diesel fuel, petroleum, battery acid, brake fluid, antifreeze, acetone, alcohol, automatic transmission fluid, hydraulic oil and ammonia based window cleaners. In this respect, it will be appreciated that a hard coat (7, 9) ideally provides at least the first surface of the radome with such chemical resistance.

A hard coat (7, 9) is preferably formed from one or more abrasion resistant layers and may include a primer layer that bonds well to the underlying layer and forms a preferable surface for subsequent upper layers. The primer layer may be provided by any suitable material and may for example be an organic resin such as an acrylic polymer, a copolymer of an acrylic monomer and methacryloxysilane, or a copolymer of a methacrylic monomer and an acrylic monomer having a benzotriazole group or benzophenone group. These organic resins may be used alone or in combinations of two or more.

The hard coat layer(s) (7, 9) is/are preferably formed from one or more materials selected from the group consisting of an organo-silicon, an acrylic, a urethane, a melamine or an amorphous $SiO_xC_yH_z$.

Commercially available hard coatings include Momentive products: PHC-587B, PHC-587C2, PHCXH100P, AS4700F, UVHC 5000 (which is UV cured) and the two-part product comprising a primer of PR660 (SDC Technologies), subsequently coated with MP101 (SDC Technologies).

Most preferably, the hard coat layer(s) (7, 9) is/are an organo-silicon layer, due to its superior abrasion resistance and compatibility with physical vapour deposited films. For example, a hard coat layer comprising an organo-silicon polymer can be formed of a compound selected from the following compounds: trialkoxysilanes or triacyloxysilanes such as, methyltrimethoxysilane, methyltriethoxysilane, methyltrimethoxyethoxysilane, methyltriacetoxysilane, methyltripropoxysilane, methyltributoxysilane, ethyltrimethoxysilane, ethyltriethoxysilane, vinyltrimethoxysilane, vinyltriethoxysilane, vinyltracetoxysilane, vinyltrimethoxyethoxysilane, phenyltrimethoxysilane, phenyltriethoxysilane, phenyltriacetoxysilane, gamma-chloropropyltrimethoxysilane, gamma-chloropropyltriethoxysilane, gamma-chloropropyltripropoxysilane, 3,3,3-trifluoropropyltrimethoxysilane gamma-glycidoxypropyltrimethoxysilane, gamma-glycidoxypropyltriethoxysilane, gamma-(beta-glycidoxyethoxy)propyltrimethoxysilane, beta-(26,4-epoxycyclohexyl)ethyltrimethoxysilane, beta-(26,4-epoxycyclohexyl)ethyltriethoxysilane, gamma-methacryloxypropyltrimethyoxysilane, gamma-aminopropyltrimethoxysilane, gamma-aminopropyltriethoxysilane, gamma-meraptopropyltrimethoxysilane, gamma-mercaptopropyltriethoxysilane, N-beta(aminoethyl)-gamma-aminopropyltrimethoxysilane, beta-cyanoethyltriethoxysilane and the like; as well as dialkoxysilanes or diacyloxysilanes such as dimethyldimethoxysilane, phenylmethyldimethoxysilane, dimethyldiethoxysilane, phenylmethyldiethoxysilane, gamma-glycidoxypropylmethyldimethoxysilane, gamma-glycidoxypropylmethyldiethoxysilane, gamma-glycidoxypropylphenyldimethoxysilane, gamma-glycidoxypropylphenyldiethoxysilane, gamma-chloropropylmethyldimethoxysilane, gamma-chloropropylmethyldiethoxysilane, dimethyldiacetoxysilane, gamma-methacryloxypropylmethyldimethoxysilane, gamma-metacryloxypropylmethyldiethoxysilane, gamma-mercaptopropylmethyldimethoxysilane, gamma-mercaptopropylmethyldiethoxysilane, gamma-aminopropylmethyldimethoxysilane, gamma-aminopropylmethyldiethoxysilane, methylvinyldimethoxysilane, methylvinyldiethoxysilane and the like.

The hard coat layer(s) (7, 9) may be coated by dip coating in liquid followed by solvent evaporation, or by plasma enhanced chemical vapour deposition (PECVD) via a suitable monomer, flow coating or spray coating. To improve the abrasion resistance of the hard coats (7, 9), subsequent coatings of the hard coat may be added, preferably within a 48-hour period so as to avoid aging and contamination of the earlier coatings.

The thickness of the hard coat layer(s) (7, 9) is preferably selected to assist in providing adequate abrasion resistance, or to improve the bonding of the subsequent layers to the radio-transmissive substrate (2). The appropriate abrasion resistance will be determined by the required application and the demands of the user. In some applications, adequate abrasion resistance may be regarded as being a Bayer abrasion ratio of 5 with respect to an uncoated radio-transmissive substrate (2) (such as a polycarbonate), or alternatively by a Taber abrasion test with delta haze less than 15% after testing with a 500 g load and CS10F wheel at 500 cycles, (% haze being measured as per ASTM D1003). With these requirements met, when an organo-silicon is used as a hard coat layer (7, 9), the thickness of the hard coats is preferably at minimum of at least 1 μm thick on average and/or has a maximum thickness of 25 μm thick. In some embodiments, the thickness of the hard coat layer (7) provided to the first surface (3) is from 1 μm to 15 μm. In some embodiments, the thickness of the of the hard coat layer (7) provided to the first surface (3) is from 2 μm to 10 μm, or from 2 μm to 9 μm. In some embodiments, the thickness of the protective hard coat layer (9) is from 5 μm to 25 μm. In some embodiments, the thickness of the of the protective hard coat layer (9) is from 8 μm to 20 μm, or from 8 μm to 16 μm.

The protective hard coat (9) can also modify the appearance of the decorative layer (6). As illustrated in FIG. 2, the protective hard coat (9) includes an additive to diffuse reflected visible light. Consequently, the decorative layer (6) has an outward "satin" appearance.

This disclosure is however not restricted to provide a uniform satin appearance over the complete decorative coating. This disclosure allows to provide a visual feature wherein only a part, for example a logo, provides a satin graphic or pattern within the decorative coating, especially at least partly provided by a PVD coating method on a substrate, especially the substrate 2. In an embodiment shown in FIG. 2a a radome (1') comprising a substrate (2') and a decorative coating (5') providing such a satin pattern is shown.

The decorative coating (5') comprises a different layer structure including a first hard coat (9a'), a second hard coat (9b') as well as a further coating layer (10'). The hard coat (9b') might be replaced by a reflective coating. This reflective coating has a low optical transmission.

The satin graphic is provided by first applying the hard coat layer (9a') to the, especially plastic and/or polycarbonate, substrate (2'). The hard coat layer (9a') can be provided by dip coating with a polysiloxane hardcoat, for example PHC-587B of Momentive. After the dip coating the material is allowed to flash off and cure. In this way a hard coat layer (9a') for example having a thickness of more than 3 μm can be provided.

In a further step the second hard coat layer (9b') is provided. The hard coat layer (9b') might be provided by a PVD coating process using a batch coating vacuum chamber. Preferably, the hard coat layer (9b') is opaque for visual light. For example, a hard coat layer with silica and a metal be provided to create a highly reflective surface.

In case instead of the hard coat layer (9b') a reflective coating of low optical transmission is applied, magnetron sputtering might be used to apply the reflective coating. The reflective coating might be a reflective PVD coating. When applying such a reflective coating or reflective PVD coating, optionally a dielectric intermediate layer might be used between the reflective coating and the hard coat layer (9a').

In a next step, a recess (10') is generated to provide the wanted pattern/graphic. This recess (10') is generated by laser etching out of the second hard coat layer (9b') in selected areas. In case a reflective coating is used instead of the hard coat layer (9b') the recess (10') is generated by laser etching out of the reflective coating and, if used, the optional dielectric intermediate layer. As part of the process the laser also etches the first hard coat layer (9a') below the second hard coat layer (9b'), reflective coating and/or dielectric intermediate layer in the area of the recess. For example a laser marking system operating at a 1064 nm wavelength might be used for this etching process. For example by the laser a velocity of 500-1200 mm/s at a frequency 30-80 kHz of laser pulses might be used.

By the laser a texture is created that differs from those areas not processed by the laser. As a result of this process the ablated and laser etched areas now feature a texture on the surface.

In a further step a, preferably for visual light semitransparent, optical coating (11') is generated covering the hard coat layer (9b') or the reflective coating used instead of the hard coat layer (9b') and the etched hard coat layer (9a'), especially in the area of the recess (10'). This optical coating (11') might be applied after a cleaning of the surface and/or the optical coating (11') is generated by magnetron sputtering. The optical coating (11') can comprise several layers including metals, metalloids and dielectrics).

By applying the optical coating (11') the previously invisible texture produced by the laser etching become now highly visible as diffuse light reflection is creating a satin appearance.

In other words due to the etching of the hard coat layer (9a') in the area of the recess (10') light falling onto the hard coat layer (9a') in this area is diffused. This creates the satin effect in this area. Where the hard coat layer (9b') or the reflective coating used instead of the had coat layer (9b') is applied and not etched by the laser the, preferably opaque, hard coat layer (9b') or the reflective coating remains highly reflective.

An optional protective coating can be applied with or without a satin additive.

Thus it is possible to generate a pattern combining highly reflective and satin areas to provide the wanted visual feature. Examples of visual features in form of logos and patterns are shown in FIGS. 2b and 2c. The areas (10') provide a satin reflective effect whereas in the reaming areas (12') the highly reflective characteristics of the coating (11') remain.

A further advantage of the decorative coating shown in FIGS. 2a to 2c is that it allows a back lighting of the visual feature. As shown in FIG. 2a on the side of the radome (1') where an radio-/radar-transceiver (13') is located illumination sources (14') might be located. In case the radome (1') is illuminated by the light sources (14'), for example comprising respective LED arrays for a viewer (16') the following visual effect is achieved. In the area of the recess (10') the hard coat layer (9a') is illuminated by the scattering effect of the surface in this area. Due to the hard coat layer (11') in the areas (12') the light is however attenuated and these areas are not or less visible for a viewer (16') but remains reflective for light falling onto it from the side of the viewer (16'). Thus, various aesthetic effects can realised for product styling purposes by backlighting. In case the hard coat layer (9b') is opaque or the reflective coating is used instead of the had coat layer (9b') any light bleed outside the area of the recess (10') is avoided and no double imaging will occur from reflection of light in this area at different surfaces, especially the surface of the hard coat layers (9a') and (9b') or the reflective coating used instead of the had coat layer (9b').

By changing laser parameters like power, path, velocity and frequency different types of etching on the first hard coat layer (9a') in the area of the recess (10') can be reached. For example it is possible to change the extend of scattering and/or diffusion of light falling onto or through the area (10'). Thus, a variety of satin finishes can be realised.

In contrast to satin generation, methods know in the state of the art a robust method to provide a satin surface in combination with a reflective surface is provided.

Although explained with the help of the first alternative of the inventive radome, the use of the before described decorative coating comprising the hard coat layers (9a') and (9b') an also be applied to the second alternative of the inventive radome. In this case the layer (11') might be replaced by the overmolded layer and/or the second hard coat layer (9b') does not have to be highly reflective and/or opaque.

Further coatings to those discussed above may be applied to the first surface of the decorative coating (5) to modify the surface properties of the radome (1). For example, a cap layer may also be provided by materials having characteristics, including: hydrophobic, hydrophilic, lipophobic, lipophilic and oleophobic or combinations thereof.

Coating Residual Stress

The importance of residual stress, the use of interfacing layers in controlling residual stress, and determination of residual stress parameters are described in WO2011/075796 and U.S. Pat. No. 9,176,256 B2, each entitled "PLASTIC AUTOMOTIVE MIRRORS", and each of which is hereby incorporated by reference in its entirety for all purposes.

A highly stressed interface between layers of the decorative coating (5), and between the decorative coating (5) and the substrate (2), should ideally be avoided to prevent a high region of stress becoming a locus for failure. For example, a compressive layer pulls in one direction against a tensile layer pulling in the opposite direction, generating a high interfacial stress. It has been found that by controlling this interfacial stress (reducing it) the resilience of the decorative coating (5) can be improved.

The present inventors have thus found that it is preferred to control internal stress parameters of the decorative coating (5) such that the differential stress is minimised. The present inventors have also found that it is further preferred to control internal stress parameters of a decorative coating (5) such that the net residual stress is above −120 MPa. In some embodiments, the net residual stress is above −70 Mpa, or above −50 Mpa, or above −40 MPa. In some preferred embodiments, the net residual stress is neutral or is tensile (i.e. above 0 MPa). With particular regard to decorative coatings (5) including a decorative layer (6) of aluminium and germanium, the net residual stress will be above −120 MPa, or above −50 Mpa, or above −40 MPa. In embodiments of the decorative coatings (5) where the decorative layer (6) is chromium and germanium the net residual stress will preferable be above −70 Mpa, preferably up to +170 Mpa.

In terms of being able to control internal stress parameters, ideally the stress of the entire coating system will be controlled, in both magnitude and mode. The term "residual stress" is to be taken as meaning the combined stress of the multiple layers which form the decorative coating (5), which may, or may not, include the protective hard coat (9). In preferred embodiments the residual stress is measured or calculated with the protective hard coat (9).

To manufacture decorative radomes in a manner that permits control of the measured residual stress within the decorative coating (5), the inventors have determined that is helpful for the stress ranges of the individual layers to be known, so that when they are combined, they result in the desired measured residual stress.

Figure 12:
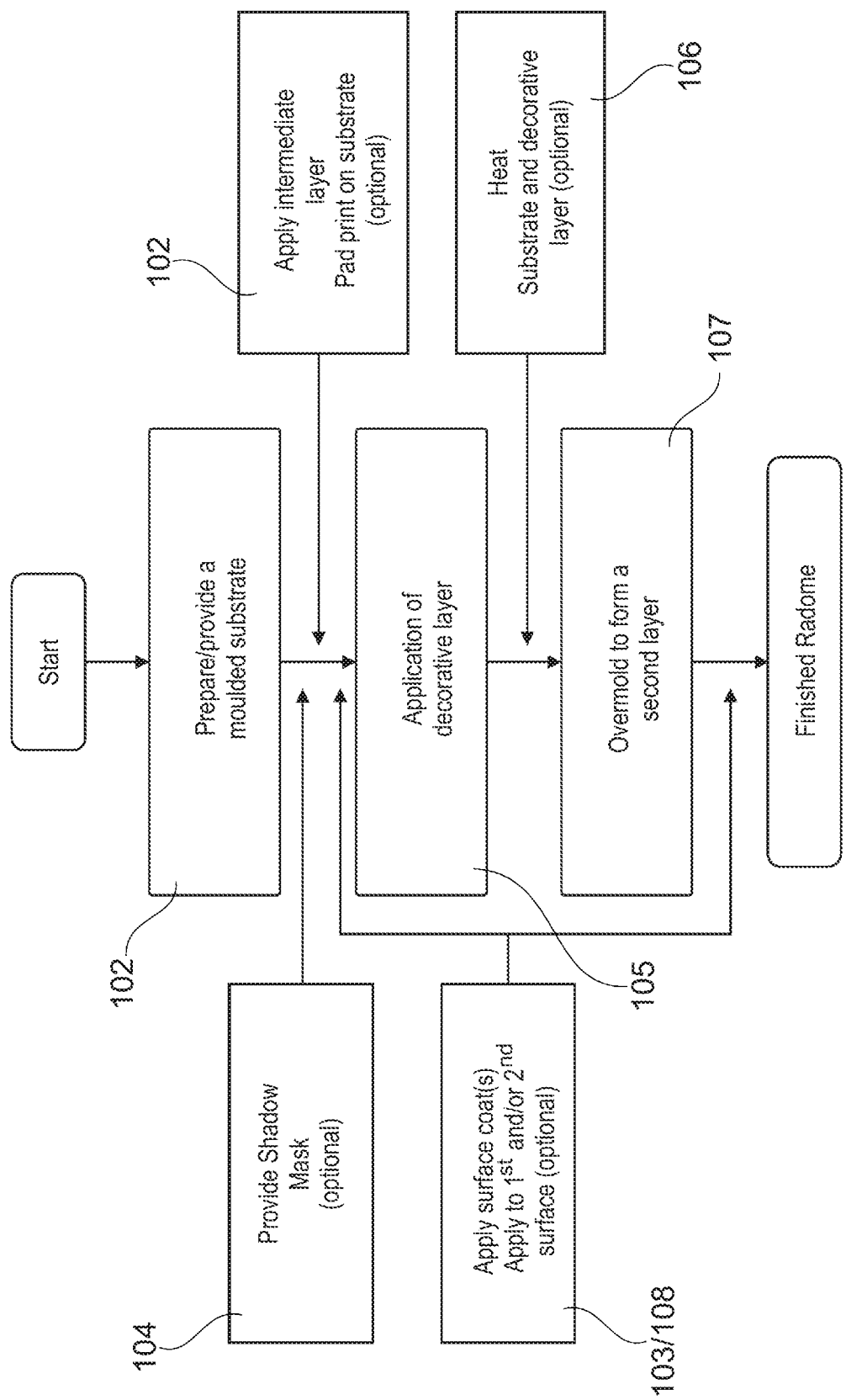
FIG. 12 is a flow diagram of an example of a method of manufacturing a radome, in accordance with the second alternative of the present disclosure.
Figure 13:
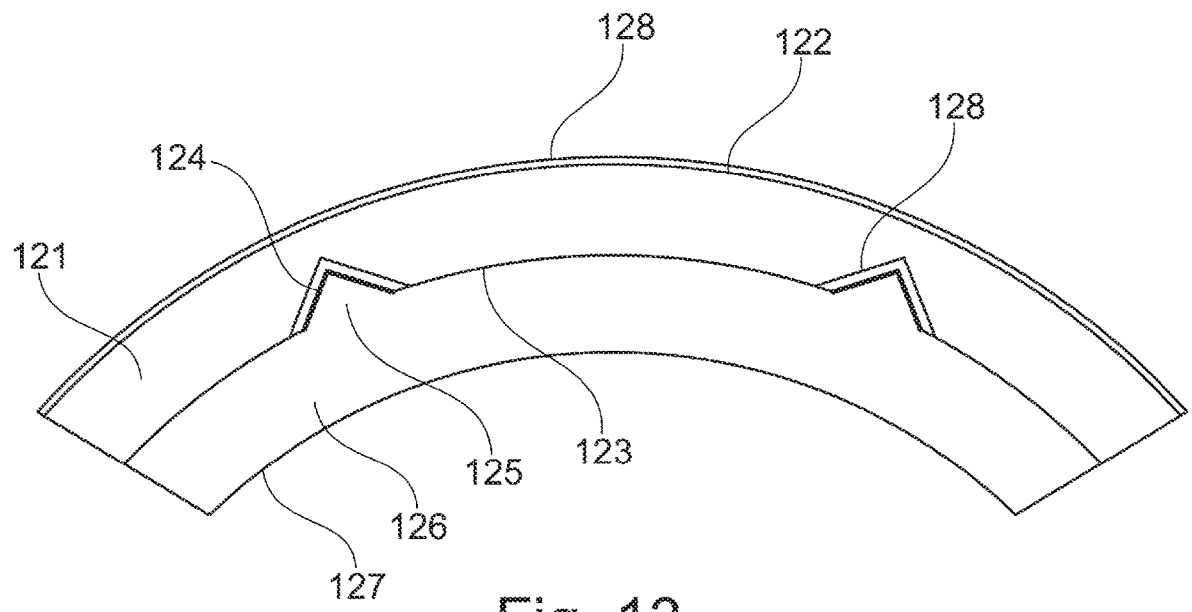
FIG. 13 is a cross-section of an example of a radome in accordance with the second alternative of the present disclosure.
Figure 14:
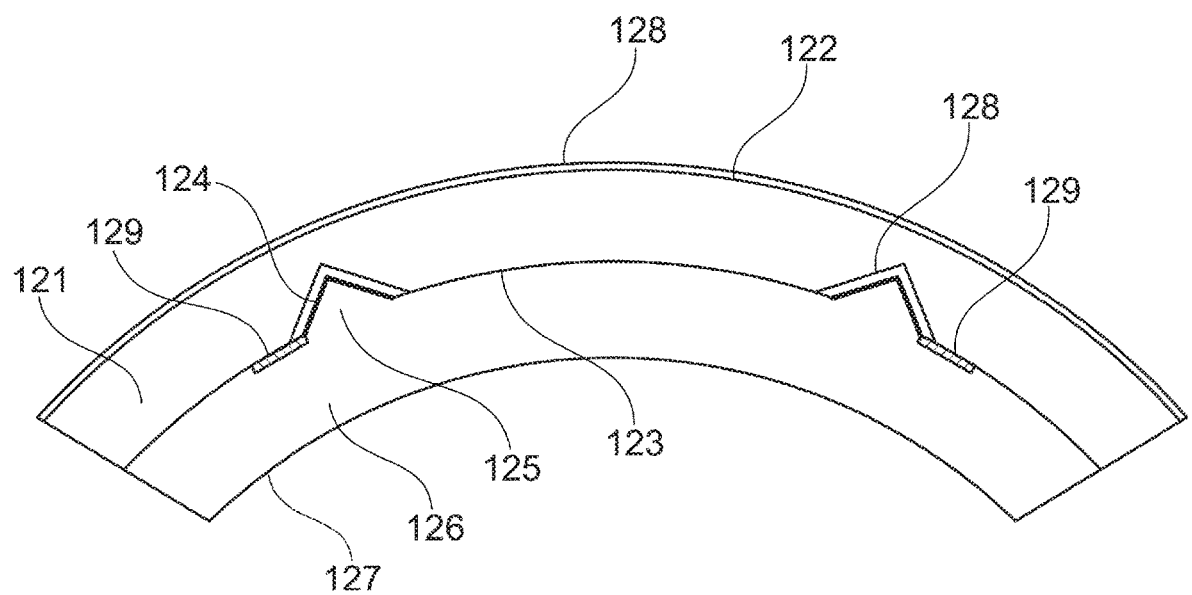
FIG. 14 is a cross-section of an example of a radome in accordance with the second alternative of the present disclosure including an intermediate layer.

The concept of a second surface decorative coating according to the second alternative of this disclosure is described with the help of FIGS. 12 to 14.

Specifically, the method of producing a decorative radome according to the second alternative is illustrated in FIG. 12 and includes the steps of (102) preparing or providing a (radio-transmissive) substrate. The radio transmissive substrate will have a first surface (122) and a second surface (123—see FIG. 13). The method further includes (105) applying a decorative layer and/or coating (124) to a portion of the second surface (123) of the substrate (121), preferably a portion including the relieved portion (125), wherein the decorative layer and/or coating (124) comprising a metal or an alloy comprising a metal and a metalloid. Subsequently, the methods further includes (107) overmolding at least the decorative layer and/or coating (124) with a radio-transmissive polymer to provide an overmolded layer (126).

The term "second surface" as used in the context of the following description relates to a surface upon which a decorative layer (124) may be applied and which may be overmolded. The term "first surface" is used in opposition to the second surface. In one form, the radio-transmissive substrate (121) is substantially transparent when formed and will provide the front most surface of the radome, when in use. In this context, the term "first surface" relates to the forward most surface of the substrate (121), when viewed. As such, and in the context of an automotive badge, the first surface (122) will be the in the following description the front surface of the radio-transmissive substrate (121) of the badge when viewed from the front of the automobile.

Although described for the second alternative of this disclosure the measures described in the following paragraphs regarding the provision of the substrate, the intermediate layer, the hard coat, the shadow masking, the decorative layer and/or coating and/or the Surface Coating(s) and regarding the heating can also be at least partly used for the radome according the first alternative of this disclosure.

1—Provide/Prepare Substrate

The radio-transmissive substrate (121) can be provided by any desired method. In some embodiments, the substrate (121) is injection moulded to form the desired shape. In some embodiments, the substrate (121) may be received already formed. Preferably, the substrate (121) includes a relieved portion (125) defining a three-dimensional visual feature on the second surface (123) of the substrate (121). The relieved portion (125) may be provided by a recess toward the first (122) surface of the substrate (121).

The substrate (121) and overmolded layer (126) can be formed of any suitable material, but is preferably a plastic. As would be understood in the art, radio-transmissive substrates are typically resistant to electrical conductivity (i.e. are insulating or are a dielectric). Suitable polymers for the substrate (121) or overmolded layer (126) include Acrylonitrile Ethylene Styrene (AES), Acrylonitrile butadiene styrene (ABS), polycarbonate (PC), high-flow AES, acrylonitrile-(ethylene-propylene-diene)-styrene (AEPDS), blends of thermoplastics, or PC-ABS blended thermoplastic. In some embodiments, the substrate (121) will be formed of Polycarbonate.

Importantly, one of either the substrate (121), or the overmolded layer (126), is substantially transparent. This allows viewing of the decorative layer and/or coating (124) through the transparent layer. Preferably, the other layer is substantially opaque to visible light. The opaque layer masks the equipment positioned behind the radome, and can modify, or improve, the visual aspects of the decorative layer and/or coating (124). For example improve the colour, or reflectivity, of the decorative layer and/or coating (124) by minimising light transfer through the decorative layer and/or coating (124). In use, for example when a radome in accordance with the disclosure (such as a radome produced by the method of the disclosure) is fitted as a badge on a car, the transparent layer forms the outermost (forward) layer. In a preferred embodiment, the radio-transmissive substrate (121) is transparent and the overmolded layer (126) is opaque.

2—Application of Intermediate Layer

In some embodiments, the method includes the step of providing an intermediate layer (129) to at least a portion of the second surface of the radio transmissive substrate (121). In some embodiments, the intermediate layer (129) is applied prior to the application of the decorative layer and/or coating (124) and can be applied prior to, or following on from, the deposition of a second surface coating (128) (in embodiments where one is applied).

The intermediate layer (129) can be used to influence the appearance of the decorative radome produced by the method of the disclosure. The intermediate layer (129) can be a coloured layer which applies visual colour to the decorative radome. The intermediate layer (129) may also be a masking layer (which may be removable prior to overmolding or may be clear and remain in the decorative radome once produced) that assists in preventing application of the decorative layer and/or coating (124) to unwanted portions of the radio-transmissive substrate (121). In such embodiments, the intermediate layer (129) is not substantially overlaid, or not overlaid, with the decorative layer and/or coating (124) when the radome is completed. Such masking can be utilised when shadow masking during the application of the decorative layer and/or coating (124) is difficult, or the appropriate details cannot be achieved by shadow masking. In some embodiments, the intermediate layer (129) could be an oil, liquid or ink mask, for example Fomblin™ Krytox™, SpeedMask™.

In preferred embodiments, the intermediate layer (129) is applied by printing. In some embodiments, the intermediate layer can withstand temperatures at or above 150° C., 175° C., 200° C., 220° C., 250° C., 275° C. or 300° C. for a minimum of 5, 10, 20, 30, 40 or 50 seconds, or 1, 1.5 or 2 minutes.

The intermediate layer (129) may be any suitable layer, and in a preferred embodiment the intermediate layer (129) is an ink, dye, oil, wax, lubricant or other suitable liquid or coloured film. In some embodiments, the intermediate layer is an ink. The ink can be deposited by any suitable method. In some embodiments, the intermediate layer (129) is printed. Printing methods may include dye diffusion thermal transfer, wax thermal transfer, indirect dye diffusion thermal transfer, screen printing, inkjet printing or gravure printing process such as pad printing. In some embodiments, the intermediate layer (129) is applied by pad printing.

Suitable methods are known in the art for printing on radio-transmissive substrates (121). For example, a thermostable ink such as Norilit™ U made by Procell, Inc. can be pad printed onto a three dimensional substrate, such as the radio transmissive substrate (121), and can tolerate temperatures up to 220° C. for more than two minutes. Other suitable inks and printing methods are known in the art, and can be used with this disclosure.

3—Apply Second Surface Coating (Optional)

In some embodiments, the method includes the further step of providing at least a portion of the second surface (123) of the radio-transmissive substrate (121) with a hard-coat (128). In such embodiments, the application of a hard-coat to at least a portion of the second surface (123) of the radio-transmissive substrate (121) may provide advantageous functions, including (but not limited to): increasing or influencing the bonding between the decorative layer and/or coating (124) and/or intermediate layer (129) with the radio transmissive substrate (121); controlling the residual stress and/or thermal expansion of the decorative layer and/or coating (124); tuning the colour, reflectivity or other visual appearance of the decorative layer and/or coating (124) and/or intermediate layer (129); and/or providing an interface between portions of the radio-transmissive substrate (121) and the overmolded second layer (126) thereby influencing the adhesion bond between the two (without been an adhesive layer).

Suitable hard-coat layers (128) are described below under heading 7 "Applying Surface Coating(s)".

4—Providing Shadow-Masking

Methods for applying decorative layers and/or coatings (124), such as physical vapour deposition (PVD), typically require masking to ensure that deposition of the material forming the decorative layer and/or coating (124) is selectively applied to the radio-transmissive substrate (121). As such, the method of the present disclosure may include the step of (104) providing a shadow mask. The shadow mask facilitates selective application of decorative layer and/or coating (124) on the radio-transmissive substrate (121). The type of shadow mask used will depend on the technique used to apply the decorative layer (124). In some embodiments, the shadow mask is compatible with PVD, in particular sputtering and evaporation. In some embodiments, the shadow mask is stainless steel.

The shadow mask can be attached to each radio-transmissive substrate (121) prior to application of the decorative layer and/or coating (124) or can be positioned within the deposition machine, such as on the target side of a PVD machine.

5—Application of Decorative Layer and/or Coating

The decorative layer and/or coating (124) is applied only to a portion of the second surface (123) of the substrate (121) to provide a visual feature on the radio-transmissive substrate (121). In some embodiments, having a relieved portion (125) in the radio-transmissive substrate (121), the decorative layer and/or coating (124) is applied to the relieved portion (125).

By applying the decorative layer and/or coating (124) to only a portion of the substrate (121), this allows direct adhesion bonding between the first (radio-transmissive substrate) layer (121) and the (second) overmolded layer (126) in portions not provided with the decorative layer and/or coating (124). In the absence of this direct adhesion binding between the substrate (121) and the overmolded layer (126), the layers may separate.

The decorative layer and/or coating (124) is preferably a reflective layer, and includes any suitable metal, metalloid or metal/metalloid alloy that provides the desired reflectivity, or decorative appearance while being radio-transmissive. In some embodiments, the metal, which forms the decorative layer and/or coating (124), includes transition metals. In some embodiments, the metal which forms the decorative layer and/or coating (124) is Indium or Tin.

In some embodiments, a reflective layer is abutted by additional layers. In one embodiment, the reflective layer is between two layers of deposited Silicon. These multilayer stacks allow for tuning of the layer, including its colour and residual stress. In some embodiments, multiple layers, including a layer of Silicon followed by a layer of Aluminium/Silicon and then a further layer of Silicon, are deposited to the substrate (121) to form the decorative layer and/or coating (124) prior to overmolding.

The importance of residual stress, the use of interfacing layers in controlling residual stress, and determination of residual stress parameters are described in WO2011/075796 and U.S. Pat. No. 9,176,256 B2, each entitled "PLASTIC AUTOMOTIVE MIRRORS", and each of which is hereby incorporated by reference in its entirety for all purposes.

In some preferred embodiments, the decorative layer and/or coating (124) includes a metalloid. Metalloids include Silicon, Boron, Germanium, Arsenic, Antimony and/or Tellurium. In specifically preferred embodiments, the metalloid is Silicon or Germanium. In a most preferred embodiment, the metalloid is Germanium. Suitable metalloid/metal alloys include: Germanium and Aluminium and, optionally, Silicon; or Germanium and Silicon; or Germanium and Silver and, optionally, Silicon; or Germanium and Indium and, optionally, Silicon; or Aluminium and Silicon. In some embodiments, the alloy of Germanium is Germanium and Aluminium, or Germanium and Silicon, or Germanium and Aluminium and Silicon. In some embodiments, the alloy is Silicon and Aluminium.

When the metalloid/metal alloy includes Germanium, the alloy is at least 25 wt % germanium, or at least 40 wt % germanium, or at least 45 wt % germanium, or at least 50 wt % germanium, or at least 55 wt % germanium.

The decorative layer and/or coating (124) is provided as a thin-coating layer. In some embodiments, the average thickness of the decorative layer (124) is 20-190 nm thick, or 40 to 170 nm thick, or 60 to 150 nm thick. Such thin-coatings can be provided by multiple methods in the art. However, preferably, the decorative layer (124) is deposited by Physical Vapour Deposition (PVD). Suitable PVD methods include magnetron sputtering and evaporation, which may be resistive thermal evaporation or electron-beam evaporation. In some embodiments, the decorative layer (124) is deposited by magnetron sputtering.

Ideally, the moulding of the radio-transmissive substrate (121) (in embodiments whereby the radio-transmissive substrate is moulded), the application of any intermediate layers (129), and the application of the decorative layer and/or coating (124) are performed in the same machine. Alternatively, each step can be performed by separate machines arranged to operate sequentially.

6—Heating Substrate and Decorative Layer and/or Coating

Prior to providing a second-shot overmolded layer (126), it may be advantageous to heat the substrate (121) and the decorative layer and/or coating (124). Such heating (106) permits a degree of thermal expansion at a rate slower than that which will be encountered during the overmolding process (107) and as such will limit the rate of change in temperature of the decorative layer (124), and the substrate (121), during overmolding. This reduces visual defects, such as crazing, during the overmolding step (107). Therefore, in some embodiments of the method of this disclosure, the substrate (121) and the decorative layer and/or coating (124) are heated prior to overmolding. In some embodiments, the substrate (121) and the decorative layer (124) are heated to at least 70° C., or to at least 80° C. prior to the overmolding step (107).

7—Overmolded Layer

The overmolded layer (126), once set, provides a third (rear) surface (127) which is parallel or substantially parallel, to the first surface (122) of the radio-transmissive substrate (121), over at least a portion of the radome. The parallel or substantially parallel portion defining a radio path through which radio waves can traverse. Importantly, the parallel or substantially parallel nature of the first and third surface minimise difference in the refraction of the radio waves as they traverse different portions of the radio path of the radome.

Different thermoplastics/thermo-polymers have different flow temperatures and therefore require different barrel nozzles for injection moulding. Typically, higher temperatures will increase the likelihood of damage and visible defects in the decorative layer and/or coating (124) when overmolded. Therefore, it is preferable to use thermoplastics/thermo-polymers with a relatively low nozzle temperature, or a nozzle temperature below the crazing point of the decorative layer and/or coating (124).

The melt temperature and mould temperature for a range of common thermoplastics is provided in Table 1 below.

TABLE 1

Thermoplatics melt temperatures and desired mould temperatures.

| | MELT TEMPERATURE RANGE (° C.) | MOULD TEMPERATURE RANGE (° C.) |
|---|---|---|
| ABS | 190-270 | 40-80 |
| ABS/PC ALLOY | 245-265 | 40-80 |
| ACETAL | 180-210 | 50-120 |
| AES | 215-260 | 55-65 |
| PMMA | 220-250 | 50-80 |
| CAB | 170-240 | 40-50 |
| HDPE | 210-270 | 20-60 |
| LDPE | 180-240 | 20-60 |
| NYLON 6 | 230-290 | 40-90 |
| NYLON 6 (260% GF) | 250-290 | 50-90 |
| NYLON 6/6 | 270-300 | 40-90 |
| NYLON 6/6 (263% GF) | 280-300 | 40-90 |
| NYLON 11 | 220-250 | 40-110 |
| NYLON 12 | 190-200 | 40-110 |
| PEEK | 350-390 | 120-160 |
| POLYCARBONATE | 280-320 | 85-120 |
| POLYESTER PBT | 240-275 | 60-90 |
| PET (SEMI CRYSTALLINE) | 260-280 | 20-30 |
| PET (AMORPHOUS) | 260-280 | 20-30 |
| POLYPROPYLENE (COPOLYMER) | 200-280 | 30-80 |
| POLYPROPYLENE (HOMOPOLYMER) | 200-280 | 30-80 |
| POLYPROPYLENE (260% TALC FILLED) | 240-290 | 30-50 |
| POLYPROPYLENE (260% GF) | 250-290 | 40-80 |
| POLYSTYRENE | 170-280 | 30-60 |
| POLYSTYRENE (260% GF) | 250-290 | 40-80 |
| PVC P | 170-190 | 20-40 |
| PVC U | 160-210 | 20-60 |
| SAN | 200-260 | 50-85 |
| SAN (260% GF) | 250-270 | 50-70 |
| TPE | 260-320 | 40-70 |

Further specifications for thermoplastic materials are provided by the International Organisation for Standardization, and are particularly set forth in the Standards Catalogue 83.080.20.

In some embodiments, the overmolded layer (126) is formed with a barrel nozzle temperature at or below 300° C. In some embodiments, the barrel nozzle is at or below 280° C. during the overmolding process (107). In some embodiments, the barrel nozzle is at or below 250° C. during the overmolding process (107). In some embodiments, the barrel nozzle is at or below 230° C. during the overmolding process (107). Suitable polymers, which are capable of being injection moulded at these barrel nozzle temperatures are known in the art and are determined by their melt temperature.

8—Applying Surface Coating(s)

Further, some embodiments of the method of the disclosure include providing the first surface (122) of the radio-transmissive substrate (121) with a hard-coat (128). The inherent function of a radome is to provide protection to radar equipment from the environment. As such, the radome is susceptible to degradation, wear and damage. This exposure is further amplified when the radome is positioned at the front of a vehicle that is routinely exposed to relatively high speeds, abrasives, projectiles as well as chemicals used for cleaning. In this respect, a coating (128) that is said to be a "hard-coating" is a coating that is harder than the radio-transmissive substrate (121), whereby it increases the abrasion resistance of that radio-transmissive substrate (121).

Such an abrasion resistant hard-coating (128) is one that reduces damage due to impacts and scratching. Abrasion resistance can be measured through standard tests such as ASTM F735 "Standard Test Method for Abrasion Resistance of Transparent Plastics and Coatings Using the Oscillating Sand Method", ASTM D4060 "Standard Test Method for Abrasion Resistance of Organic Coatings", by the Taber Abrader, or by using the well-known Steelwool Test.

Furthermore, some plastics can be damaged by certain solvents; for example, polycarbonate is damaged by acetone. It is a requirement for many exterior automotive components, such as radomes, that they be "chemically resistant", which is a reference to an ability to withstand exposure to normal solvents such as diesel fuel, petroleum, battery acid, brake fluid, antifreeze, acetone, alcohol, automatic transmission fluid, hydraulic oil and ammonia based window cleaners. In this respect, it will be appreciated that a hard-coating ideally provides at least the first surface of the radome with such chemical resistance.

A hard-coating (128) on the first (122) and/or second (123) surface of the radio-transmissive substrate is preferably formed from one or more abrasion resistant layers, and may include a primer layer that bonds well to the substrate (121) and forms a preferable surface for subsequent abrasion resistant layers. The primer layer may be provided by any suitable material and may for example be an organic resin such as an acrylic polymer, a copolymer of acrylic monomer and methacryloxysilane, or a copolymer of a methacrylic monomer and an acrylic monomer having a benzotriazole group or benzophenone group. These organic resins may be used alone or in combinations of two or more.

The hard-coat layer(s) (128) are preferably formed from one or more materials selected from the group consisting of an organo-silicon, an acrylic, a urethane, a melamine or an amorphous $SiO_xC_yH_z$.

Commercially available hard-coatings include Momentive PHC-587B, momentive UVHC 5000 (which is UV cured) and the two part product comprising a primer of PR6600 (SDC Technologies), subsequently coated with MP101 (SDC Technologies).

Most preferably, the hard-coat layer(s) (128) is/are an organo-silicon layer, due to its superior abrasion resistance and compatibility with physical vapour deposited films. For example, a hard-coating layer comprising an organo-silicon polymer can be formed of a compound selected from the following compounds: trialkoxysilanes or triacyloxysilanes such as, methyltrimethoxysilane, methyltriethoxysilane, methyltrimethoxyethoxysilane, methyltriacetoxysilane, methyltripropoxysilane, methyltributoxysilane, ethyltrimethoxysilane, ethyltriethoxysilane, vinyltrimethoxysilane, vinyltriethoxysilane, vinyltriacetoxysilane, vinyltrimethoxyethoxysilane, phenyltrimethoxysilane, phenyltriethoxysilane, phenyltriacetoxysilane, gamma-chloropropyltrimethoxysilane, gamma-chloropropyltriethoxysilane, gamma-chloropropyltripropoxysilane, 3,3,3-trifluoropropyltrimethoxysilane gamma-glycidoxypropyltrimethoxysilane, gamma-glycidoxypropyltriethoxysilane, gamma-(beta-glycidoxyethoxy)propyltrimethoxysilane, beta-(26,4-epoxycyclohexyl)ethyltrimethoxysilane, beta-(26,4-epoxycyclohexyl)ethyltriethoxysilane, gamma-methacryloxypropyltrimethyoxysilane, gamma-aminopropyltrimethoxysilane, gamma-aminopropyltriethoxysilane, gamma-meraptopropyltrimethoxysilane, gamma-mercaptopropyltriethoxysilane, N-beta(aminoethyl)-gamma-aminopropyltrimethoxysilane, beta-cyanoethyltriethoxysilane and the like; as well as dialkoxysilanes or diacyloxysilanes such as dimethyldimethoxysilane, phenylmethyldimethoxysilane, dimethyldiethoxysilane, phenylmethyldiethoxysilane, gamma-glycidoxypropylmethyldimethoxysilane, gamma-glycidoxypropylmethyldiethoxysilane, gamma-glycidoxypropylphenyldimethoxysilane, gamma-glycidoxypropylphenyldiethoxysilane, gamma-chloropropylmethyldimethoxysilane, gamma-chloropropylmethyldiethoxysilane, dimethyldiacetoxysilane, gamma-methacryloxypropylmethyldimethoxysilane, gamma-metacryloxypropylmethyldiethoxysilane, gamma-mercaptopropylmethyldimethoxysilane, gamma-mercaptopropylmethyldiethoxysilane, gamma-aminopropylmethyldimethoxysilane, gamma-aminopropylmethyldiethoxysilane, methylvinyldimethoxysilane, methylvinyldiethoxysilane and the like.

The hard-coat layer(s) (128) may be coated onto a substrate (such as the radio-transmissive substrate (121)) by dip coating in liquid followed by solvent evaporation, or by plasma enhanced chemical vapour deposition (PECVD) via a suitable monomer, flow coating or spray coating. To improve the abrasion resistance of the hard-coating (128), subsequent coatings of the hard-coating may be added, preferably within a 48 hour period to as to avoid aging and contamination of the earlier coatings. These additional coatings may be added to either the first (122) or second (123) surface of the substrate (121)

The thickness of the hard-coat layer (128) is preferably selected to assist in providing adequate abrasion resistance. The appropriate abrasion resistance will be determined by the required application and the demands of the user. In some applications, adequate abrasion resistance may be regarded as being a Bayer abrasion ratio of 5 with respect to an uncoated plastic substrate (121—such as a polycarbonate), or alternatively by a Taber abrasion test with delta haze less than 15% after testing with a 500 g load and CS10F wheel at 500 cycles, (% haze being measured as per ASTM D1003). With these requirements met, when an organo-silicon is used as a hard-coat layer (128), the thickness of the hard-coating (128) is preferably at minimum of at least 6 μm thick on average and/or has a maximum thickness of 28 μm thick.

Further coatings to those discussed above may be applied to the first surface of the radio-transmissive substrate, in addition to those discussed above, to modify the surface properties of the substrate. For example, a cap layer may also be provided by materials having characteristics, including: hydrophobic, hydrophilic, lipophobic, lipophilic and oleophobic or combinations thereof.

Decorative Radome

The disclosure thus provides in the second alternative a decorative radome comprising; a first layer (121) comprising a radio-transmissive polymer, the first layer (121) having a front surface (122); a second layer (126) comprising a radio-transmissive polymer, the second layer (126) having a rear surface (127); and a decorative layer and/or coating (124) between the first (121) and second (126) layer comprising a metal or an alloy comprising a metal and a metalloid, wherein the second layer (126) directly abuts the decorative layer (124) and the first layer (121) is directly adhesion bound to the second layer (126), and wherein at least one of the first (121) or second (126) layers is comprised of a polymer (thermo-polymer) capable of being overmolded at a barrel nozzle temperature below 300 degrees Celsius.

Further, the decorative radome of the disclosure can include a hard-coat (128) provided to the first surface (122) of the radome.

It is to be understood that the term "directly adhesion bound" is a reference to the physico-chemical phenomenon resulting from molecular attraction exerted between the first layer (121) in contact with the second layer (126), and is expressly considered to exclude bonds formed solely by adhesives.

To increase the connection between the respective elements of the radome further measures can be taken. According to this disclosure especially respective surface structures maybe provided to reach, especially in addition to the adhesion, adhesive and/or chemical bound a form fit connection. Although such surface structures are explained with regard to the second alternative of this disclosure with the help of FIG. 15, it is understood by the person skilled in the art that also in the first alternative of this disclosure such surface structures may be used and implemented to reach a form fit connection.

Figure 15:
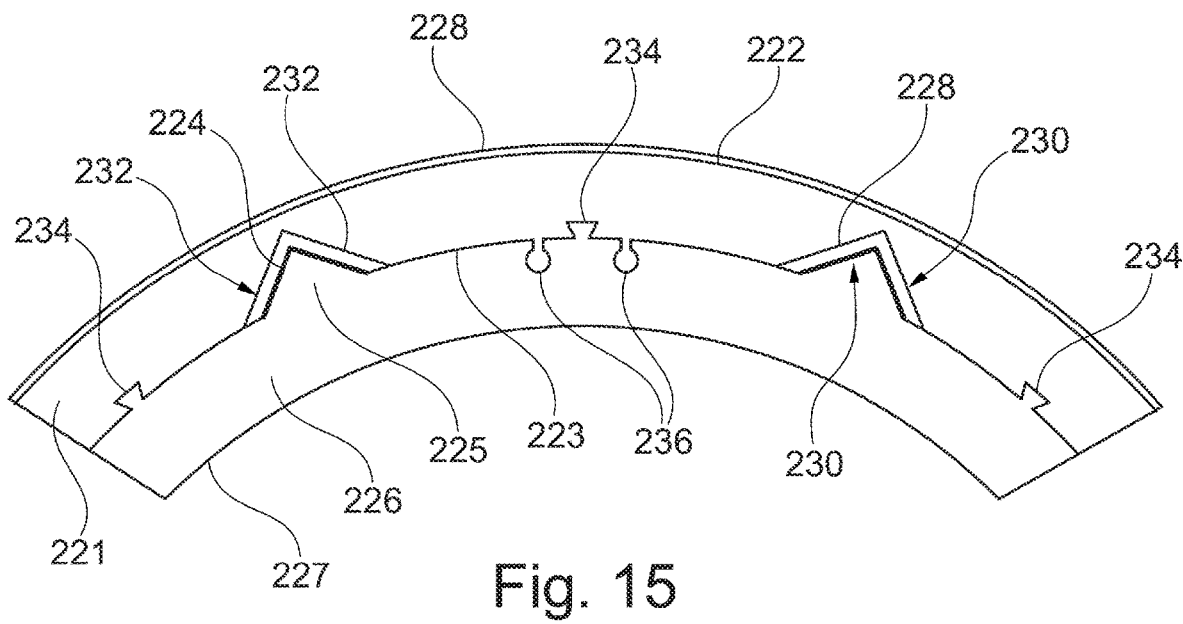
FIG. 15 is a cross-section of an example of a radome in accordance with the second alternative of the present disclosure showing first and second surface structures to reach a form fit connection.

The elements of the radome shown in FIG. 15 that correspond to the elements of the radome shown in FIG. 13 have the same reference numbers, however increased by 100.

As shown in FIG. 15, the radome, more precisely the substrate (221) comprises in the area of the decorative coating (224) a first surface structure formed by elements (230, 232). The elements (230) are formed as fungiform protrusions. When the decorative coating (224) is applied to the substrate (221) the coating (224) encloses the protrusions (230) to reach a form fit connection. The elements (232) are formed as undercuts. When the decorative coating (224) is applied to the substrate (221) parts of the decorative coating (224) reach into the undercuts (232) so that the decorative coating (224) is also form fit connected to the substrate (221).

To reach an enhanced connection between the substrate (221) and the overmolded layer (226), the substrate (221) furthermore comprises a second surface structure comprising elements (234, 236). The elements (234) are formed as groove-shaped undercuts. When in the second molding step the overmold layer (226) is formed, the overmold material also flows into the undercuts (234) thus providing a form fit connection between the substrate (221) and the overmold layer (226). To increase the connection between the substrate (221) and the overmold layer (226) in addition fungiform projections (236) are formed in the substrate (221). When the layer (226) is molded the overmold material encloses the projections (236) to provide a from fit connection between the substrate (221) and the overmold layer (226).

In not shown embodiments the surface structure might be provided by at least one separately formed anchor element. In other words the surface structure does not have to necessarily be formed in one piece with the substrate and/or the decorative coating. Also the surface structure, especially the anchor element might be formed rom a material different to the material of the substrate and/or the decorative coating. The anchor element might be for example located in a mould before the substrate and/or the decorative coating is formed. In this way the anchor element is at least partly embedded and/or overmolded.

The decorative radome of this disclosure does not substantially attenuate electromagnetic frequencies of 10 MHz to 3000 GHz. Specifically, in some embodiments, the radome has a radar attenuation less than 2 dB one-way (4 dB two-way) across a signal path, or preferably 1 dB one-way (2 dB two-way) across a signal path. Further, the decorative layer (124) comprising a metal or an alloy of metal and a metalloid, has a sheet resistivity greater than $10^6$ ohms per square (Q/Q).

Advantageously, the direct adhesion bond formed between the first layer (121) and the second layer (126) improves the weather resistance of the radome compared to radomes formed of layers bound by adhesives. Therefore, in some embodiments there is no water ingress between the first layer (121) and the second layer (24) when immersed in water at 60° C. for 240 hrs.

The decorative radome according to the second alternative can be produced in accordance with the method disclosed above. Alternatively, the decorative radome can be produced by any suitable method that provides all of the required claimed features and functions. Importantly, the decorative radome of this disclosure should be considered to optionally include, the structural and functional features disclosed above in relation to the method.

The decorative radome of the present disclosure, or produced with the method of the present disclosure, can be used in any suitable context. In an embodiment the radome is a car badge. In some forms, the car badge may include additional features, functions and aesthetics. In some embodiments, the radome can be used in combination with a light assembly, or may include additional features, as that described in WO2017/009260 and US patent application publication number 2018/0202626 A1, each entitled "A LIGHT ASSEMBLY AND A VEHICLE DESIGN ELEMENT INCLUDING SUCH A LIGHT ASSEMBLY", and each of which is hereby incorporated by reference in its entirety for all purposes.

The term "reflective" refers to reflection of visible light, typically in the nanometre wave length and frequency range of 400 to 800 THz. The percentage of reflectance can be measured using known techniques in the field, or as discussed below.

A reference to radio wave throughout the specification, typically refers to frequencies of 10 MHz to 3000 GHz. In preferred embodiments, and in relation to automotive vehicles, the frequency is typically 1000 MHz to 100 GHz. In some specific embodiments in relation to radomes for vehicles, the frequency is 24 GHz to 79 GHz, or 77 GHz to 79 GHz, 24 GHz, 77 GHz or 79 GHz.

The term "transparent" and "opaque" when used without a qualifier (such as "radio-wave" or "radar") refers to visually transparent or opaque, and hence is a reference to transmission or absorption of visible light as defined above.

Radome Technical Characteristics

To minimise refraction of the radar signal, as it passes through the radome, the front and rear face should be parallel or substantially parallel. Further, the interior of the radome should have no voids, air bubbles or significant changes in material density such as water ingress, and the decorative layer should be of a uniform thickness.

The surface resistivity of the decorative layer can be determined using a four-point method, using a four-point probes in accordance with JIS K7194. Surface resistivity should be above $10^6 \Omega/\square$ (Ohms per square) indicating low electrical conductivity (i.e. the reflective layer is electrically insulated in situ).

Radio wave attenuation and reflectance will be determined by the requirements of the user, the application, the frequency used and the equipment being used. However, preferably there will be a minimum of 10 dB reflection and a maximum of 1 dB one-way (2 dB two-way) transmission loss at the sensor operating frequency, typically 24 GHz, 77 GHz or 79 GHz.

Radome Attenuation and Technical Characteristics

The decorative radome of this disclosure does not substantially attenuate electromagnetic frequencies of 10 MHz to 3000 GHz. Specifically, in some embodiments, the radome has a radar attenuation less than 2 dB one-way (4 dB two-way) across a signal path, or preferably 1 dB one-way (2 dB two-way) across a signal path. Further, the decorative layer (6) comprising a metal or an alloy of metal and a metalloid, has a sheet resistivity greater than $10^6$ ohms per square (Q/Q) in situ. The surface resistivity of the decorative layer (6) can be determined using a four-point method, using a four-point probes in accordance with JIS K7194.

To minimise refraction of the radar signal, as it passes through the radome (1) according to the first alternative and/or the radome according to the second alternative, the front and rear face should be parallel or substantially parallel. Further, the interior of the radome (1) should have no voids, air bubbles or significant changes in material density such as water ingress, and the decorative layer and/or coating (5, 124) should be of a uniform thickness.

Radio wave attenuation and reflectance will be determined by the requirements of the user, the application, the frequency used, and the equipment being used. However, in some embodiments there will be a maximum of 2 dB one-way (4 dB two-way) attenuation at a specific operating frequency between 76 and 81 GHz. In some embodiments, there will be less than 2 dB one-way attenuation at 24 GHz, 77 GHz or 79 GHz. In some embodiments, there will be a maximum of 1 dB one-way (4 dB two-way) attenuation at a specific operating frequency between 76 and 81 GHz. In some embodiments, there will be less than 1 dB one-way attenuation at 24 GHz, 77 GHz or 79 GHz.

Radar Systems

In some embodiments, the present disclosure provides a radar system as illustrated in FIG. 7 including a radio wave transmitter (10), a radio wave receiver (10) and a decorative radome (1) as describe herein.

The radome (1) can sit in the radio wave path of both the radio wave receiver and transmitter (which may be integrated into one device) or there may be a radome associated with the transmitter and another radome associated with the receiver.

The substrate attenuates the radio wave signal as it traverses the radome (1). A portion of this attenuation is a product of the reflection of the radio wave signal from the first surface (3) or second surface of the substrate (2, 121) as the radio waves emanating from the transmitter traverse the radome. Consequently, the attenuation, as a result of reflection, is determined by the thickness of the substrate (2, 121) (and coating) as well as the possible overmold layer in relation to the wave length of the radio wave signal. The wave length of the radio wave through the substrate varies with the dielectric real permittivity of the substrate and/or the overmold layer. Therefore, the substrate thickness providing minimum attenuation is determined by the equation $$m\frac{\lambda i}{2},$$

where m is an integer and λi is the wavelength through the substrate and/or overmolded layer of the radio wave transmitted from a radio wave transmitter for which the radome is designed. Consequently, in some embodiments the thickness of the radome substrate and/or overmold layer is a multiple of $$\frac{\lambda i}{2}.$$

Radar systems in vehicles typically use microwaves to provide line-of-sight detection of objects. The three frequencies currently being used for automobiles are 24 GHz, 77 GHz and 79 GHz. Recently, 77 GHz and 79 GHz have become the dominant frequency used as these frequencies offer improved range and resolution compared to the 24 GHz frequency. Specifically, 77 GHz can differentiate objects at a 3 times higher resolution than 24 GHz while using an antenna size three times less in height and width (with only ninth of the area).

Radar systems using the 24 GHz could utilise both a narrow band (NB) spanning 200 MHz from 24.05 GHz to 24.25 GHz and an ultra-wide band (UWB) spanning 5 GHz, from 21.65 GHz to 26.65 GHz.

Due to spectrum regulations and standards developed by the European Telecommunications Standards Institute (ETSI) and US Federal Communications Commission (FCC), the use of the UWB band will be phased out by the year 2022 (the "sunset date") in both Europe and the U.S.

The 24 GHz NB and UWB have been replaced with frequencies from 71 to 81 GHz, with the 76 to 77 GHz range representing long range radar (LRR) and the 77 to 81 GHz representing short range radar (SRR). The 77 to 81 GHz range provides up to 4 GHz of sweep bandwidth, which is much larger than the 200 MHz available in the 24 GHz NB.

In some embodiments, the radome is designed for use in, or is used in, a radar system wherein the radio wave transmitter (10) transmits radio waves in the frequency between 20 GHz and 81 GHz. In some embodiments, the radome is designed for use in, or is used in, a radar system wherein the radio wave transmitter transmits radio waves in the frequency between 76 and 81 GHz, or from 76 to 77 GHz, or is about 77 GHz, or is about 79 GHz.

To minimise attenuation, in some embodiments of the decorative radome, the substrate is between 2 mm and 2.6 mm thick. In some embodiments, the substrate is about 1.15 mm, 2.3 mm or 2.45 mm thick.

Heated Radome

Radio waves are typically attenuated by water and are particularly attenuated by ice. Therefore, it is desirable to prevent ice formation on the surface of the radome. Consequently, as illustrated in FIG. 6 the decorative radome (1) according to the first alternative of the present disclosure includes a layer including a heating element (11). Such a heating layer may also be provided in the radome according to the second alternative of the present disclosure. The heating layer might be an additional layer, especially an additional and/or alternative intermediate layer might be at least partly be formed by the overmold layer or might at least partly be formed by the substrate.

Suitable heating elements compatible for use with radomes are disclosed in DE102014002438A1, DE10156699A1, US20180269569A1 which are hereby incorporated by way of this reference in their entirety and for all purposes.

In preferred embodiments, the heating element (11) comprises a radar-transparent polymer with an embedded resistance wire circuit (12), which may be embedded or molded within the heating element substrate (11) to form a network, which substantially covers the radome.

The heating element (11) can be provided by a polymer film, containing the circuit (12) which can be provided between the radio-transmissive substrate (2) and the decorative coating (5). The heating element might also be formed at least partly by the overmold layer. As such the polymer film (11) will also need to be radio-transmissive. Consequently, the polymer film (11) can be made of any suitable polymer disclosed herein for the radio-transmissive substrate (2). Therefore, the polymer film (11) may be made of a polymer selected from the group including (but are not limited to): Acrylonitrile Ethylene Styrene (AES), Acrylonitrile butadiene styrene (ABS), acrylonitrile styrene acrylate (ASA), Polyamide (PA), polybutylene terephthalate (PBT), Polycarbonate (PC), Polyethylene (PE), Polyethylene Teraphthalate (PET), Poly(methyl methacrylate) (PMMA), Polyoxymethylene (POM), Polypropylene (PP), Polyurethane (PU), PolyVinyl-Chloride (PVC), high-flow AES, acrylonitrile-(ethylene-propylene-diene)-styrene (AEPDS), blends of thermoplastics, or PC-ABS blended thermoplastic. In some embodiments, the polymer film (11) containing the circuit (12) will be formed of Polycarbonate or Polypropylene.

Alternatively, the circuit can be embedded in, or moulded into, the radio-transmissive substrate (2) of the radome (1), such that the circuit (12) is provided within the radio-transmissive substrate (2) without the requirement for an additional layer.

Illuminated Radome

Car emblems are traditionally employed to convey styling and branding on vehicles. The radomes according to the disclosure allow to incorporate such car emblems, for example a logo as visual feature. To enhance brand differentiation there is furthermore a desire to enhance such visual features, especially emblems, with illumination. This illumination could be the logo itself, a ring around the emblem or the entirety of a car badge.

However it is difficult to combine illumination and radar functionality into a badge/emblem. As already discussed before a radome has preferably a uniform cross section of optimal thickness tuned according to the dielectric properties of the materials. It is also desirable to have minimal interfaces between dissimilar materials to not negatively influence the radio-transmissibility.

To the contrary the illumination of the badge usually make the use of additional parts for transmitting, diffusing, reflecting and piping light necessary, leading without further measures like increasing the entire thickness of the radome to a decrease of the radio-transmissibility due to the before described effects. Thus, the implementation of an illumination is often contrary to the interest of an optimal radio/radar performance.

The inventive radomes allow however to provide an illumination avoiding the before described problems. This object is achieved by using the existing structure and elements at least partly as illumination system. Especially a respective layer or coating is used as a light guide into which light of a light source is coupled in. the light is guided by the layer or coating and falls onto the visual feature from where it is reflected and/or scattered.

Figure 16:
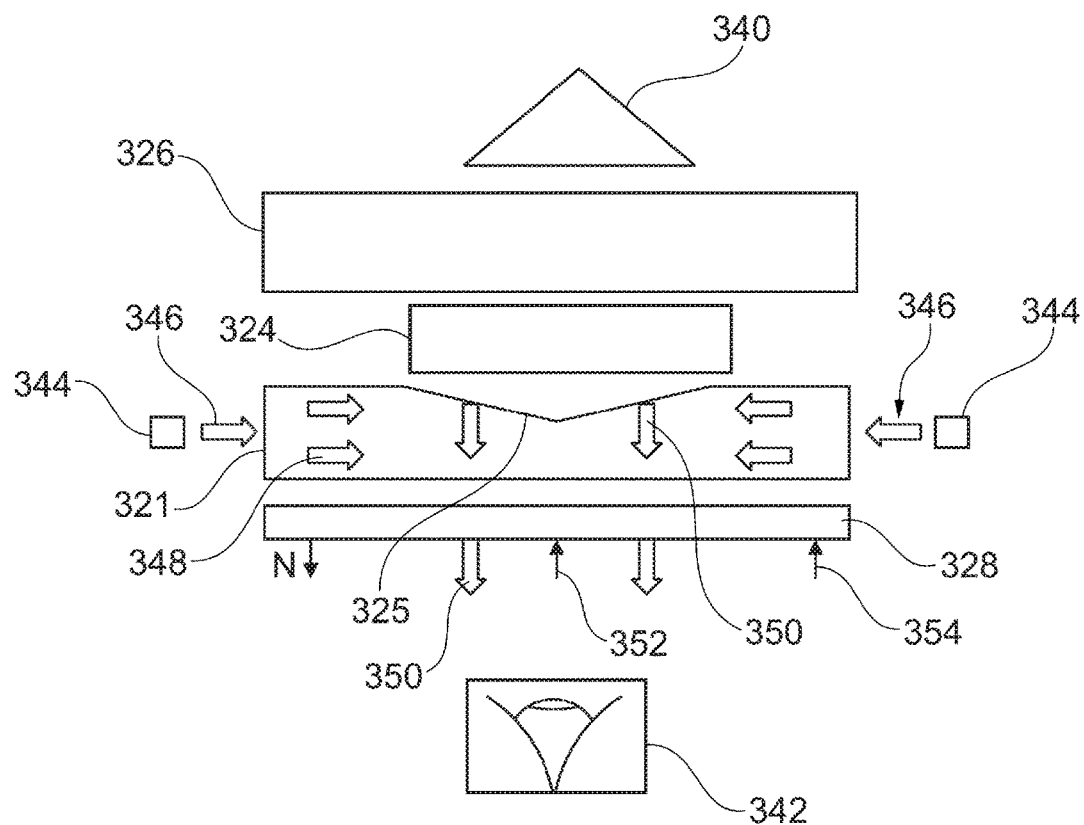
FIG. 16 is a schematic cross-sectional exploded view onto an illuminated radome according to the disclosure.

In FIG. 16 an exploded cross-sectional view of a radome, including an illumination system is shown. The elements of the radome corresponding to the radome as shown in FIG. 13 have the same reference numbers however increased by 200. The radome of FIG. 16 comprises a moulded substrate (321), preferably comprising polycarbonate that is transmissive for visual light. The substrate (321) is especially provided in a first shot moulding step.

Onto the substrate (321), especially in the area of the relieved portion (325), a visual feature, especially in form of a logo is provided. The logo is formed by the decorative coating (324). The coating (324) is especially radar/radio transparent and reflective for visual light and might comprise AlGe provided by a PVD coating process.

The substrate (321) and the decorative coating (324) are overmolded by overmolded layer (326), being especially opaque for visual light but radio-/radar-transmissive. The overmolded layer (326) is especially provided in a second shot moulding step and/or comprises AES material, especially dark coloured AES. By the overmolded layer (326) the decorative coating is encapsulated between the for visual light transparent substrate (321) and the for visual light opaque overmolded layer (326).

The substrate (321) is furthermore protected by a second surface coating in form of a hard coat (328), especially thermal hard coat, as already explained in the embodiments before.

In FIG. 16 furthermore a radio transceiver, especially comprising a radar unit (340) is shown. On the opposite side of the radome a viewer looking onto the radome is visualised for illustrative purposes by an eye (342).

The illumination system of the radome comprises two light sources (344), especially comprising LEDs. By the light sources (344) light rays (346) are coupled into the substrate (321). The substrate (321) forms partly also a part of the illumination system as acting as light guide for the light coupled into it from the light sources (344). The light is guided through the substrate (321) as indicated by arrows (348).

At the relieved portion (325) the light is at least partly reflected/scattered by the decorative coating (324) into the direction of the viewer (324) as indicated by the arrows (350). In this way the viewer can clearly see the visual feature, especially logo, formed by the decorative coating (324) by the illumination. Especially viewing onto the radome along the arrow (352) let the radome appear to be reflective for light whereas a view onto the radome along arrow (354) let the radome appear as black gloss due to the missing decorative coating in this area as well as the opaque, especially dark coloured overmold layer (326).

The light sources (344) especially represent edge lighting sources as the light is coupled into the light guide in form of the substrate (321) in a direction being mainly perpendicular to the normal direction N of the surface of the substrate (321). The relieved portion (325) in the substrate (321) can be designed at an angle to optimize the pick up of the light guided through the substrate (321). The use of edge lighting sources has the advantage that the light sources (344) can be located outside a radars signal transmission/receiving zone, and thus will not affect the radar sensing requirements.

In addition, the light sources can be hidden behind a supporting structure of the radome, like a bezel, grill or the like.

By the before described illumination system and production method an optimal radio/radar transparency is reached as changes in dissimilar materials, air gaps are avoided due to no further elements being located in the radar transmission area for the illumination purpose. Furthermore it is possible to provide sections with uniform thickness for the radio/radar transmission as no further elements are located in the transmission area for the illumination.

Figure 17:
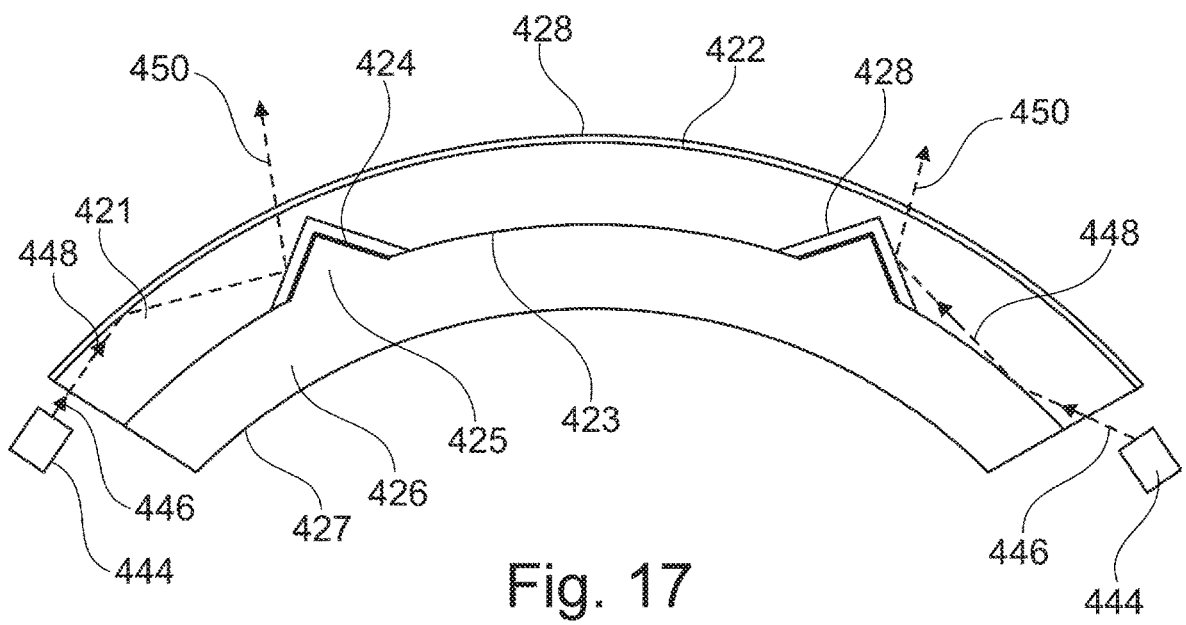
FIG. 17 is a cross-section of an example of a radome in accordance with the second alternative of the present disclosure including an illumination system.

In FIG. 17 a further example of an inventive radome comprising an illumination system is shown. The elements of the radome shown in FIG. 17 that correspond to the elements of the radome shown in FIG. 16 have the same reference numbers however increased by 100.

As shown in FIG. 17 the use of the illumination system is not restricted to plane or flat radomes. The radome might also have a curved cross-section without negatively influencing the illumination function.

The light of the light sources (444), shown as light rays (446) is coupled into the substrate (421). The substrate (421) acts as a light guide as the light rays within the substrate are undergoing internal reflection as shown by arrows (448). Thus the light is not significantly scattered out of the substrate (421) but is guided along the substrate (421) until it falls onto the decorative coating (424) in the relieved area (425). From there it is reflected and/or scattered out of the substrate (421) along the arrows (450) to be seen by a viewer.

Figure 18:
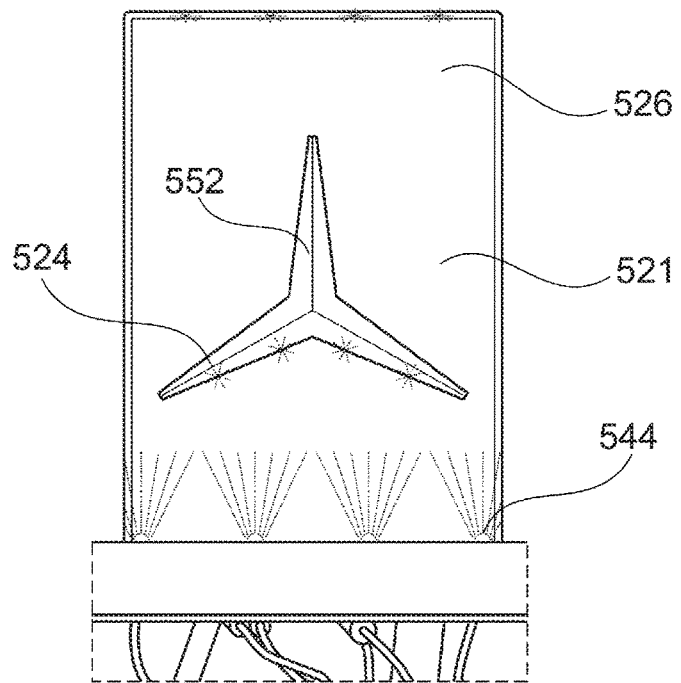
FIG. 18 is a view onto a radome illuminated by an illumination system as shown in FIG. 17.
Figure 19:
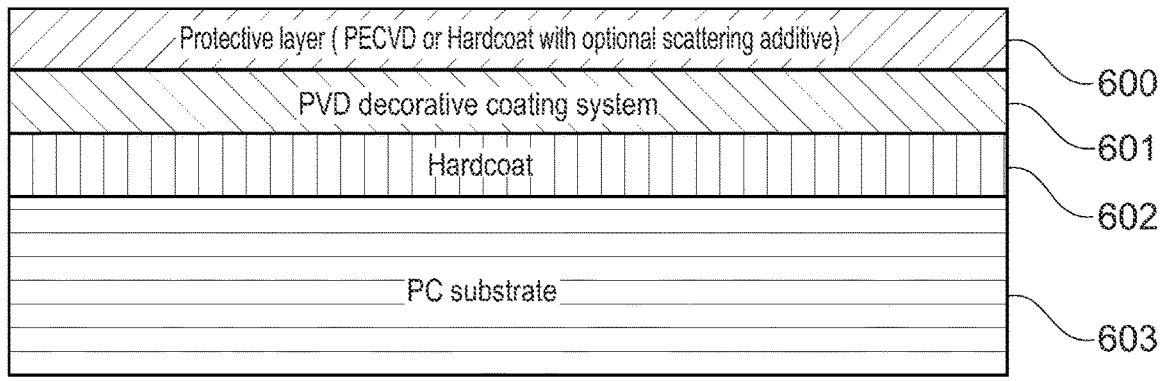
FIGS. 19, 20, and 21 illustrate an example of manufacturing a PVD coated item according to a first embodiment.
Figure 20:
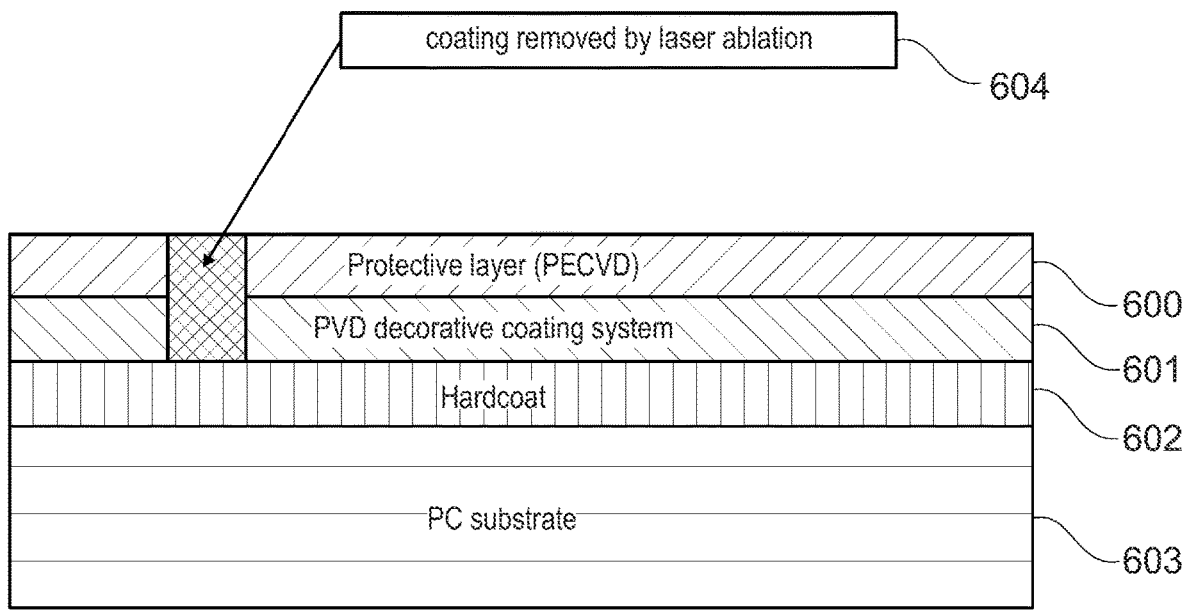
Figure 21:
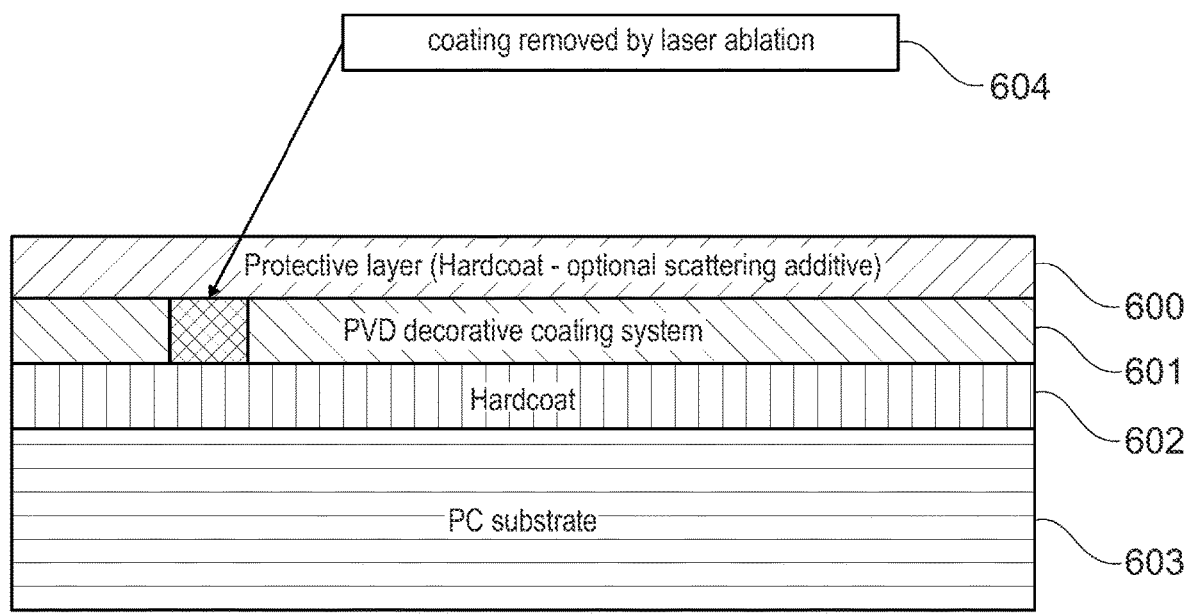

In FIG. 18 a picture onto an actual radome including an illumination system as described before is shown. The elements of the radome shown in FIG. 18 that correspond to the elements of the radome shown in FIG. 17 have the same reference numbers however increased by 100. In FIG. 18, a view onto the second surface of the substrate (521) of the radome is shown. Light from light sources (544) is coupled into the substrate (521) and is reflected/scattered by the decorative coating (524) so that a visual feature in form of a logo (552) becomes visible. In the area outside the logo (552) and outside the decorative coating (524) the illumination is reduced as only the opaque overmold layer (526) is visible.

Although the illumination system has been described in combination with the second alternative of the disclosure the person skilled in the art recognized that the illumination system is also applicable to the first alternative. In the first alternative a layer neighbouring the decorative coating or a layer of the decorative coating neighbouring a reflective layer of the coating is used as a light guide. For example the stress controlling layer (8) or the hard coat layer (9) may allow the guiding of light to the reflective area of the decorative coating from where it is reflected and/or scattered.

Examples

Substrate Attenuation
Substrate Thickness

To assess the influence of the substrate on attenuation of radio-wave at the 76-77 GHz band, bare (uncoated) polycarbonate samples at approximately 2, 2.3, 3, 4.5 and 6 mm (actual thickness 2.0. 2.33, 2.92, 4.42 and 5.84 mm) were obtained and assessed at a 10-degree tilt angle in a Rohde-Schwartz (R&S®) QAR System as per the manufacturer's instructions. The data was analysed and a line of best fit was then applied to the generated results. The assumed dielectric constant of polycarbonate at 77 Ghz is 2.8

Different dielectric substrates have different permittivity, which results in variations of the wavelength of the radio wave across the substrate. Polycarbonate has a relative permittivity ($\varepsilon r$) of 2.8 at 77 GHz, and therefore the calculated wavelength through the substrate is 2.328 mm.

Figure 8:
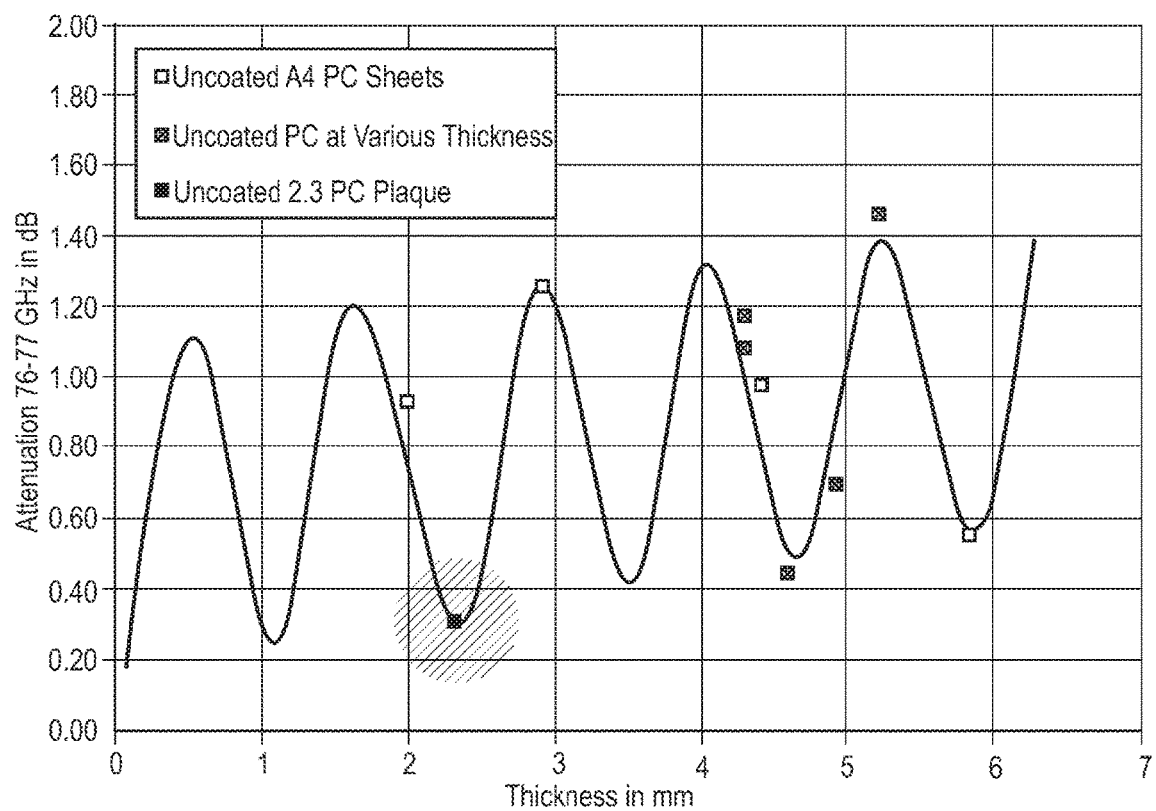
FIG. 8 illustrates the measured change in attenuation of 77 GHz radio waves through uncoated polycarbonate as a result of changes in polycarbonate thickness.
Figure 9:
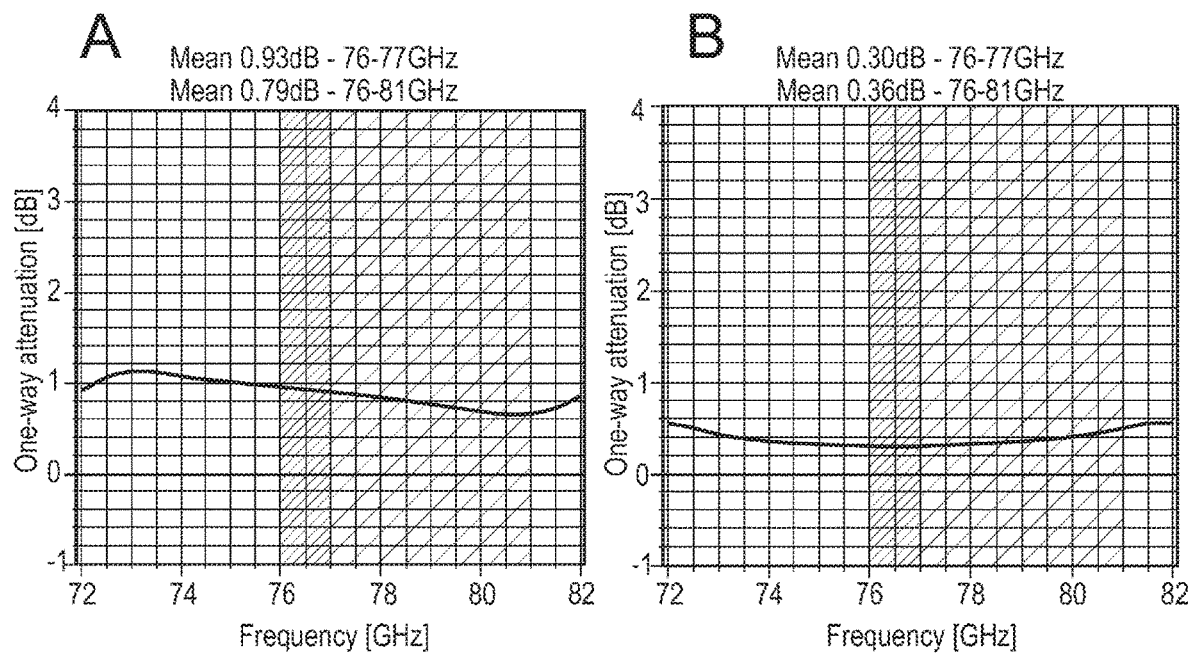
FIG. 9 illustrates average attenuation of radio waves of 76-77 GHz and 79-81 GHz across polycarbonate of 2 mm (A) and 2.3 mm (B) thickness.

As can be seen in FIG. 8, the attenuation followed an inclined sine curve with attenuation cyclically being at a minimum with substrate thickness that were an integer multiple of half wave length (i.e. 0.5, 1, 1.5, 2, 2.5 etc. times the wavelength of the radio wave through the substrate), with maximum attenuation being a quarter wave length offset from the minimum (i.e. 0.75, 1.25, 1.75 etc. times the wavelength of the radio wave through the substrate). Further, the average attenuation across the sine curve increased as the thickness of the sheet increased.

In view of other design requirements for radome use on a vehicle, the optimal thickness was selected at 2.3 mm, which provided minimal attenuation and appropriate robustness, stiffness and weight for use as an automotive body part.
Attenuation of 77 GHz vs 79 GHz Radio Waves To measure the attenuation at the common radio wave frequencies used in automotive radar systems, 2 mm (FIG. 9A) and 2.3 mm (FIG. 9B) polycarbonate substrates were assessed across the 76-81 GHz frequencies using the R&S® QAR System as per the manufacturer's instructions.

As can be seen in FIG. 9A, the mean attenuation across the 76-77 GHz frequency was approximately 117% of the mean attenuation across the 76-81 GHz frequency when the polycarbonate substrate was 2 mm. By comparison, and as shown in FIG. 9B, the mean attenuation across the 76-77 GHz frequency was approximately 83% of the mean attenuation across the 76-81 GHz frequency when the polycarbonate substrate was 2.3 mm. As such, the percent variation between the 2 mm and 2.3 mm substrates was 17% when the mean attenuation across the 76-77 GHz frequency was compared to the mean attenuation across the 76-81 GHz frequency, albeit in opposing directions.

However, the difference in the real attenuation was only 0.06 dB when the substrate was 2.3 mm compared to 0.14 dB when the substrate was 2 mm. Therefore, 2.3 mm appears to be the most suitable choice for use with radar systems that use both the 77 GHz and 79 GHz band.
Gloss Metallic Look A radio-transmissive decorative polymer sheet was prepared with a gloss metallic look as per the following protocol.
Substrate Preparation A polycarbonate substrate was prepared by applying a base hard coat layer of Momentive PHC587B using an automated dipcoating process consisting of a detergent wash, coarse rinse, fine rinse, extra fine rinse, drying, cooling and then dip coating and flash off. The dipcoating process was robotically controlled with a precise removal speed to control the thickness of the hardcoat. The first-surface hard coated substrate was left for 10 minutes to allow evaporation of the solvents until the surface was substantially tack-free. Subsequently, the first-surface coated substrate was cured for 71 minutes at 130° C. in a curing oven to provide a hard coated substrate.
Decorative Coating A decorative coating including a layer of Aluminium and Germanium alloy and an overlying layer of silicon dioxide ($SiO_2$) was deposited in accordance with the following parameters:

TABLE 2

Decorative layer Coating Parameters

| | Pre-Treatment | Layer 1 | Layer 2 |
|---|---|---|---|
| Glow discharge electrodes (S/S) | Power 3 kW | n/a | n/a |
| Dual rotatable Silicon Target (99.90% purity) | n/a | n/a | Power 18 kW |
| Aluminium/Germanium (50/50 wt %) | n/a | Power 30 kW | n/a |

TABLE 2-continued

Decorative layer Coating Parameters

|  | Pre-Treatment | Layer 1 | Layer 2 |
|---|---|---|---|
| Total Gas flow | 740 sccm Ar 100 sccm O2 | 330 sccm Ar | 100 sccm Ar 200 sccm O2 |
| RPM | 6 | 24 | 24 |
| Number of rounds | 12 | 10 | 20 |
| Base Pressure (mbar) | 8e−5 | 1.5e−5 | 1.5e−5 |
| Run Pressure (mbar) | 9e−3 | 2e−3 | 7e−4 |
| Thickness (nm) | n/a | 30 | 25 |

Protective Surface Coating—Clear Hard Coat

To provide a gloss finish and to protect the decorative coating, a protective surface hard coat layer of Momentive PHC587B was applied as the upper (protective hard coat) layer of the decorative coating. This was completed by an automated spray coating process in a dedicated thin film coating spray booth. The first-surface coated substrate was left for 10 minutes to allow evaporation of the solvents until the surface was substantially tack-free. Subsequently, the first-surface coated substrate was cured for 71 minutes at 130° C. in a curing oven to provide a protective hard coated surface.

Bright Satin Metallic Look

A radio-transmissive decorative polymer sheet was prepared with a satin metallic look as per the following protocol.

Substrate Preparation and Decorative Coating

A polycarbonate substrate was provided with a first-surface hard coating and a decorative coating comprising a layer of an alloy of aluminium and germanium and silicon dioxide layer as set out for the "Gloss Metallic Look" set out above.

Protective Surface Coating—Satin Hard Coat

To provide a satin metallic look a protective hard coat was applied which included an additive that resulted in diffusion of visible light. Specifically, the following parameters were used:

TABLE 3

Satin Hard Coat Deposition Parameters

|  | Layer 1 |
|---|---|
| Material | Momentive PHC-587B + Tospearl 2000B at a 3.5% wt/wt |
| Deposition Method | Spray Coated and cured at 130° C. |
| Thickness (μm) | 8 to 16 |

Mechanical Testing

To assess if the decorative coated radome would be sufficiently robust for use in automotive purposes a series of durability tests were performed on Gloss Metallic Look and Satin Metallic Look samples prepared as described above.

The tests performed and the outcomes are summarized in Table 4 below.

TABLE 4

Mechanical testing of coated samples

| TEST | DESCRIPTION | RESULT Gloss | RESULT Satin |
|---|---|---|---|
| Cross Hatch Adhesion | ISO 2409 using a single-blade cutting tool and 3M Scotch 8981 tape. Adhesion rating ≤1 | PASS | PASS |
| Abrasion-Steel Wool | A 30 cm long skeen of 0 grade steel wool folded into a 40 mm × 40 mm square pad and fitted to a Sutherland Ink Rub Tester. 1.9 kg of force is applied onto the surface of the radome for 75 cycles. | PASS | PASS |
| Abrasion-Scuff | A 30 cm long skeen of 0000 grade steel wool folded into a 40 mm × 40 mm square pad and fitted to a Sutherland Ink Rub Tester. 0.9 kg of force is applied onto the surface of the radome for 10 cycles. | PASS | PASS |
| Stone Chip | Apply Test as per SAE J400<br>Max Ave / Rating letter / Size of stone chip<br>Sum (A + AB + B) < 30   A   Depth ≤ 1 mm<br>Sum (AB + B) < 12   AB   Depth 1-2 mm<br>Sum (B) < 0.4   B   Depth 2-3 mm<br>  C   Depth 3-6 mm<br>  D   Depth ≥ 6 mm | PASS | PASS |
| Dry Heat | 1 hour at 115°C | PASS | PASS |
| Thermal Shock | 200 Cycles −40° C. to 85° C., 1 hr/cycle | PASS | PASS |
| Water Immersion | Sample immersed in in 40° C. water for 320 hours as per FLTM BI 104-1 | PASS | PASS |
| Condensate | 240 hours at 40° C. according to DIN EN ISO 6270-2 constant humidity | PASS | PASS |
| Salt Spray | Salt Spray for 48° hours as per ASTM B 117 | PASS | PASS |
| Russian Mud | Subject Sample to 'Russian Mud' solution as per NEW M4063. CaCl2/Kaolin powder solution added to coated surface at 60° C. of 336 hours | PASS | PASS |

Coated Substrate Attenuation

Polycarbonate sheets of 2.0. 2.3, 2.92, 4.42 and 5.84 mm and were coated with either Gloss Metallic coating or a Satin Metallic coating as described above. To evaluate the effect of substrate thickness in reflection and attenuation of radar single in the 76-77 GHz band the coated polycarbonate sheets were assessed at a 10-degree tilt angle in a Rohde-Schwartz (R&S®) OAR System. The thickness of the applied decorative coating can be up to 0.03 mm thick providing a total thickness of 2.03. 2.33, 2.95, 4.45 and 5.87 mm. Results are shown in the Table 5 below:

TABLE 5

Substrate Attenuation (dB); Reflection (%)

| Substrate Thickness (mm) | Gloss Metallic | | Satin Metallic | |
|---|---|---|---|---|
| | Attenuation dB (average) | Reflection % (average) | Attenuation dB (average) | Reflection % (average) |
| 2.03 | 1.31 | 34 | 1.33 | 34 |
| 2.33 | 1.13 | 10 | 1.18 | 9 |
| 2.95 | 1.69 | 35 | 1.63 | 37 |
| 4.45 | 1.43 | 31 | 1.36 | 32 |
| 5.87 | 1.24 | 19 | 1.31 | 21 |

As can be seen above, the one-way attenuation and reflection of coated 2.33 mm polycarbonate did not significantly vary based on the coating applied. Further the best performing thickness was 2.33 mm with an attenuation of 1.1 dB and 1.18 dB (Gloss, Satin) and a reflection of 10% and 9% (Gloss, Satin).

Figure 10:
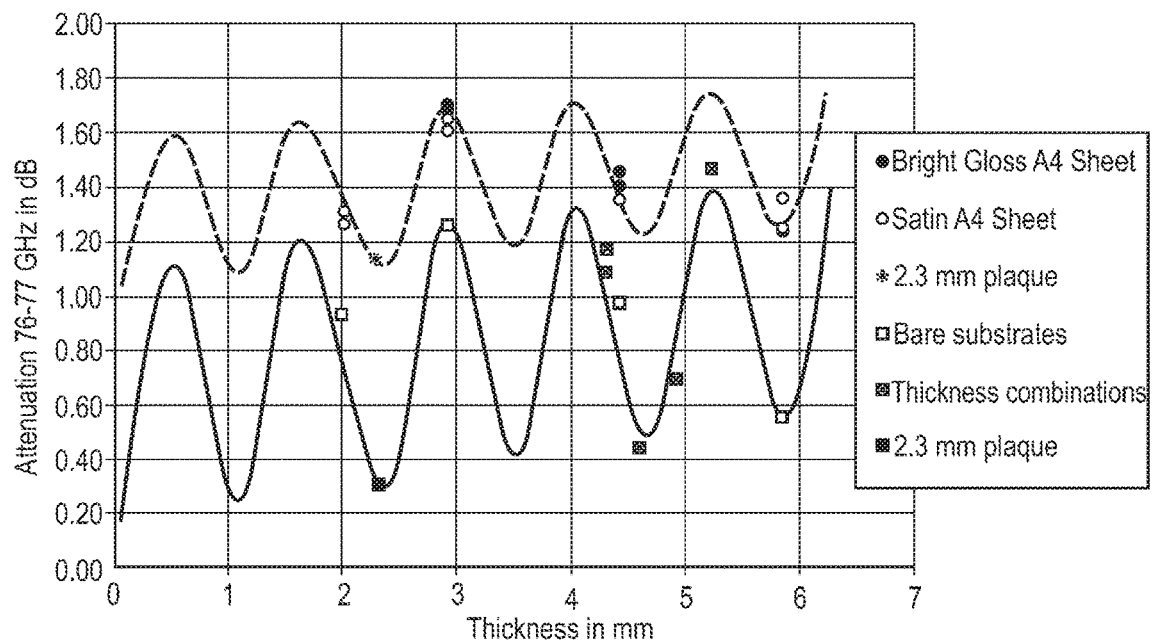
FIG. 10 illustrates the measured change in attenuation of 77 GHz radio waves through coated polycarbonate compared to uncoated polycarbonate as a result of changes in polycarbonate thickness.

The comparative attenuation of coated and uncoated substrates is illustrated in FIG. 10 (generated data including a sine curve line of best fit). As can be seen, the addition of a coating (Gloss or Satin) increases the attenuation. However, the attenuation at 2.33 mm is still at the levels compatible with that required for automotive radar systems.

Visual Characteristics

Two-millimetre and 2.3 mm polycarbonate substrates were coated to provide a Gloss Metallic Look or a Satin Metallic Look as described above and the visual characteristics at the centre of the coated substrates were measured via an illuminant A/2.

Figure 11:
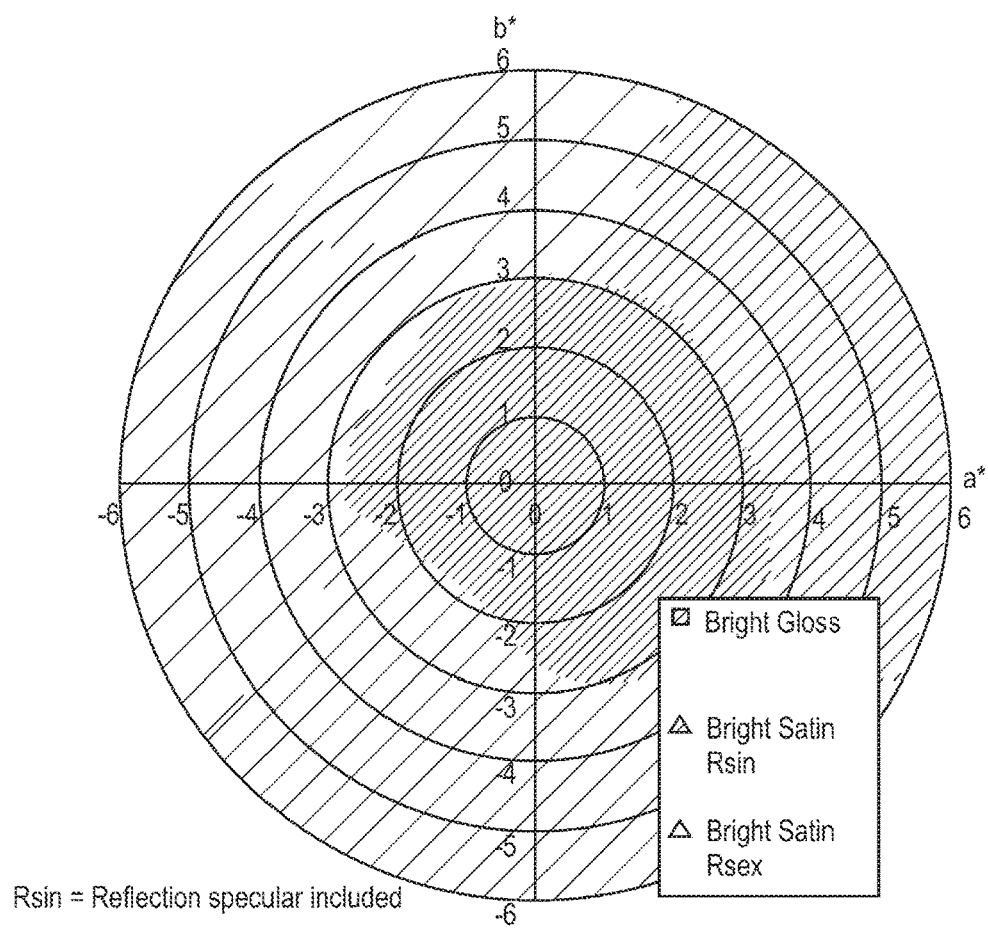
FIG. 11 illustrates the measured CIELAB colour of Gloss coated and Satin coated radomes.

The CIELAB colour chart as measured with illuminant A/2 is shown in FIG. 11, and the measurements of reflection (specular included "Rsin" and specular excluded "Rsex") are provided in Table 6 below.

TABLE 6

Reflectivity of decorative coated samples.

| Finish | Reflectivity % (Rsin) | Reflectivity % (Rsex) |
|---|---|---|
| Gloss 2 mm Samples | 44% | N/A |
| Satin 2 mm Samples | 44% | 22% |
| Gloss 2.3 mm Samples | 47% | N/A |
| Satin 2.3 mm Samples | 46% | 23% |

The reflectivity, including specular and diffuse reflected light (Rsin), was comparable for both gloss and satin metallic look samples. However, the reflectivity on the 2.3 mm samples was typically higher than the 2 mm samples. This was likely an artefact of the coating process as the 2.3 mm samples consisted of small plaques, compared to the A4 sized 2 mm samples, and as such the 2.3 mm samples were closer to the splutter target during deposition.

Manufacturing Other Decorative PVD Coated Items

In other examples of the present disclosure, manufacturing a decorative PVD coated item is provided. This coated item (which may not be a radome) may include gloss, satin and/or patterned metallic finishes with or without coloured graphics with or without backlighting capability. In an example, the coated item may include an rearview component like an exterior mirror scalp or exterior review camera scalp.

First Example of Manufacturing PVD Coated Items

FIGS. 19-22 illustrate an example of manufacturing a PVD coated item according to a first embodiment. In this example, and referring to FIGS. 19-21, a first step includes applying a hard coating (602) to a plastic substrate (603). For example, black polycarbonate may be dip coated in SilFort PHC587B and cured. In a second step, a decorative PVD coating (601) may be applied by magnetron sputtering. An optional dielectric intermediate layer may be used between the reflective coating and the hardcoated substrate. In a third step, a pattern/graphic may be laser etched (604) into the decorative PVD coating (601). The PVD coating (601) may be either partially or fully removed. As a result of this process, areas are selectively ablated to provide a graphic using the contrast between the underlying substrate and the decorative PVD coating (601). Where the PVD is fully removed, a hardcoated surface remains, maintaining the integrity and robustness of the substrate.

Using this technique, a graphic is produced by the absence of PVD material rather than the addition of another material. The graphic is produced as a result of contrast between the underlying substrate and decorative PVD coating. The parameters (power, velocity and Q-switch frequency) of the laser etch determine if the material is partially or fully removed. The durability of this solution is superior as the contrast is achieved by exposing the substrate. Hence, this technique cannot be easily affected by abrasion or chemicals such as when using painting or printing. Different colored graphics can be achieved with different substrate colors. And if the substrate is transparent to light, this solution offers backlighting ability.

In an optional further step, protective coating (600) can be applied with or without a satin additive.

Advantages of this example technique include that the laser parameters including power, path, velocity and Q-switch frequency can be changed to create many different types of graphic finishes. This requires no changes to painting or printing processes or complex masking of coating operations. It also allows for fully bespoke customer solutions only requiring a laser program change. Further, the combination of the decorative PVD coating and a translucent substrate provides compatibility for backlighting. This is due to the PVD coating acting as the mask and allowing light to be transmitted only through the laser-ablated regions.

Figure 22:
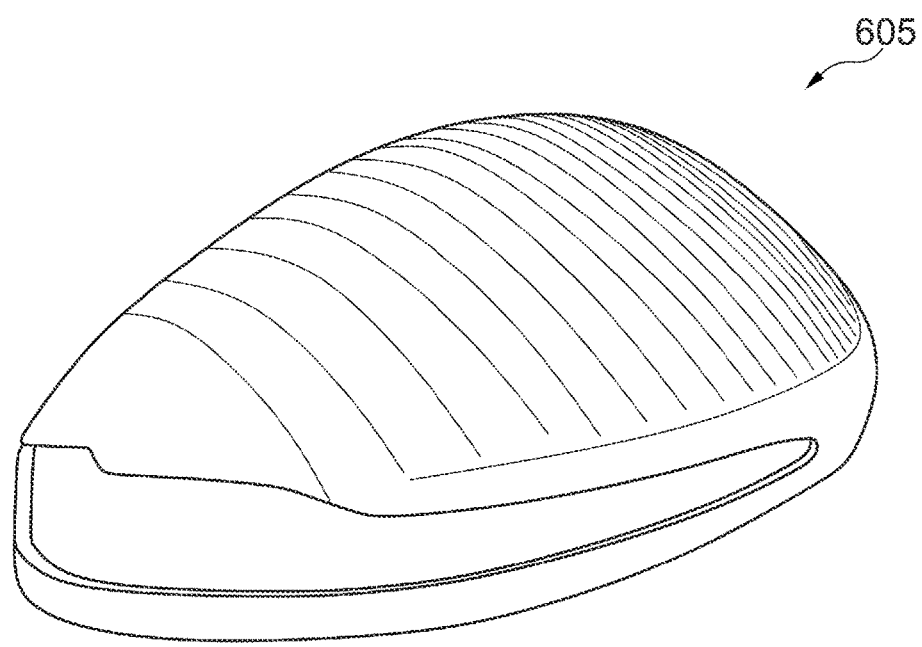
FIG. 22 illustrates a substrate using the example of laser ablated graphics.
Figure 23:
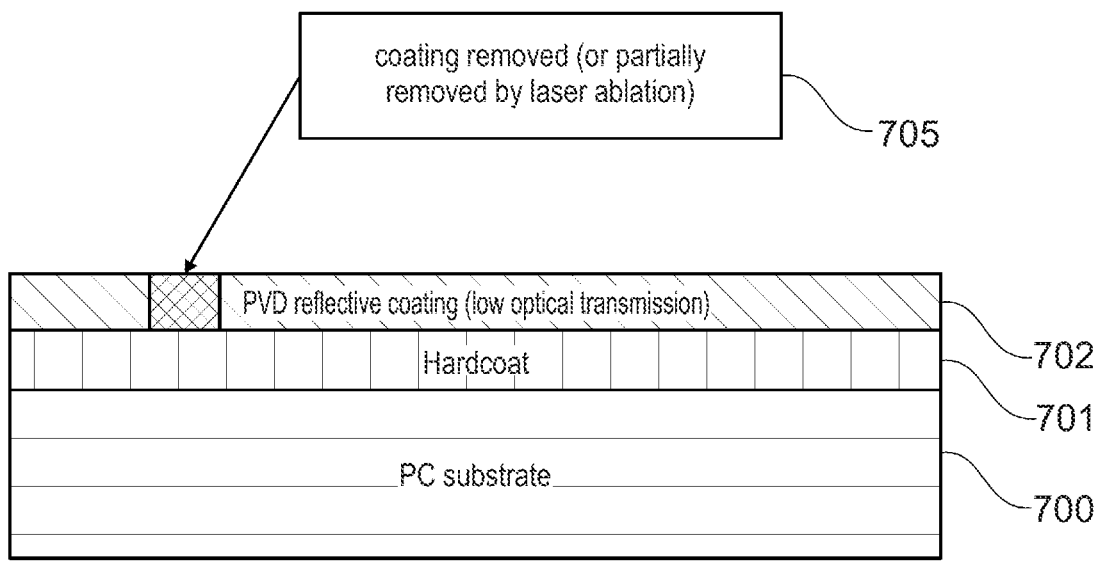
FIGS. 23 and 24 illustrate an example of manufacturing a PVD coated item according to a second embodiment.
Figure 24:
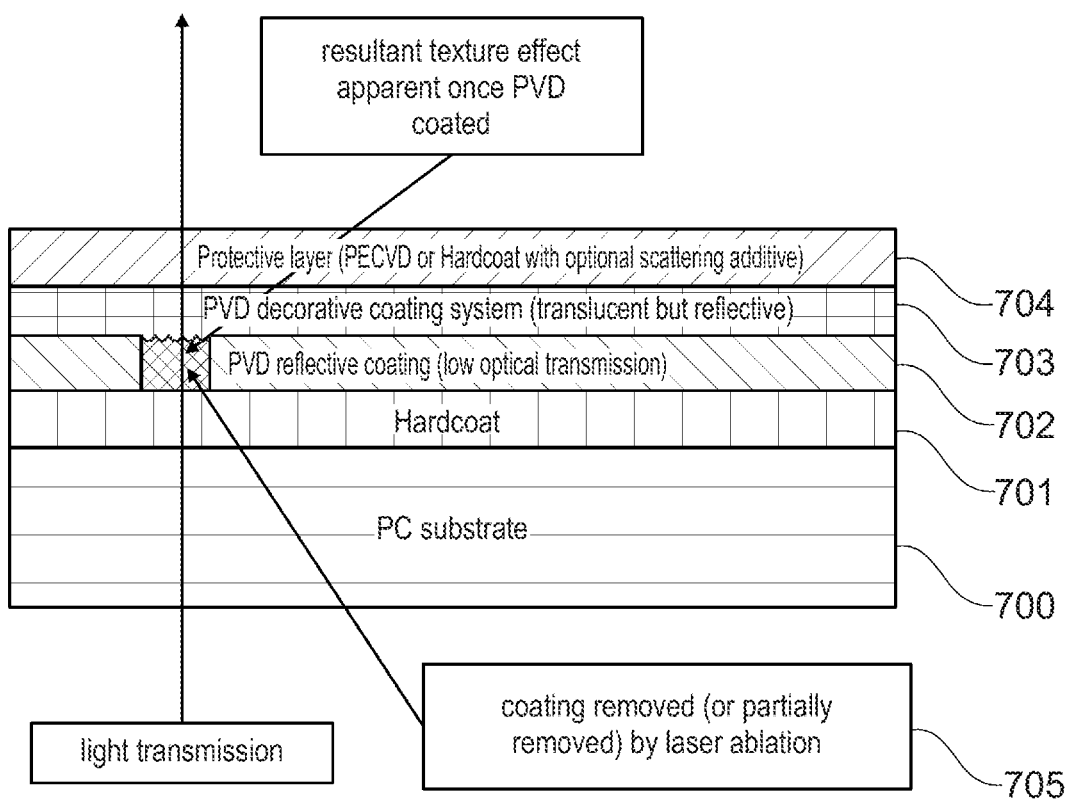

Referring to FIG. 22, a substrate using the example of laser ablated graphics is illustrated. In this example, the coated item is an exterior mirror scalp (605).

Second Example of Manufacturing PVD Coated Items

FIGS. 23-26 illustrate an example of manufacturing a PVD coated item according to a second embodiment—that is, a way to create a satin, textured finish or pattern within a decorative PVD surface on a plastic substrate. In this example, and referring to FIGS. 23 and 24, a first step includes applying a hard coating (701) to a plastic substrate (700). For example, polycarbonate may be dip coated in SilFort PHC587B and cured. In a second step, a reflective PVD coating (702) of low optical transmission may be applied by magnetron sputtering. An optional dielectric intermediate layer may be used between the reflective coating and the hardcoated substrate. In a third step, a pattern/graphic may be laser etched (705) into the PVD coating (702). The PVD coating (702) may be either partially or fully removed. The laser setting is designed to not only remove the PVD layer but also create a texture on the component, which differs from those areas not processed with a laser. As a result of this process the areas ablated now feature a texture on the remaining hardcoat (or dielectric PVD) surface. At this point, the texture may not be visible to the naked eye.

Using this technique allows for selection of the type of reflective material used, a thickness of the reflective material, parameters for the laser etching process such as the frequency and velocity, and the raster, pattern, or hatching methods used in the laser etching process.

In a fourth step, the part may be carefully cleaned before a translucent but reflective PVD coating (703) is applied (this can include several layers including metals, metalloids and dielectrics) by magnetron sputtering. At this stage, the previously invisible textures of the ablated areas are now highly visible as diffuse light reflection creates a satin appearance. In an optional further step, protective coating (704) can be applied with or without a satin additive.

Advantages of this example technique include that the laser parameters including power, path, velocity and Q-switch frequency can be changed to create many different types of graphic finishes. This requires no changes to painting or printing processes or complex masking of coating operations. It also allows for fully bespoke customer solutions only requiring a laser program change. Further, the combination of a low optical transmission PVD coating that is reflective and a translucent but also reflective PVD coating provides compatibility for backlighting. This is due to the low optical transmission PVD coating acting as a mask, allowing light to transmit only through the laser ablated (and textured) regions. With the light 'masking' being on the first surface, there is far less scope for double imaging that occurs when masked from the second surface.

Figure 25:
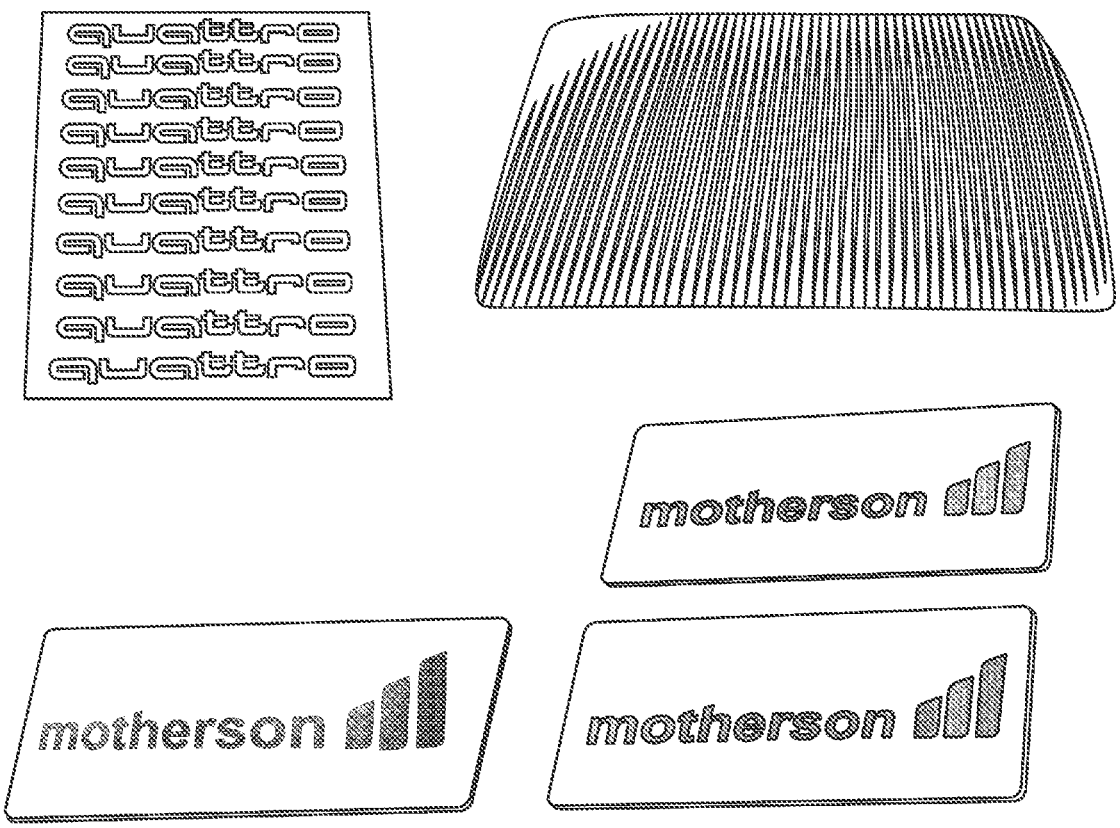
FIG. 25 illustrates a range of satin finishes for a surface using the technique of FIGS. 23 and 24.
Figure 26:
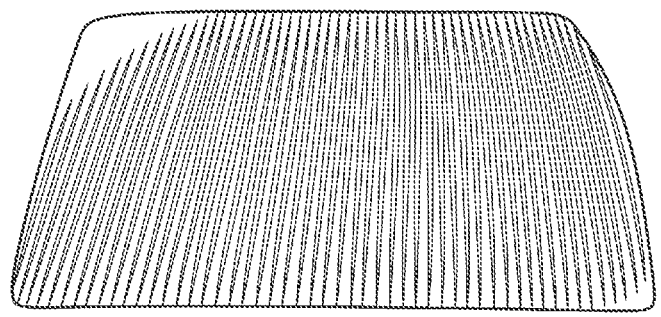
FIG. 26 illustrates a range of satin finishes with backlighting for a surface using the technique of FIGS. 23 and 24.
Figure 26:
Figure 27:
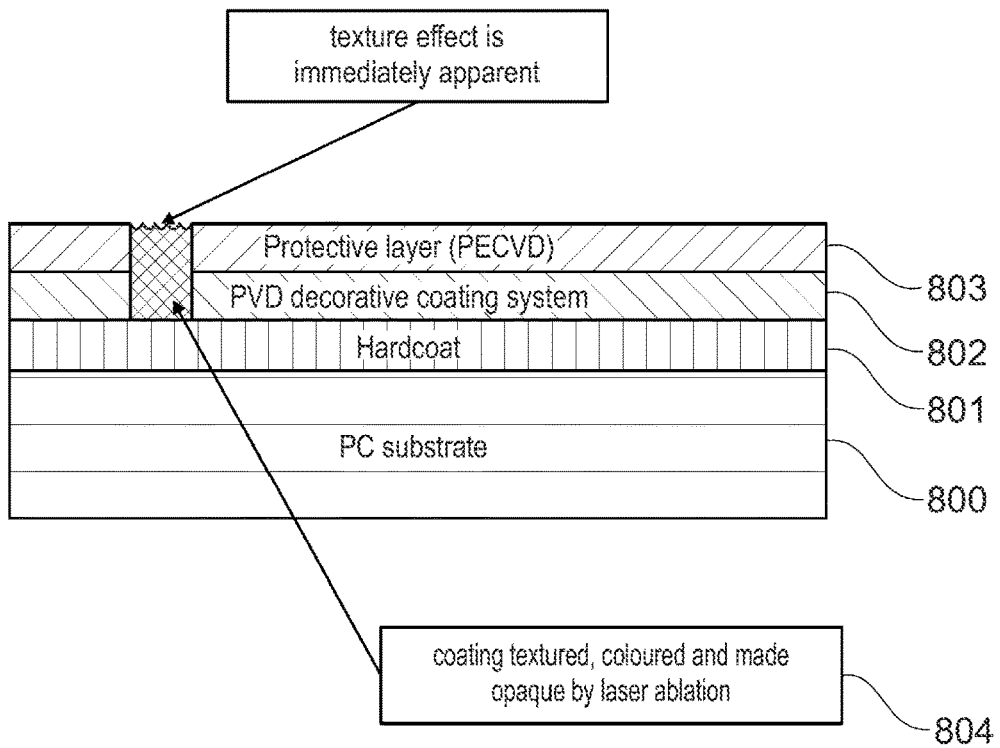
FIGS. 27 and 28 illustrate an example of manufacturing a PVD coated item according to a third embodiment.
Figure 28:
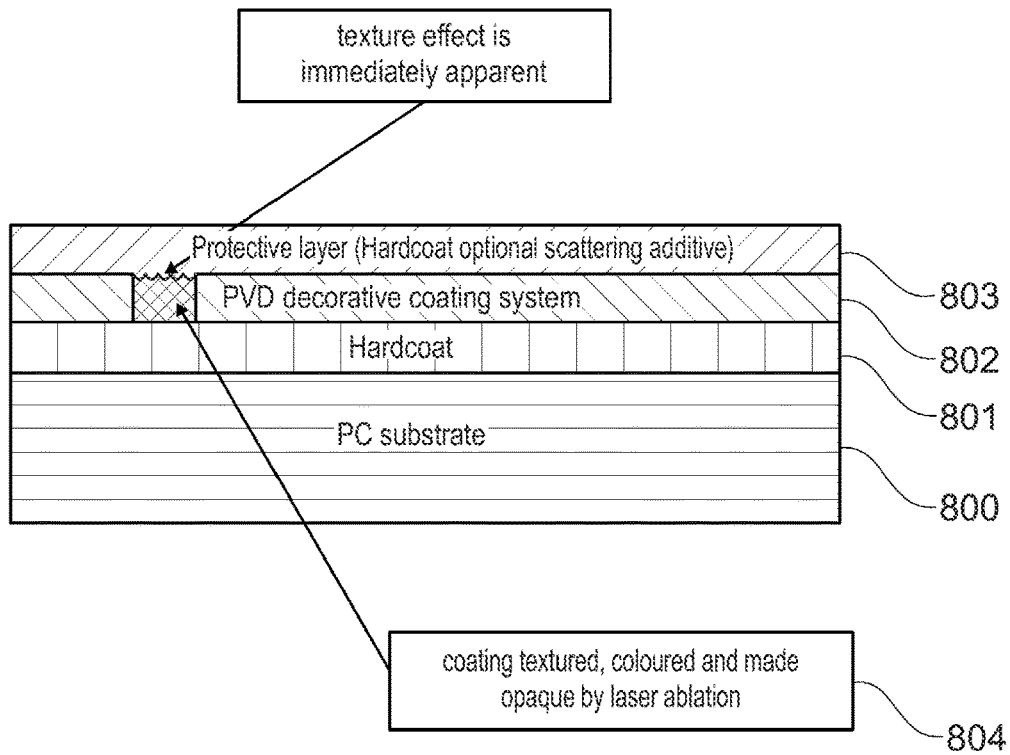

Referring to FIG. 25, a range of satin finishes is illustrated for a surface using this technique. Referring to FIG. 26, a range of satin finishes with backlighting is illustrated.

Third Example of Manufacturing PVD Coated Items

FIGS. 27-31 illustrate an example of manufacturing a PVD coated item according to a third embodiment—that is, a way to create a satin, textured finish or pattern within a decorative PVD surface on a plastic substrate. In this example, and referring to FIGS. 27 and 28, a first step includes applying a hard coating (801) to a plastic substrate (800). For example, polycarbonate may be dip coated in SilFort PHC587B and cured. In a second step, a decorative PVD coating (802) may be applied by magnetron sputtering. An optional dielectric intermediate layer may be used between the reflective coating and hardcoated substrate. This decorative layer (802) can be a combination of multiple layers, as described in U.S. patent application Ser. No. 15/124,310, which is incorporated by reference herein in its entirety for all purposes. In a third step, a pattern/graphic may be laser etched (804) into the reflective PVD coating (802). As a result, the areas ablated now feature a texture, a color change, and also become opaque in transmission. Since the decorative PVD layer is a complex interference stack, different colors are created depending on the depth of the laser ablation and structure applied to the substrate.

Using this technique allows for selection of the type of reflective coating materials used, a thickness of the reflective coating materials, parameters for the laser etching process such as the power, frequency, and velocity, and the raster, pattern, or hatching methods used in the laser etching process. In addition, the laser etching can make the coating opaque and the depth of the etch allow for complex decorative PVD coating stacks and subsequent colors. A patterning of the substrate resulting from the etch can also lead to a color change.

In an optional further step, protective coating (803) can be applied with or without a satin additive.

Advantages of this example technique include that the laser parameters including power, path, velocity and Q-switch frequency can be changed to create many different types of satin, patterned finishes with several colors. This requires no changes to the injection moulding tooling or complex masking of coating operations. It also allows for fully bespoke customer solutions only requiring a laser program change. Further, the ablated regions enable the application of backlighting. This is the inverse of the first manufacturing example provided above, which describes a translucent ablated region.

Figure 29:
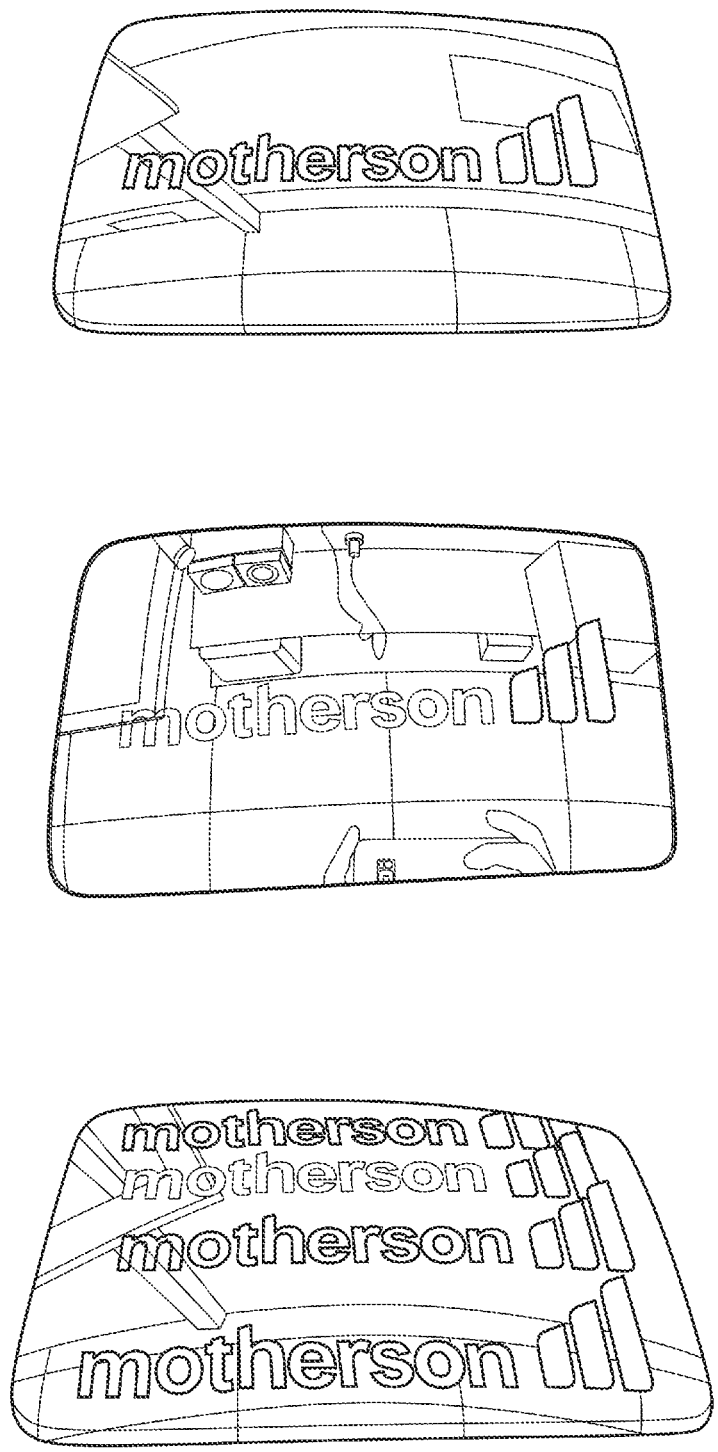
FIG. 29 illustrates a range of satin finishes and color effects for a surface using the technique of FIGS. 27 and 28.
Figure 30:
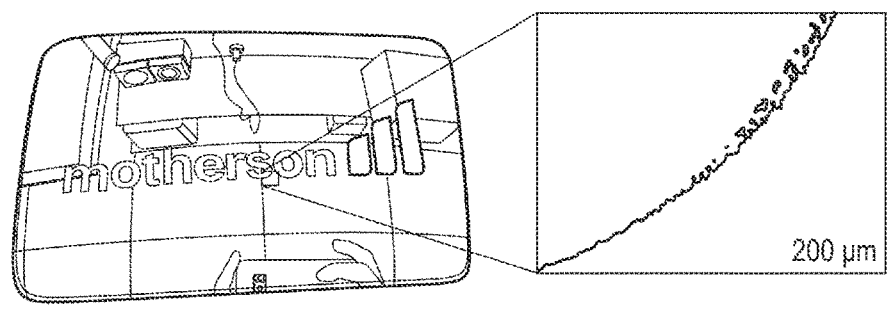
FIG. 30 illustrates examples of two different finishes depending on the etch applied using the technique of FIGS. 27 and 28.
Figure 30:
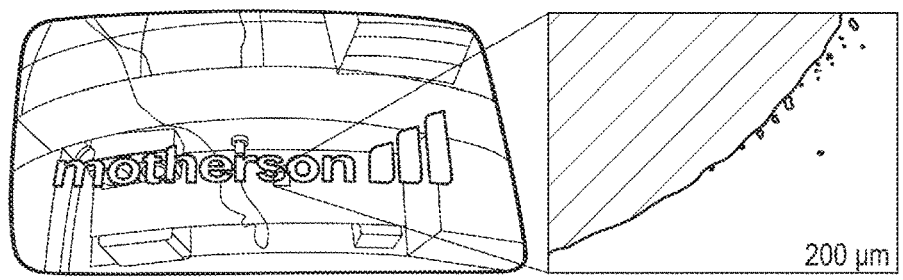
Figure 31:
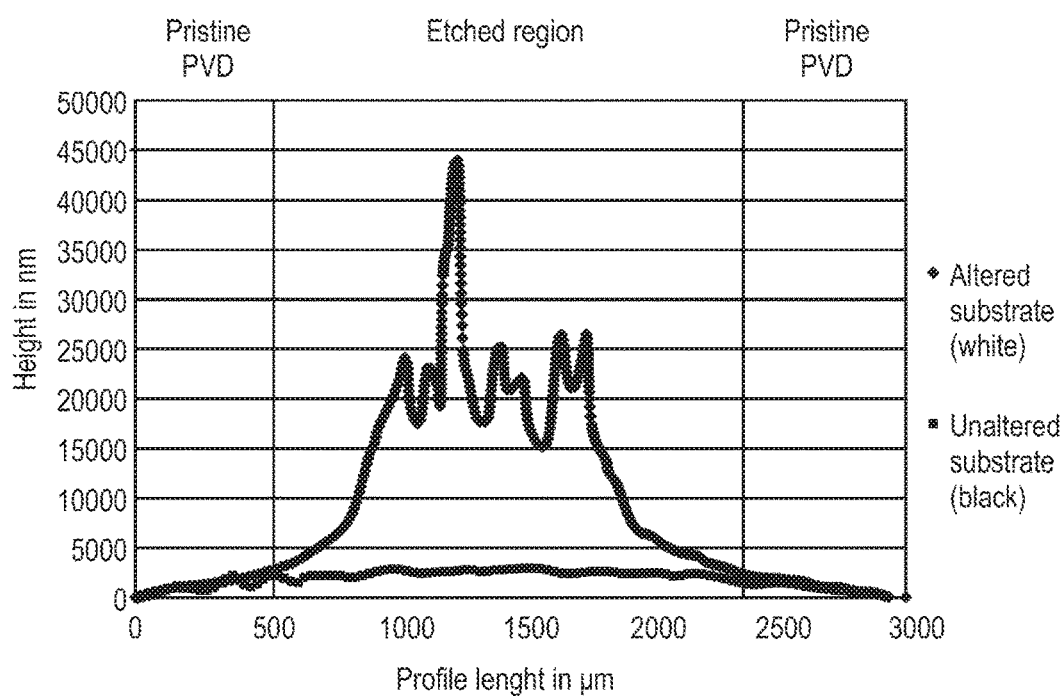
FIG. 31 illustrates a profilometer measurement for a sample.

Referring to FIG. 29, a range of satin finishes and color effects is illustrated for a surface using this technique. Referring to FIG. 30, examples of two different finishes depending on the etch applied to the sample is illustrated. A microscopic investigation of the etched samples proved that the color change can be created by intentionally altering the substrate via laser etching. These examples are created by varying the laser settings. Referring to FIG. 31, a profilometer measurement is illustrated. The profilometer measurement highlights the alteration of the substrate. The sample that appears white has a raised structure which corresponds to the white etched region.

Referring back to the three example manufacturing methods, as described above, the following table provides the durability testing of coating samples manufactured according to the three embodiments:

TABLE 7

Durability testing of coated samples

| | | Result | | |
|---|---|---|---|---|
| Test | Method | Embodiment 1 | Embodiment 2 | Embodiment 3 |
| Cross hatch adhesion | ISO 2409 using a single-blade cutting tool and 3M Scotch 8981 tape. Adhesion rating ≤1. | PASS | PASS | PASS |
| Water immersion | Immerse a sample for 320 h in water kept at 40° C. | PASS | PASS | PASS |
| Short term heat | Expose sample to 110° C. for 7 hours. | PASS | PASS | PASS |

TABLE 7-continued

Durability testing of coated samples

| | | Result | | |
|---|---|---|---|---|
| Test | Method | Embodiment 1 | Embodiment 2 | Embodiment 3 |
| Thermal cycling | 10× cycles of 75° ± 2° C. 4 h => 38° ± 2° C., 95% ± 5% RH 16 h => −30° ± 2° C. 4 h. | PASS | PASS | PASS |
| Thermal Shock | 200× Cycles −40° C. to 85° C., 1 hr/cycle. | PASS | PASS | PASS |
| Salt Spray | Salt Spray for 480 hours as per ASTM B 117. | PASS | PASS | PASS |
| Condensate | 240 h 40° C. constant humidity as per DIN EN ISO 6270-2 | PASS | PASS | PASS |
| UV resistance | 3960 kJ/m2 of Xenon Arc exposure as per SAEJ2527. Adhesion rating ≤1. | PASS | UNDERWAY | UNDERWAY |

All methods described herein can be performed in any suitable order unless indicated otherwise herein or clearly contradicted by context. The use of any and all examples, or exemplary language (e.g., "such as") provided herein, is intended merely to better illuminate the example embodiments and does not intrinsically pose a limitation on the scope of the claimed invention. However, such embodiments may be the subject of a claimed limitation, or may be considered as an additional feature in the event that it is included in a claim. No language in the specification should be construed as indicating any non-claimed element as essential.

The description provided herein is in relation to several embodiments which may share common characteristics and features. It is to be understood that one or more features of one embodiment may be combinable with one or more features of the other embodiments. In addition, a single feature or combination of features of the embodiments may constitute additional embodiments.

The subject headings used herein are included only for the ease of reference of the reader and should not be used to limit the subject matter found throughout the disclosure or the claims. The subject headings should not be used in construing the scope of the claims or the claim limitations.

Those skilled in the art will appreciate that the invention described herein is susceptible to variations and modifications other than those specifically described. It is to be understood that the invention includes all such variations and modifications. The invention also includes all of the steps, features and/or functions referred to, or indicated in this specification, individually or collectively, and any and all combinations of any two or more of the steps or features.

What is claimed is:

1. A method of manufacturing a physical vapour deposition (PVD) coated system comprising a substrate, the method comprising: applying a hard coating to the substrate; applying a PVD coating by magnetron sputtering to the substrate; and laser etching one or more of a pattern or a graphic into the PVD coating so that the PVD coating is at least partially removed to form an ablated area extending through the PVD coating, wherein the laser etching forms a textured area on the hard coating, and wherein the pattern or the graphic is revealed as a result of the contrast between the substrate and the PVD coating.

2. The method of claim 1, wherein the substrate comprises polycarbonate and the hard coating is applied by dip coating.

3. The method of claim 1, wherein the applying the hard coating comprises at least one of:

dip coating the substrate in the hard coating and curing the hard coating; or applying via plasma enhanced chemical vapor deposition (PECVD) by a suitable monomer, flow coating or spray coating.

4. The method of claim 1, further comprising providing an intermediate dielectric material between the PVD coating and the substrate.

5. The method of claim 1, further comprising providing a protective outer coating on the PVD coating after laser etching the PVD coating, the protective outer coating comprising a satin additive or comprising no satin additive.

6. The method of claim 5, wherein the applying the protective outer coating comprises at least one of:

dip coating the substrate in the protective outer coating and curing the protective outer coating; or applying via plasma enhanced chemical vapor deposition (PECVD) by a suitable monomer, flow coating or spray coating.

7. The method of claim 1, further comprising providing a protective outer coating on the PVD coating before laser etching, wherein the laser etching further comprises etching the pattern or the graphic into both the PVD coating and the protective outer coating, and the protective outer coating comprises a satin additive or comprising no stain additive.

8. A method of manufacturing a physical vapour deposition (PVD) coated system comprising a substrate, the method comprising:

applying a hard coating to the substrate;

applying a reflective PVD coating of low optical transmission by magnetron sputtering to the substrate;

laser etching one or more of a pattern or a graphic into the PVD coating so that the PVD coating is at least partially removed using a laser setting which provides a texture on regions where laser etching is applied; and applying a translucent but reflective PVD coating by magnetron sputtering so that the pattern or the graphic is visible with a satin appearance, the translucent but reflective PVD coating having a higher optical transmission than the reflective PVD coating.

9. The method of claim 8, wherein the method further comprises cleaning the substrate after laser etching.

10. The method of claim 9, wherein the substrate comprises polycarbonate and the hard coating is applied by dip coating.

11. The method of claim 9, wherein the applying the hard coating comprises at least one of:
- dip coating the substrate in the hard coating and curing the hard coating; or
- applying via plasma enhanced chemical vapor deposition (PECVD) by a suitable monomer, flow coating or spray coating.

12. The method of claim 9, further comprising providing an intermediate dielectric material between the PVD coating and the substrate.

13. The method of claim 9, further comprising providing a protective outer coating on the translucent but reflective PVD coating, the protective outer coating comprising a satin additive or comprising no satin additive.

14. The method of claim 13, wherein the applying the protective coating comprises at least one of:
- dip coating the substrate in the protective outer coating and curing the protective outer coating; or
- applying via plasma enhanced chemical vapor deposition (PECVD) by a suitable monomer, flow coating or spray coating.

15. A method of manufacturing a physical vapour deposition (PVD) coated system comprising a substrate, the method comprising:
- applying a hard coating to the substrate;
- applying a PVD complex interference stack coating by magnetron sputtering to the substrate, the PVD complex interference stack coating comprising a plurality of separate layers; and
- laser etching one or more of a pattern or a graphic into the PVD complex interference stack coating, wherein by the laser etching the PVD complex interference stack coating is at least partially removed and different colors are revealed depending on a depth and structure of the laser etching.

16. The method of claim 15, wherein the substrate comprises polycarbonate and the hard coating is applied by dip coating.

17. The method of claim 15, wherein the applying the hard coating comprises at least one of:
- (i) dip coating the substrate in the hard coating and curing the hard coating;
- (ii) applying a suitable monomer via plasma enhanced chemical vapor deposition (PECVD);
- (iii) flow coating the hard coating onto the substrate; or
- (iv) spray coating the hard coating onto the substrate.

18. The method of claim 15, further comprising providing an intermediate dielectric material between the PVD coating and the hard coating.

19. The method of claim 15, further comprising providing a protective outer coating on the PVD coating after laser etching the PVD coating, the protective outer coating comprising a satin additive or comprising no satin additive.

20. The method of claim 19, wherein the applying the protective outer coating comprises at least one of:
- (i) dip coating the substrate in the protective outer coating and curing the protective outer coating;
- (ii) applying a suitable monomer via plasma enhanced chemical vapor deposition (PECVD);
- (iii) flow coating the protective outer coating onto the substrate; or
- (iv) spray coating the protective outer coating onto the substrate.

21. The method of claim 15, further comprising providing a protective outer coating on the PVD coating before laser etching,
- wherein the laser etching further comprises etching the pattern or the graphic into both the PVD coating and the protective outer coating, and
- the protective outer coating comprises a satin additive.

* * * * *